United States Patent
Pan et al.

(10) Patent No.: US 12,165,926 B2
(45) Date of Patent: *Dec. 10, 2024

(54) FINFET DEVICE STRUCTURE HAVING DIELECTRIC FEATURES BETWEEN A PLURALITY OF GATE ELECTRODES AND METHODS OF FORMING THE SAME

(71) Applicant: TAIWAN SEMICONDUCTOR MANUFACTURING COMPANY, LTD., Hsinchu (TW)

(72) Inventors: Kuan-Ting Pan, Taipei (TW);
Kuo-Cheng Chiang, Hsinchu (TW);
Shang-Wen Chang, Hsinchu (TW);
Ching-Wei Tsai, Hsinchu (TW);
Kuan-Lun Cheng, Hsinchu (TW);
Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/224,088

(22) Filed: Jul. 20, 2023

(65) Prior Publication Data
US 2023/0369125 A1 Nov. 16, 2023

Related U.S. Application Data

(63) Continuation of application No. 17/833,005, filed on Jun. 6, 2022, now Pat. No. 11,735,482, which is a
(Continued)

(51) Int. Cl.
*H01L 21/8234* (2006.01)
*H01L 21/768* (2006.01)
*H01L 27/088* (2006.01)

(52) U.S. Cl.
CPC ........... *H01L 21/823468* (2013.01); *H01L 21/76802* (2013.01); *H01L 21/823475* (2013.01);
(Continued)

(58) Field of Classification Search
CPC ........... H01L 29/42392; H01L 27/088; H01L 21/823475; H01L 27/0886;
(Continued)

(56) References Cited

U.S. PATENT DOCUMENTS 9,209,247 B2   12/2015   Colinge et al.
9,236,267 B2   1/2016    De et al.
(Continued)

*Primary Examiner* — Changhyun Yi
(74) *Attorney, Agent, or Firm* — NZ CARR LAW OFFICE

(57) ABSTRACT

A semiconductor device structure, along with methods of forming such, are described. The structure includes a first and second gate electrode layers, and a dielectric feature disposed between the first and second gate electrode layers. The dielectric feature has a first surface. The structure further includes a first conductive layer disposed on the first gate electrode layer. The first conductive layer has a second surface. The structure further includes a second conductive layer disposed on the second gate electrode layer. The second conductive layer has a third surface, and the first, second, and third surfaces are coplanar. The structure further includes a third conductive layer disposed over the first conductive layer, a fourth conductive layer disposed over the second conductive layer, and a dielectric layer disposed on the first surface of the dielectric feature. The dielectric layer is disposed between the third conductive layer and the fourth conductive layer.

20 Claims, 51 Drawing Sheets

Related U.S. Application Data continuation of application No. 17/027,282, filed on Sep. 21, 2020, now Pat. No. 11,355,398.

(52) U.S. Cl.
CPC .... *H01L 27/0886* (2013.01); *H01L 21/76843* (2013.01); *H01L 21/76871* (2013.01)

(58) Field of Classification Search
CPC ......... H01L 21/76843; H01L 21/76871; H01L 29/78696; H01L 21/823468; H01L 21/76802; H01L 21/823412; H01L 21/76895; H01L 21/76897
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,355,398 B2 * | 6/2022 | Pan .................... H01L 29/78696 |
| 11,735,482 B2 * | 8/2023 | Pan .................... H01L 21/76802 |
| | | 257/401 |
| 2020/0287039 A1 * | 9/2020 | Bi ....................... H01L 29/1037 |

* cited by examiner

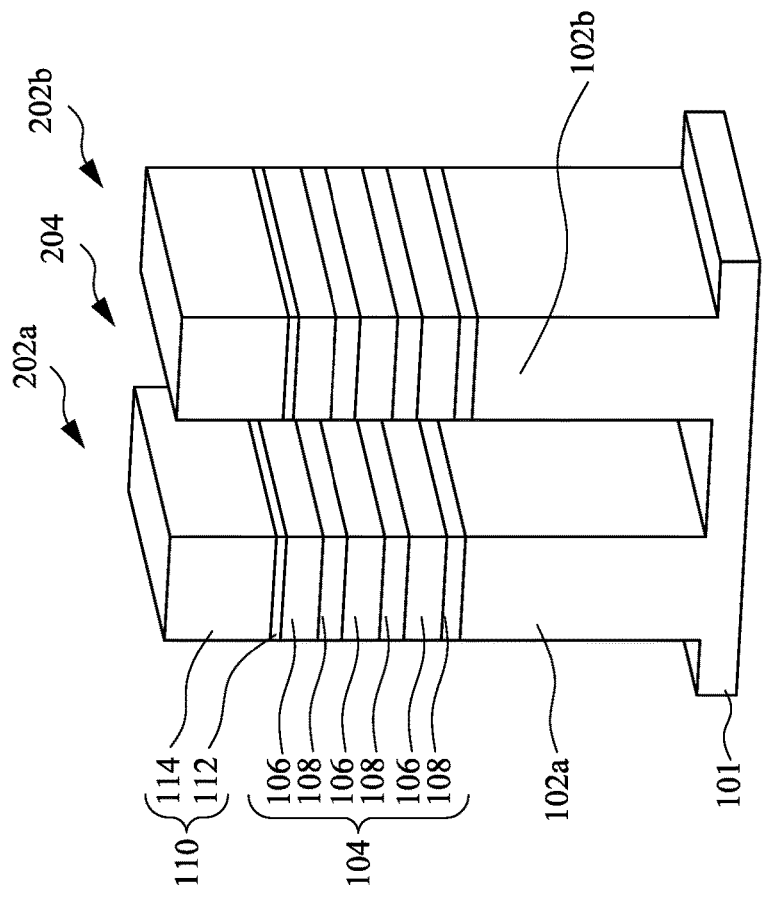
Fig. 2
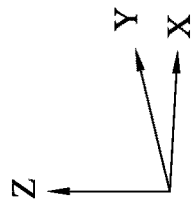

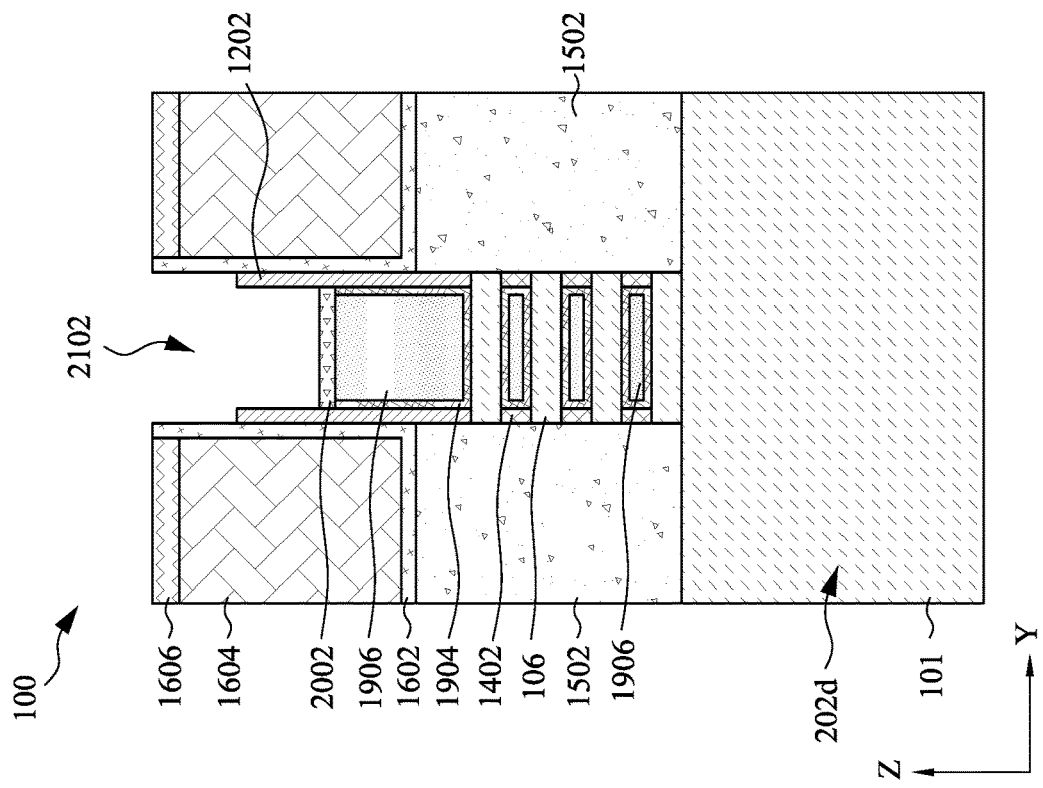
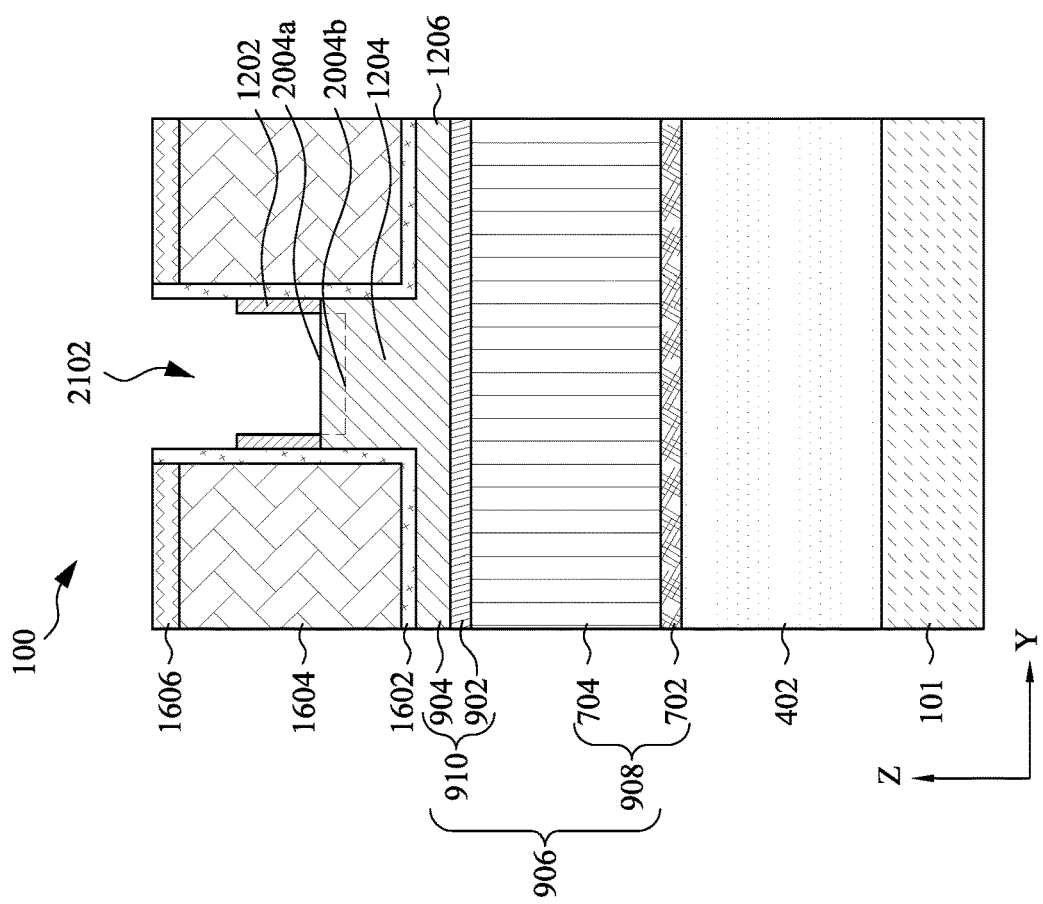
Fig. 22B
Fig. 22A

FINFET DEVICE STRUCTURE HAVING DIELECTRIC FEATURES BETWEEN A PLURALITY OF GATE ELECTRODES AND METHODS OF FORMING THE SAME

CROSS-REFERENCE TO RELATED APPLICATIONS

This application is a continuation application of U.S. patent application Ser. No. 17/833,005 filed Jun. 6, 2022, which is a continuation application of U.S. patent application Ser. No. 17/027,282 filed Sep. 21, 2020, both of which are incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-18 are perspective views of various stages of manufacturing a semiconductor device structure, in accordance with some embodiments.

FIGS. 22A, 22B, and 22C are cross-sectional side views of one of various stages of manufacturing the semiconductor device structure taken along lines A-A, B-B, C-C of FIG. 21, respectively, in accordance with some embodiments.

DETAILED DESCRIPTION

Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-34B show exemplary sequential processes for manufacturing a semiconductor device structure 100, in accordance with some embodiments. It is understood that additional operations can be provided before, during, and after processes shown by FIGS. 1-34B and some of the operations described below can be replaced or eliminated, for additional embodiments of the method. The order of the operations/processes may be interchangeable.

FIGS. 1-18 are perspective views of various stages of manufacturing a semiconductor device structure, in accordance with some embodiments. As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type impurities). The dopants are, for example boron for an n-type field effect transistor (NFET) and phosphorus for a p-type field effect transistor (PFET).

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanosheet channel(s) of the semiconductor device structure 100 at a later stage. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below. In some embodiments, the first and second semiconductor layers 106, 108 are replaced with a single semiconductor material connected to the substrate 101, and the device is a FinFET.

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A mask structure 110 is formed over the stack of semiconductor layers 104. The mask structure 110 may include an oxygen-containing layer 112 and a nitrogen-containing layer 114. The oxygen-containing layer 112 may be a pad oxide layer, such as a $SiO_2$ layer. The nitrogen-containing layer 114 may be a pad nitride layer, such as $Si_3N_4$. The mask structure 110 may be formed by any suitable deposition process, such as chemical vapor deposition (CVD) process.

Figure 20:
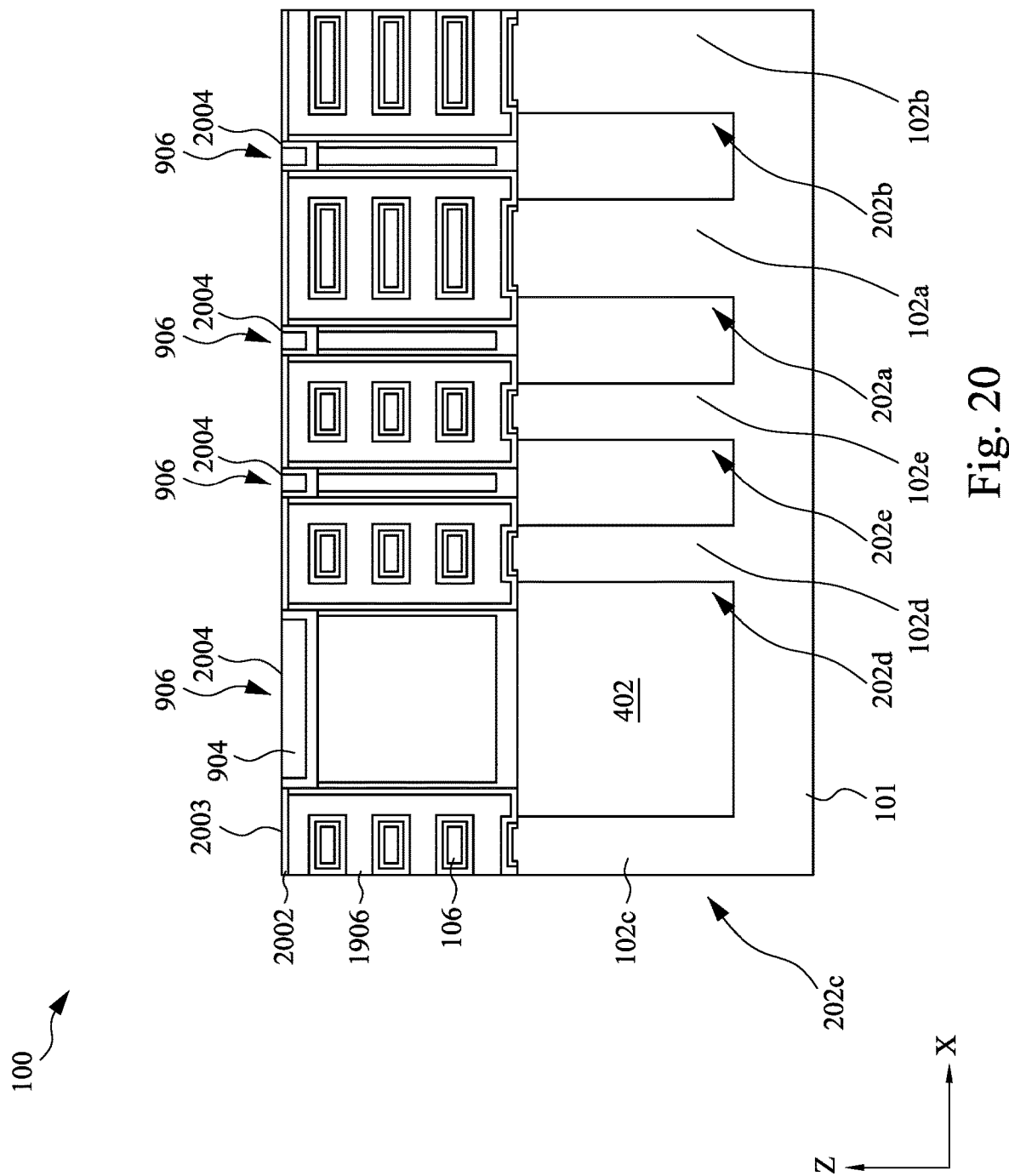

FIG. 2 is a perspective view of one of the various stages of manufacturing the semiconductor device structure 100, in accordance with some embodiments. As shown in FIG. 2, fins 202a and 202b are formed. In some embodiments, each fin 202a, 202b includes a substrate portion 102a, 102b formed from the substrate 101, a portion of the stack of semiconductor layers 104, and a portion of the mask structure 110. The fins 202a, 202b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202a, 202b by etching the stack of semiconductor layers 104 and the substrate 101. The etch process can include dry etch, wet etch, reactive ion etch (RIE), and/or other suitable processes. As shown in FIG. 2, two fins are formed, but the number of the fins is not limited to two. Three or more fins are arranged in the X direction in some embodiments, as shown in FIG. 20.

In some embodiments, the fins 202a, 202b may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 104, and into the substrate 101, thereby leaving the extending fins 202a, 202b. The trenches 204 may be etched using a dry etch (e.g., RIE), a wet etch, and/or combination thereof.

Figure 3:
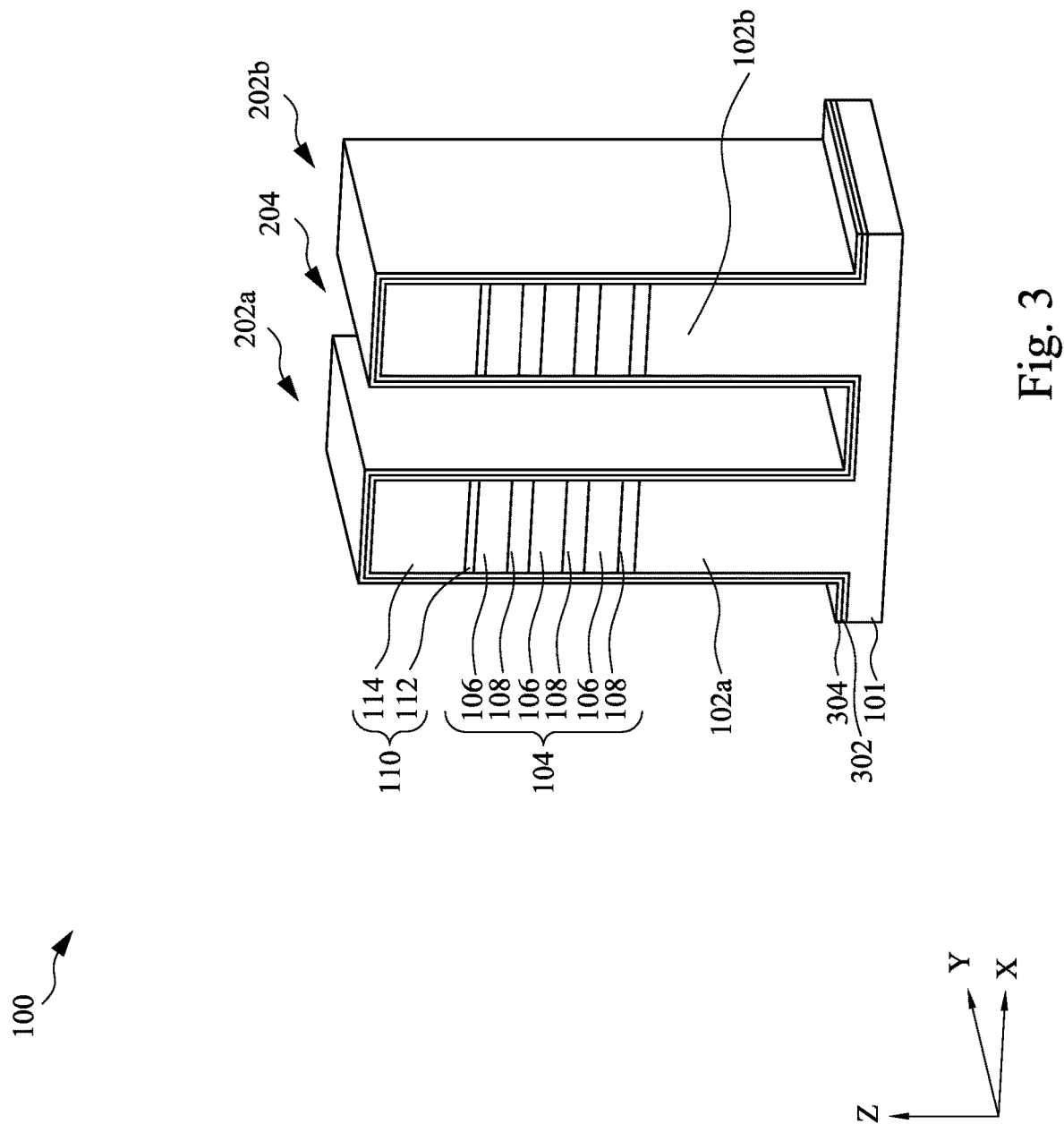

FIG. 3 is a perspective view of one of the various stages of manufacturing the semiconductor device structure 100, in accordance with some embodiments. As shown in FIG. 3, a liner 304 is formed over the substrate 101 and the fins 202a, 202b. In some embodiments, an optional liner 302 may be formed on the substrate 101 and fins 202a, 202b, and the liner 304 is formed on the optional liner 302. The liner 304 may be made of a semiconductor material, such as Si. In some embodiments, the liner 304 is made of the same material as the substrate 101. The optional liner 302 may be made of an oxygen-containing material, such as an oxide. The liner 304 may be a conformal layer and may be formed by a conformal process, such as an atomic layer deposition (ALD) process. The term "conformal" may be used herein for ease of description upon a layer having substantial same thickness over various regions. The optional liner 302 may be a conformal layer and may be formed by a conformal process, such as an ALD process.

Figure 4:
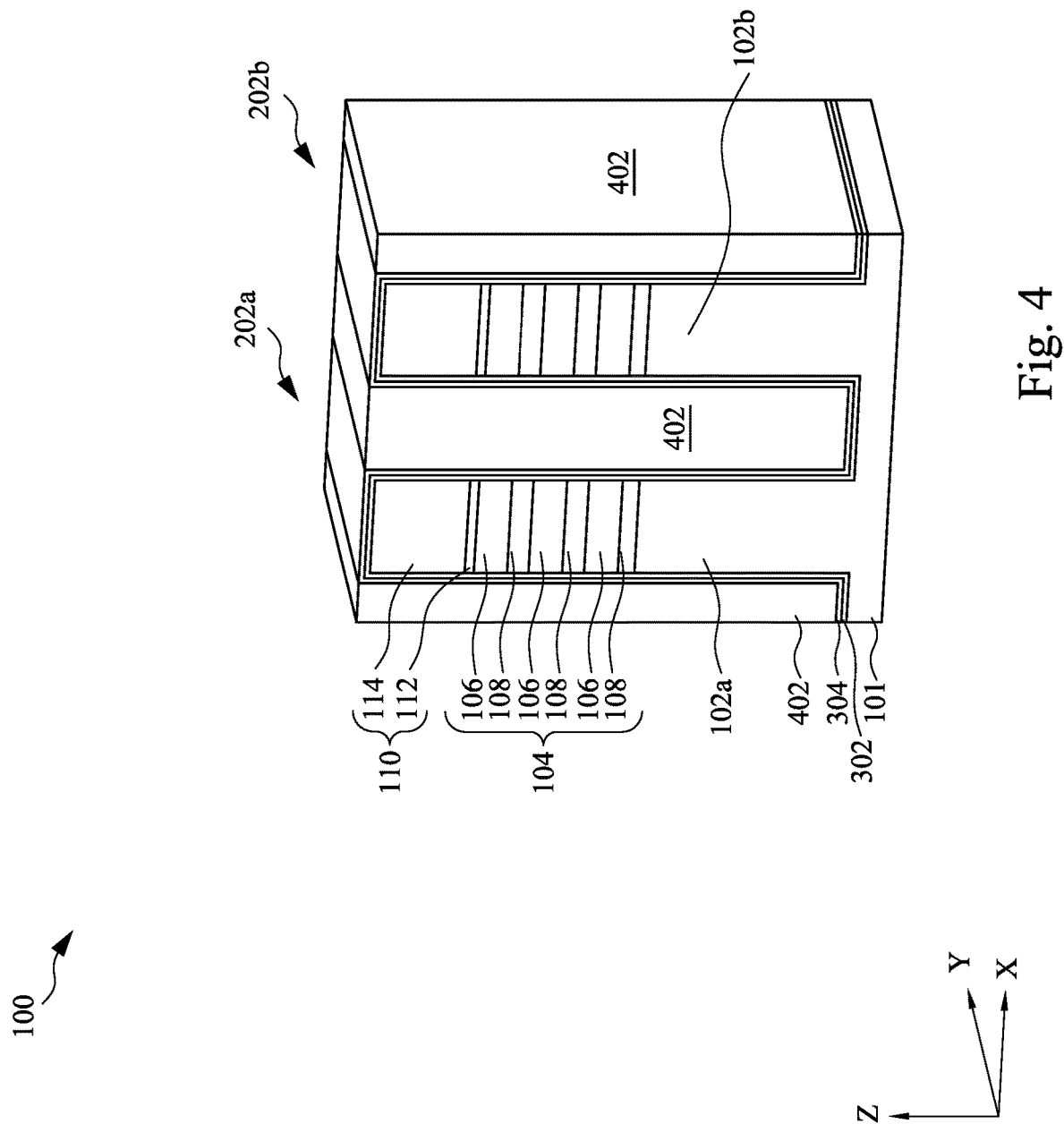

FIG. 4 is a perspective view of one of the various stages of manufacturing the semiconductor device structure 100, in accordance with some embodiments. As shown in FIG. 4, an insulating material 402 is formed on the substrate 101. The insulating material 402 fills the trench 204 (FIG. 2). The insulating material 402 may be first formed over the substrate 101 so that the fins 202a, 202b are embedded in the insulating material 402. Then, a planarization operation, such as a chemical mechanical polishing (CMP) process and/or an etch-back process, is performed such that the tops of the fins 202a, 202b (e.g., the liner 304) are exposed from the insulating material 402, as shown in FIG. 4. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 5:
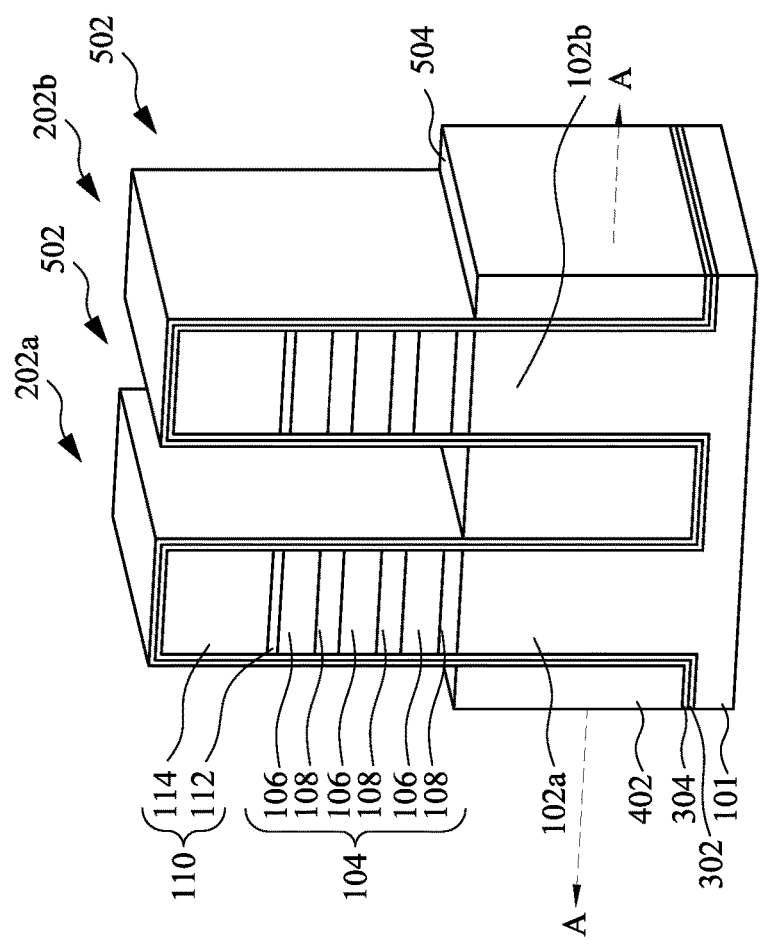

Next, as shown in FIG. 5, the insulating material 402 may be recessed by removing a portion of the insulating material 402 located between adjacent fins 202a, 202b to form trenches 502. The trenches 502 may be formed by any suitable removal process, such as dry etch or wet etch that selectively removes the insulating material 402 but not the semiconductor material of the liner 304. The recessed insulating material 402 may be the shallow trench isolation (STI). The insulating material 402 includes a top surface 504 that may be level with or below a surface of the second semiconductor layers 108 in contact with the substrate portions 102a, 102b of the substrate 101.

Figure 6:
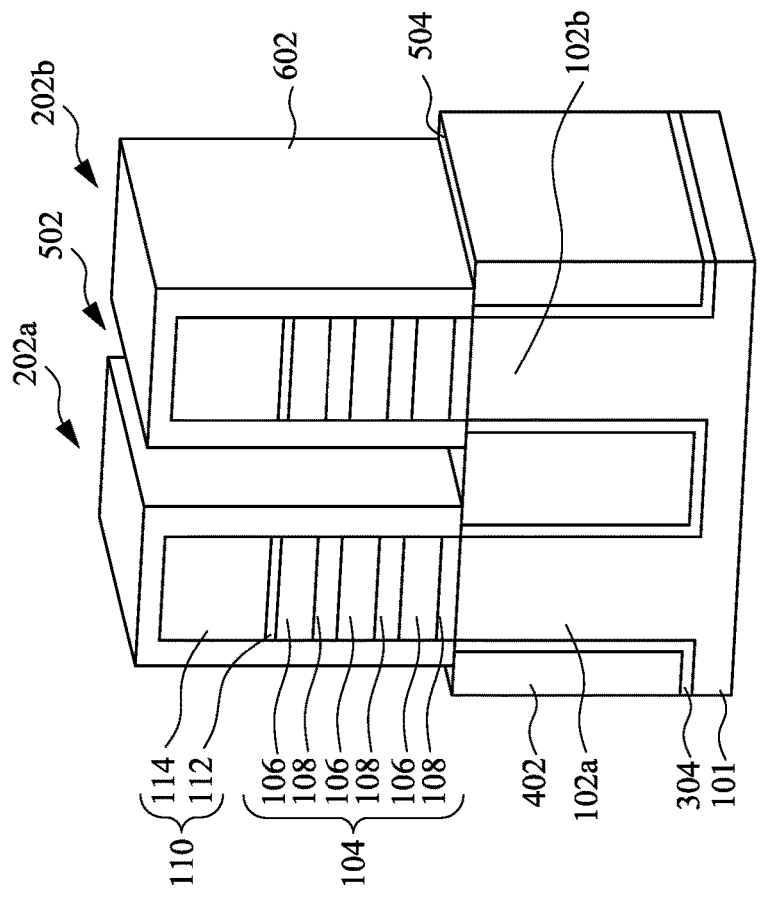

Next, as shown in FIG. 6, a cladding layer 602 is formed on the exposed surface of the liner 304 (FIG. 5), and the optional liner 302 is omitted for clarity. The liner 304 may be diffused into the cladding layer 602 during the formation of the cladding layer 602. Thus, in some embodiments where the optional liner 302 does not exist, the cladding layer 602 is in contact with the stack of semiconductor layers 104, as shown in FIG. 6. In some embodiments, the cladding layer 602 includes a semiconductor material. The cladding layer 602 grows on semiconductor materials but not on dielectric materials. For example, the cladding layer 602 includes SiGe and is grown on the Si of the liner 304 but not on the dielectric material of the insulating material 402. In some embodiments, the cladding layer 602 may be formed by first forming a semiconductor layer on the liner 304 and the insulating material 402, and followed by an etch process to remove portions of the semiconductor layer formed on the insulating material 402. The etch process may remove some of the semiconductor layer formed on the top of the fins 202a, 202b, and the cladding layer 602 formed on the top of the fins 202a, 202b may have a curved profile instead of a flat profile. In some embodiments, the cladding layer 602 and the second semiconductor layers 108 include the same material having the same etch selectivity. For example, the cladding layer 602 and the second semiconductor layers 108 include SiGe. The cladding layer 602 and the second semiconductor layer 108 may be removed subsequently to create space for the gate electrode layer.

Figure 7:
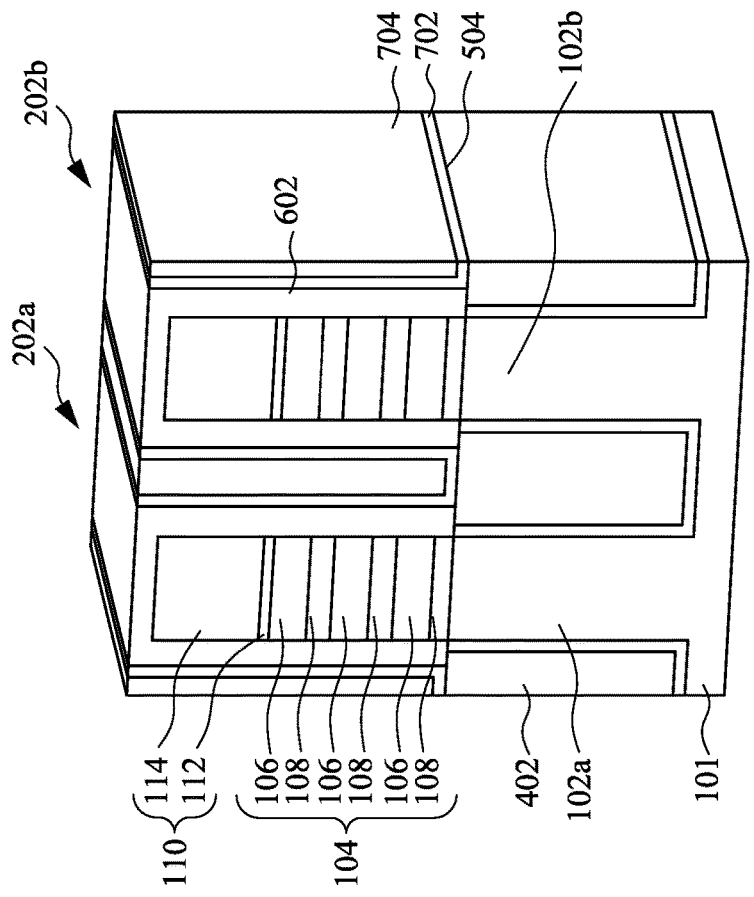

Next, as shown in FIG. 7, a liner 702 is formed on the cladding layer 602 and the top surface 504 of the insulating material 402. The liner 702 may include a low-K dielectric material (e.g., a material having a K value lower than 7), such as $SiO_2$, SiN, SiCN, SiOC, or SiOCN. The liner 702 may be formed by a conformal process, such as an ALD process. The liner 702 may have a thickness ranging from about 1 nm to about 6 nm. The liner 702 may function as a shell to protect a flowable oxide material to be formed in the trenches 502 (FIG. 5) during subsequent removal of the cladding layer 602. Thus, if the thickness of the liner 702 is less than about 1 nm, the flowable oxide material may not be sufficiently protected. On the other hand, if the thickness of the liner 702 is greater than about 6 nm, the trenches 502 (FIG. 5) may be filled.

A dielectric material 704 is formed in the trenches 502 (FIG. 5) and on the liner 702, as shown in FIG. 7. The dielectric material 704 may be an oxygen-containing material, such as an oxide, formed by FCVD. The oxygen-containing material may have a K value less than about 7, for example less than about 3. The width of the dielectric material 704 along the X direction may be defined by the width of the trench 502 and the thickness of the liner 702. In some embodiments, the width of the dielectric material 704 ranges from about 8 nm to about 30 nm. A planarization process, such as a CMP process, may be performed to remove portions of the liner 702 and the dielectric material 704 formed over the fins 202a, 202b. The portion of the cladding layer 602 disposed on the nitrogen-containing layer 114 may be exposed after the planarization process.

Figure 8:
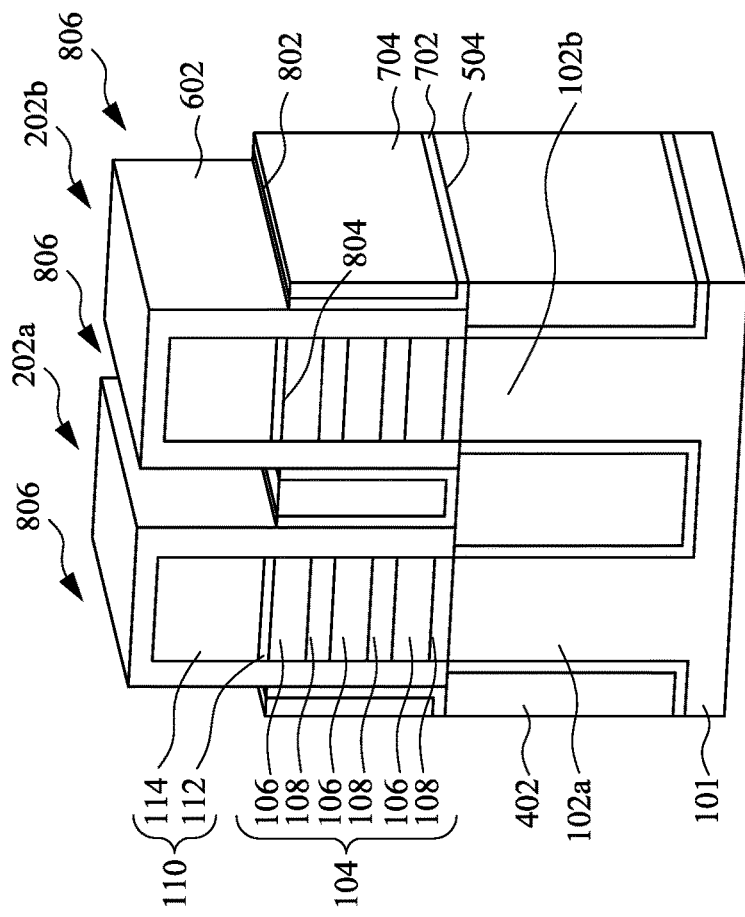

Next, as shown in FIG. 8, the liner 702 and the dielectric material 704 are recessed to the level of the topmost first semiconductor layer 106. For example, in some embodiments, after the recess process, the dielectric material 704 may include a top surface 802 that is substantially level with a top surface 804 of the topmost first semiconductor layer 106. The top surface 804 of the topmost first semiconductor layer 106 may be in contact with the mask structure 110, such as in contact with the oxygen-containing layer 112. The liner 702 may be recessed to the same level as the dielectric material 704. The recess of the liners 702 and the dielectric material 704 may be performed by any suitable process, such as dry etch, wet, etch, or a combination thereof. In some embodiments, a first etch process may be performed to recess the dielectric material 704 followed by a second etch process to recess the liner 702. The etch processes may be selective etch processes that do not remove the semiconductor material of the cladding layer 602. As a result of the recess process, trenches 806 are formed between the fins 202a, 202b.

Figure 9:
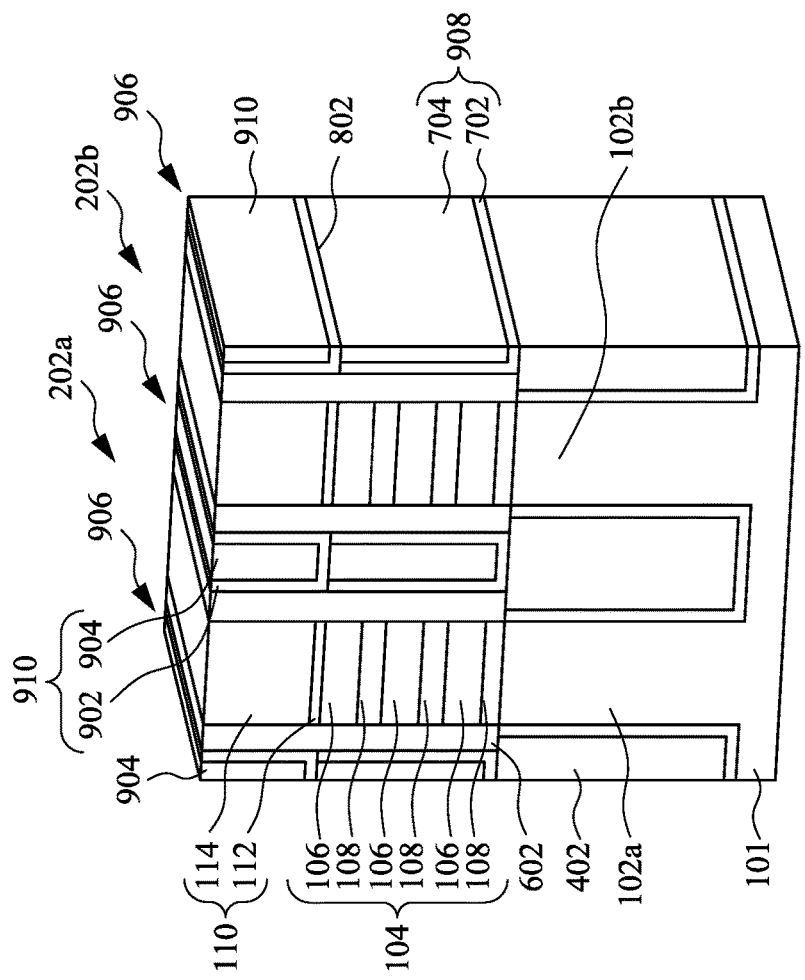

A high-K dielectric liner 902 is formed in the trenches 806 (FIG. 8) and on the dielectric material 704, the liner 702, and the sidewalls of the cladding layer 602, as shown in FIG. 9. The high-K dielectric liner 902 may include a high-K dielectric material (e.g., a material having a K value greater than 7), such as $HfO_2$, $ZrO_2$, $HfAlO_x$, $HfSiO_x$, or $Al_2O_3$. The high-K dielectric liner 902 may be formed by a conformal process, such as an ALD process. The high-K dielectric liner 902 may have a thickness ranging from about 1 nm to about 6 nm. The high-K dielectric liner 902 may function as a shell to protect a low-K dielectric material to be formed in the trenches 806 (FIG. 8) during subsequent removal processes, such as the removal of portions of the cladding layer 602. Thus, if the thickness of the high-K dielectric liner 902 is less than about 1 nm, the low-K dielectric material may not be sufficiently protected. On the other hand, if the thickness of the high-K dielectric liner 902 is greater than about 6 nm, the trenches 806 (FIG. 8) may be filled.

Figure 19:
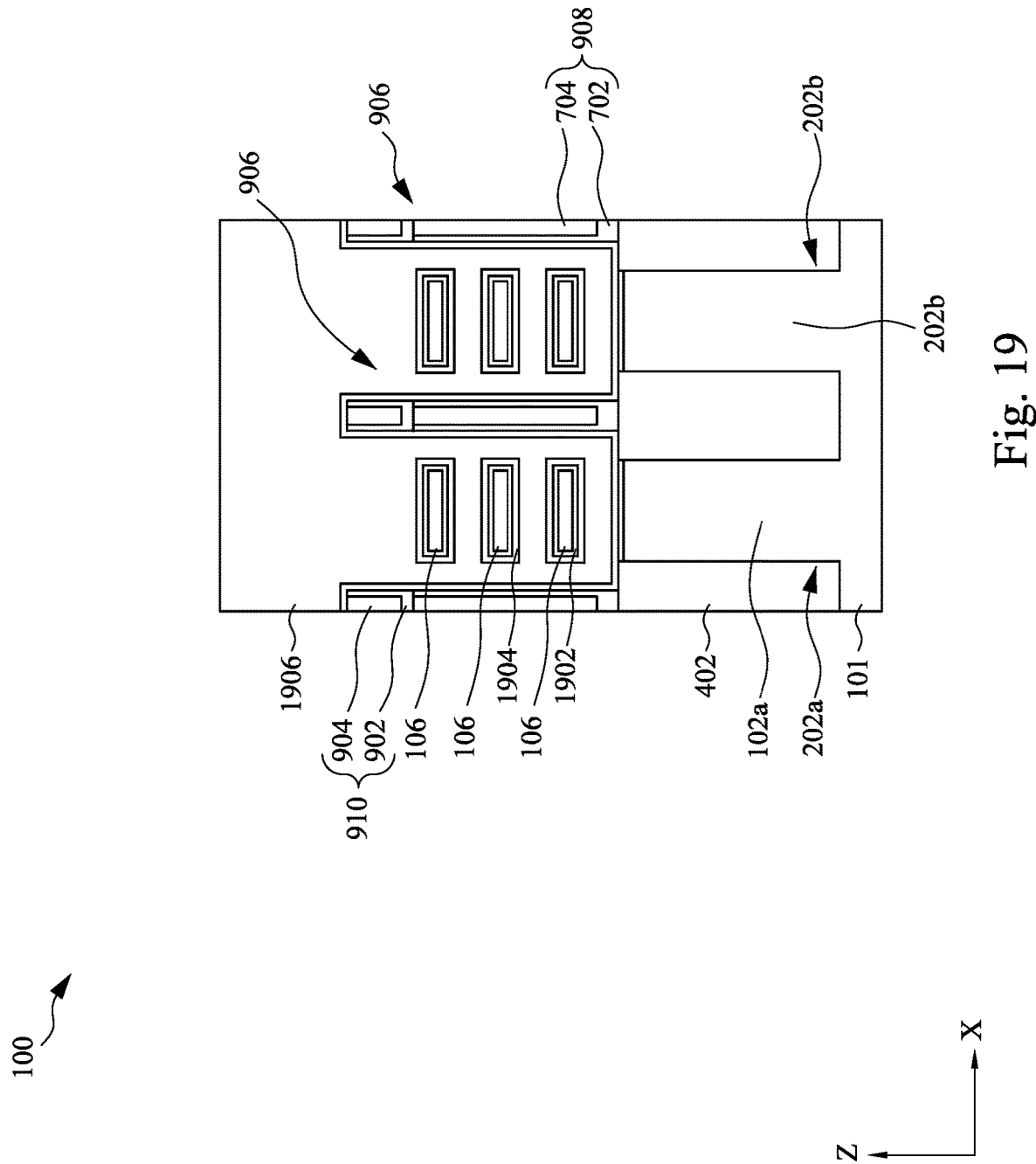
FIGS. 19 and 20 are cross-sectional side views of various stages of manufacturing the semiconductor device structure taken along line A-A of FIG. 18, in accordance with some embodiments.

A low-K dielectric material 904 is formed on the high-K dielectric liner 902, and the low-K dielectric material 904 may fill the trenches 806 (FIG. 8). The low-K dielectric material 904 may include a material having a K value lower than 7, such as $SiO_2$, SiN, SiCN, SiOC, or SiOCN. A planarization process is performed to expose the nitrogen-containing layer 114 of the mask structure 110. The planarization process may be any suitable process, such as a CMP process. The planarization process removes portions of the high-K dielectric liner 902, the low-K dielectric material 904, and the cladding layer 602 disposed over the mask structure 110. The liner 702, the dielectric material 704, the high-K dielectric liner 902, and the low-K dielectric material 904 together may be referred to as a dielectric feature 906. The dielectric feature 906 includes a bottom portion 908 having a shell, which is the liner 702, and a core, which is the dielectric material 704. The dielectric feature further includes a top portion 910 having a shell, which is the high-K dielectric liner 902, and a core, which is the low-K dielectric material 904. The dielectric feature 906 may be a dielectric fin that separates adjacent source/drain (S/D) epitaxial features 1502 (FIG. 15) and adjacent gate electrode layers 1906 (FIG. 19).

Figure 10:
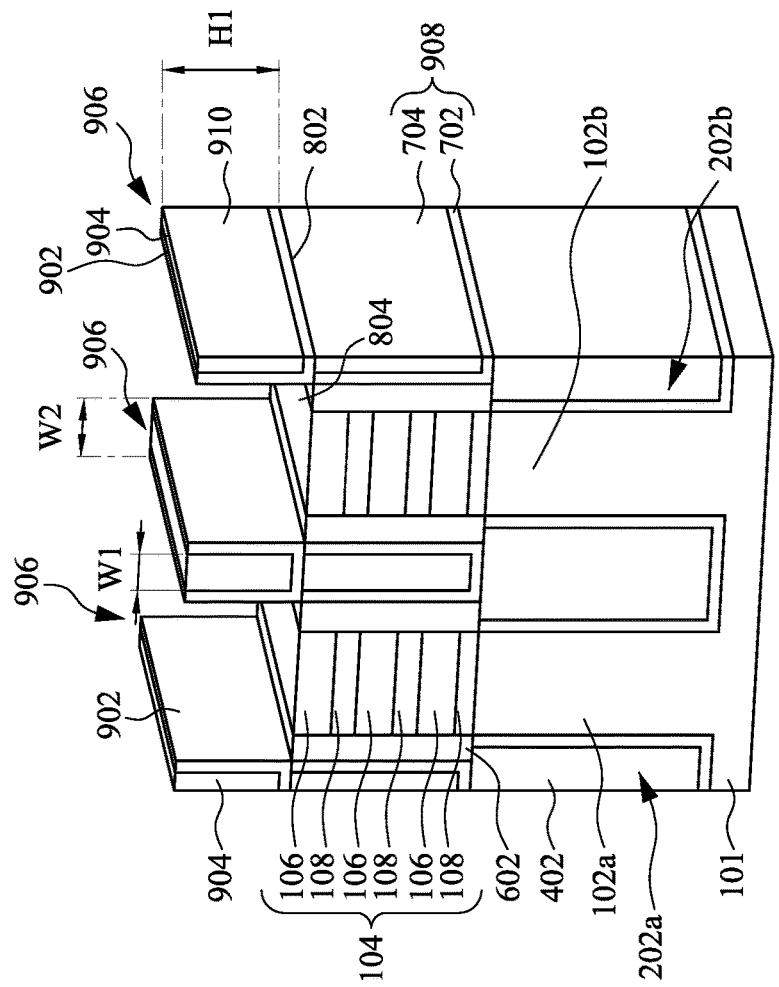

Next, as shown in FIG. 10, the cladding layers 602 are recessed, and the mask structures 110 are removed. The recess of the cladding layers 602 may be performed by any suitable process, such as dry etch, wet, etch, or a combination thereof. The recess process may be controlled so that the remaining cladding layers 602 are substantially at the same level as the top surface 804 of the topmost first semiconductor layer 106 in the stack of semiconductor layers 104. The etch process may be a selective etch process that does not remove the materials of the high-K dielectric liner 902 and the low-K dielectric material 904. The removal of the mask structures 110 may be performed by any suitable process, such as dry etch, wet etch, or a combination thereof. The removal of the mask structure 110 exposes the top surfaces 804 of the topmost first semiconductor layers 106 in the stacks of semiconductor layers 104.

As shown in FIG. 10, the low-K dielectric material 904 may have a width W1 along the X direction ranging from about 8 nm to about 30 nm. The width W1 may be defined by the distance between adjacent fins 202a, 202b and the thickness of the high-K dielectric liner 902. The dielectric feature 906 may have a width W2 along the X direction ranging from about 10 nm to about 42 nm. The liner 702 and the high-K dielectric liner 902 are shells that protect cores, which are the dielectric material 704 and the low-K dielectric material 904, respectively, from subsequent etch processes. The cores, or the dielectric material 704 and the low-K dielectric material 904, may include a material having a low K value, such as less than about 7, can electrically separate the adjacent S/D epitaxial features 1502 (FIG. 15) and adjacent gate electrode layers 1906 (FIG. 19) with reduced width W2 compared to conventional dielectric material between the adjacent S/D epitaxial features and adjacent gate electrode layers. Thus, the dielectric feature 906 having the liner 702, the dielectric material 704, the high-K dielectric liner 902, and the low-K dielectric material 904 can lead to increased device density, reduced gate drain capacitance (Co), and improved device speed and power efficiency.

The top portion 910 of the dielectric feature 906 (e.g., the high-K dielectric liner 902 and the low-K dielectric material 904) may have a height H1 along the Z direction. The height H1 may range from about 6 nm to about 15 nm. The top portion 910 of the dielectric feature 906 may be disposed on the top surface 802 of the dielectric material 704, and the top surface 802 may be coplanar with the top surface 804 of the topmost first semiconductor layer 106 of the stack of semiconductor layers 104. Thus, top portion 910 of the dielectric feature 906 may extend over a plane defined by the top surface 804 by the height H1, in order to separate, or cut-off, adjacent gate electrode layers 1906 (FIG. 20). If the height H1 is less than about 6 nm, the gate electrode layers 1906 (FIG. 20) may not be sufficiently separated, or cut-off. On the other hand, if the height H1 is greater than about 15 nm, the manufacturing cost is increased without significant advantage.

Figure 11:
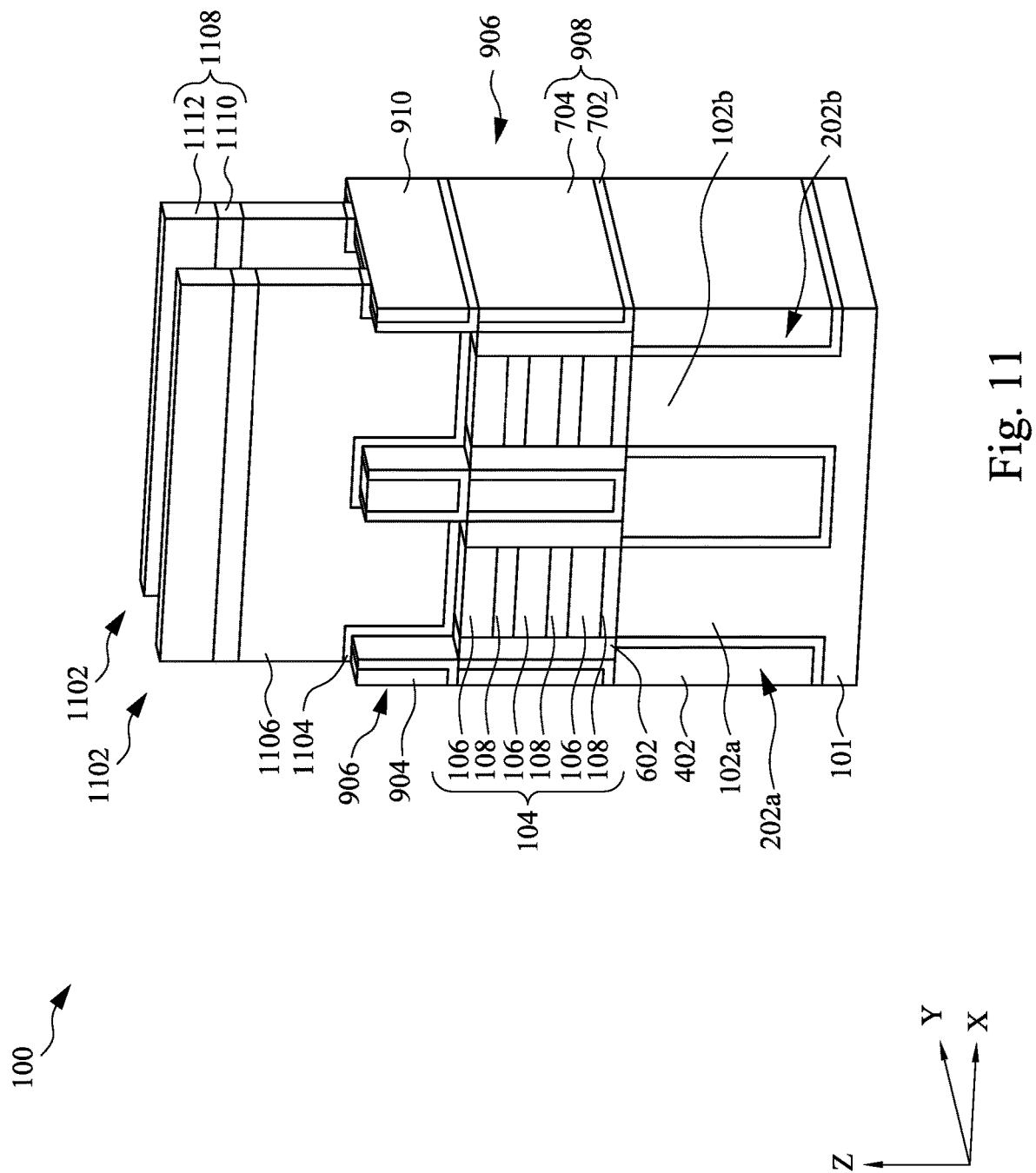

Next, as shown in FIG. 11, one or more sacrificial gate stacks 1102 are formed on the semiconductor device structure 100. The sacrificial gate stack 1102 may include a sacrificial gate dielectric layer 1104, a sacrificial gate electrode layer 1106, and a mask structure 1108. The sacrificial gate dielectric layer 1104 may include one or more layers of dielectric material, such as $SiO_2$, SiN, a high-K dielectric material, and/or other suitable dielectric material. In some embodiments, the sacrificial gate dielectric layer 1104 includes a material different than that of the high-K dielectric liner 902. In some embodiments, the sacrificial gate dielectric layer 1104 may be deposited by a CVD process, a sub-atmospheric CVD (SACVD) process, a FCVD process, an ALD process, a PVD process, or other suitable process. The sacrificial gate electrode layer 1106 may include polycrystalline silicon (polysilicon). The mask structure 1108 may include an oxygen-containing layer 1110 and a nitrogen-containing layer 1112. In some embodiments, the sacrificial gate electrode layer 1106 and the mask structure 1108 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 1102 may be formed by first depositing blanket layers of the sacrificial gate dielectric layer 1104, the sacrificial gate electrode layer 1106, and the mask structure 1108, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 1102, the stacks of semiconductor layers 104 of the fins 202a, 202b are partially exposed on opposite sides of the sacrificial gate stack 1102. As shown in FIG. 11, two sacrificial gate stacks 1102 are formed, but the number of the sacrificial gate stacks 1102 is not limited to two. More than two sacrificial gate stacks 1102 are arranged along the Y direction in some embodiments.

Figure 12:
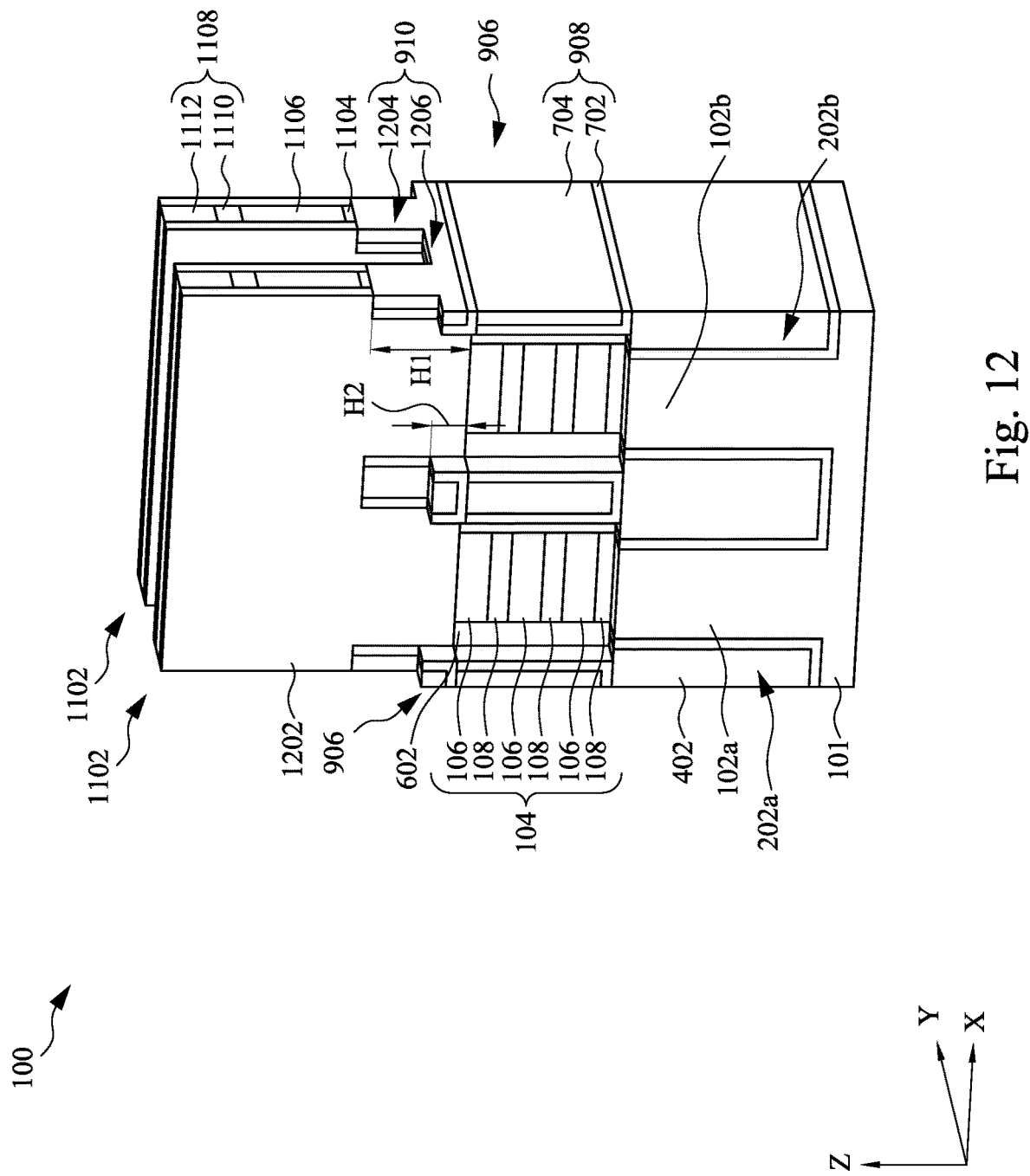

As shown in FIG. 12, a spacer 1202 is formed on the sidewalls of the sacrificial gate stacks 1102. The spacer 1202 may be formed by first depositing a conformal layer that is subsequently etched back to form sidewall spacers 1202. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 202a, 202b, the cladding layer 602, the high-K dielectric liner 902, and the low-K dielectric material 904, leaving the spacers 1202 on the vertical surfaces, such as the sidewalls of sacrificial gate stack 1102. The spacer 1202 may be made of a dielectric material such as silicon oxide, silicon nitride, silicon carbide, silicon oxynitride, SiCN, silicon oxycarbide, SiOCN, and/or combinations thereof. In some embodiments, the spacer 1202 includes multiple layers, such as main spacer walls, liner layers, and the like.

Next, exposed portions of the fins 202a, 202b, exposed portions of the cladding layers 602, exposed portions of the high-K dielectric liner 902, and exposed portions of the low-K dielectric material 904 not covered by the sacrificial gate stacks 1102 and the spacers 1202 are selectively recessed by using one or more suitable etch processes, such as dry etch, wet etch, or a combination thereof. In some embodiments, exposed portions of the stacks of semiconductor layers 104 (FIG. 11) of the fins 202a, 202b are removed, exposing portions of the substrate portions 102a, 102b, respectively. As shown in FIG. 12, the exposed portions of the fins 202a, 202b are recessed to a level at or below the top surface 504 of the insulating material 402. The recess processes may include an etch process that recesses the exposed portions of the fins 202a, 202b and the exposed portions of the cladding layers 602.

In some embodiments, the etch process may reduce the height of the exposed top portion 910 of the dielectric feature 906 from H1 to H2, as shown in FIG. 12. Thus, a first portion 1204 of the top portion 910 under the sacrificial gate stack 1102 and the spacers 1202 has the height H1, while a second portion 1206 of the top portion 910 located between S/D epitaxial features 1502 (FIG. 15) has the height H2 less than the height H1.

At this stage, end portions of the stacks of semiconductor layers 104 under the sacrificial gate stacks 1102 and the spacers 1202 have substantially flat surfaces which may be flush with corresponding spacers 1202. In some embodiments, the end portions of the stacks of semiconductor layers 104 under the sacrificial gate stacks 1102 and spacers 1202 are slightly horizontally etched.

Figure 13:
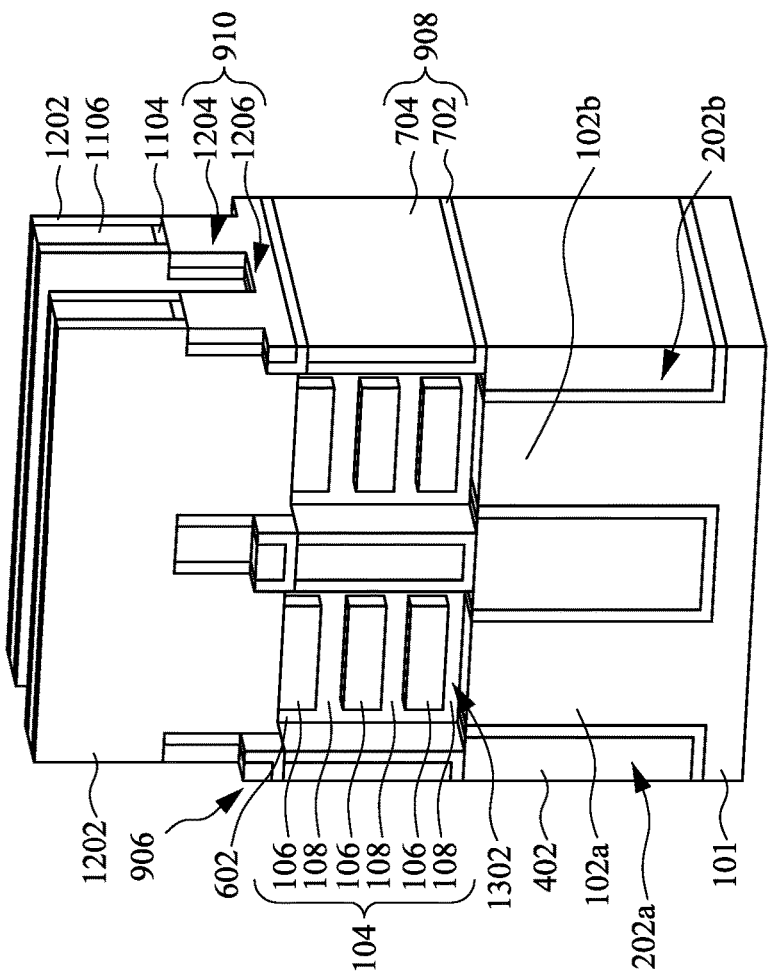

Next, as shown in FIG. 13, the edge portions of each second semiconductor layer 108 and edge portions of the cladding layers 602 are removed, forming gaps 1302. In some embodiments, the portions of the semiconductor layers 108 and cladding layers 602 are removed by a selective wet etch process that does not remove the first semiconductor layers 106. For example, in cases where the second semiconductor layers 108 are made of SiGe, and the first semiconductor layers 106 are made of silicon, a selective wet etch including an ammonia and hydrogen peroxide mixtures (APM) may be used.

Figure 14:
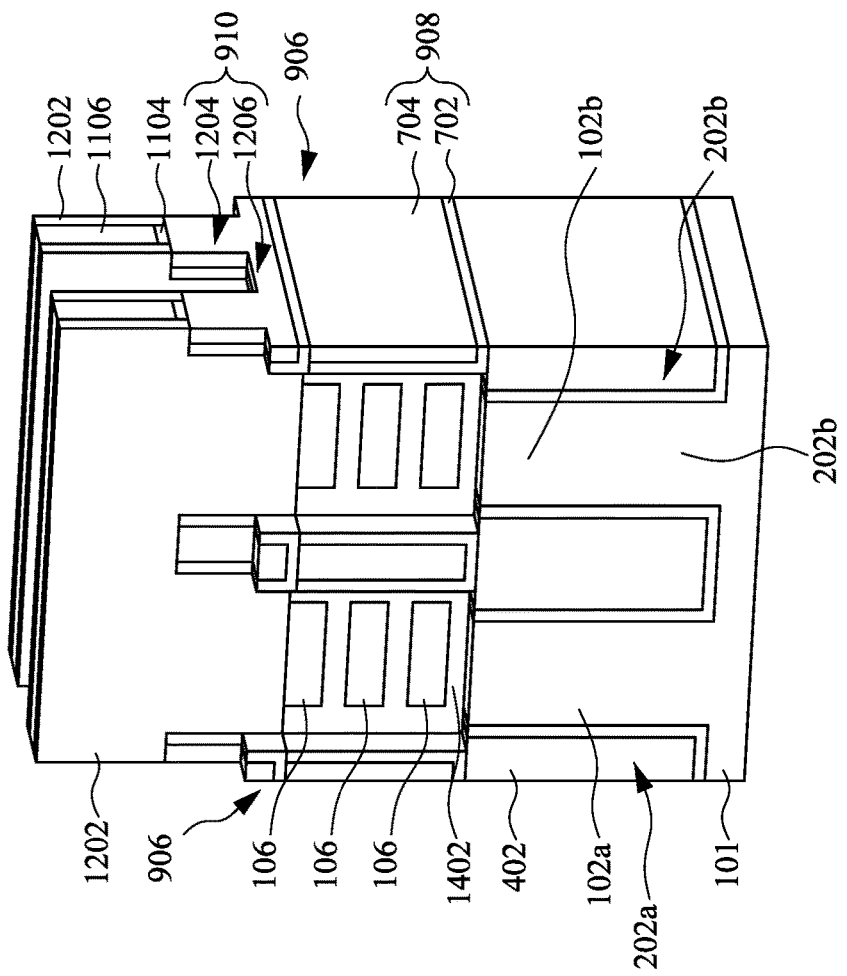

Next, as show in FIG. 14, dielectric spacers 1402 are formed in the gaps 1302. In some embodiments, the dielectric spacers 1402 may be made of a low-K dielectric material, such as SiON, SiCN, SiOC, SiOCN, or SiN. In some embodiments, the dielectric spacers 1402 may be formed by first forming a conformal dielectric layer using a conformal deposition process, such as ALD, followed by an anisotropic etch to remove portions of the conformal dielectric layer other than the dielectric spacers 1402. The dielectric spacers 1402 may be protected by the first semiconductor layers 106 and the spacers 1202 during the anisotropic etch process. In some embodiments, the dielectric spacers 1402 may be flush with the spacers 1202.

Figure 15:
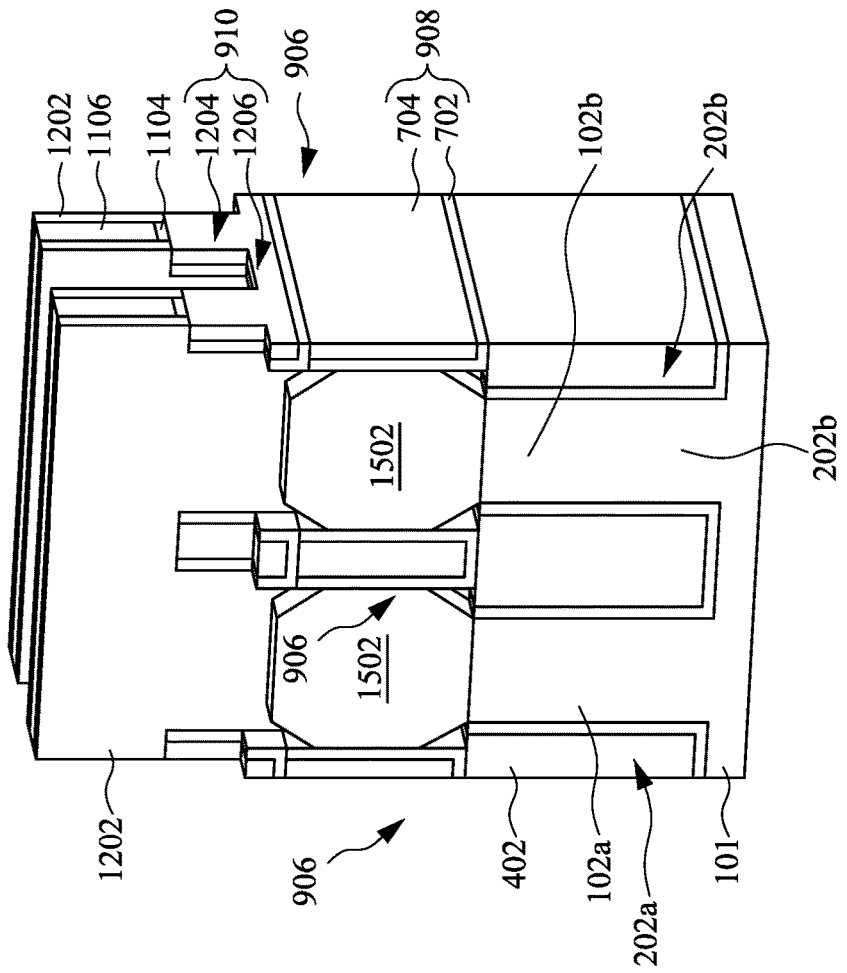

Next, as shown in FIG. 15, S/D epitaxial features 1502 are formed on the substrate portions 102a, 102b of the fins 202a, 202b. The S/D epitaxial feature 1502 may include one or more layers of Si, SiP, SiC and SiCP for an n-channel FET or Si, SiGe, Ge for a p-channel FET. The S/D epitaxial features 1502 may grow both vertically and horizontally to form facets, which may correspond to crystalline planes of the material used for the substrate portions 102a, 102b. The S/D epitaxial features 1502 are formed by an epitaxial growth method using CVD, ALD or MBE. The S/D epitaxial features 1502 are in contact with the first semiconductor layers 106 and dielectric spacers 1402 (FIG. 14). The S/D epitaxial features 1502 may be the S/D regions. In this disclosure, a source and a drain are interchangeably used, and the structures thereof are substantially the same.

Figure 34B:
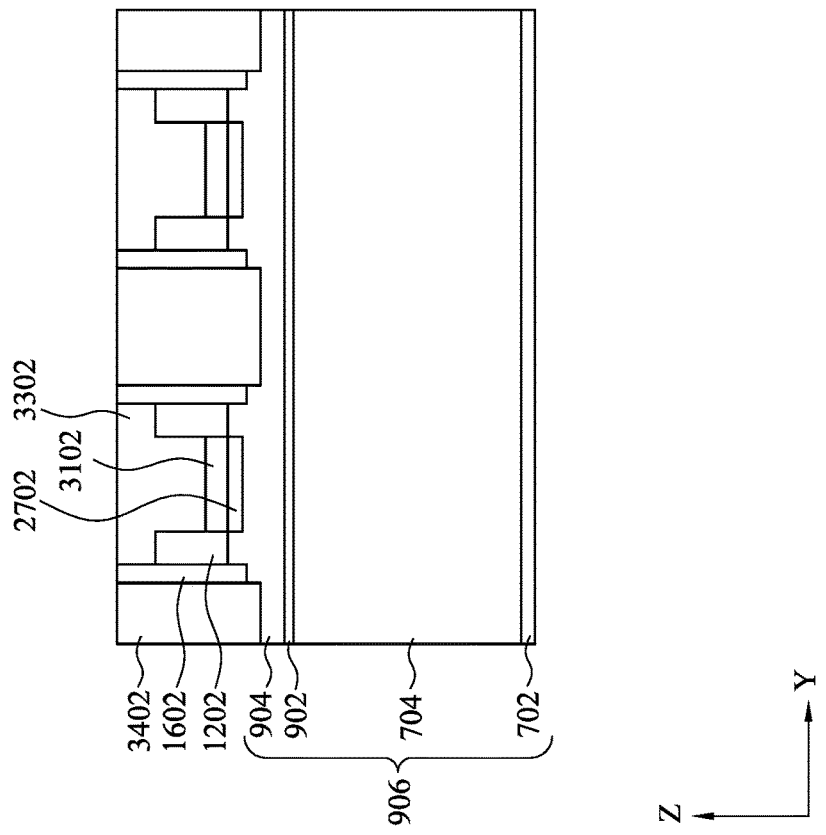
FIGS. 34A and 34B are cross-sectional side views of the semiconductor device structure, in accordance with some embodiments.
Figure 34A:
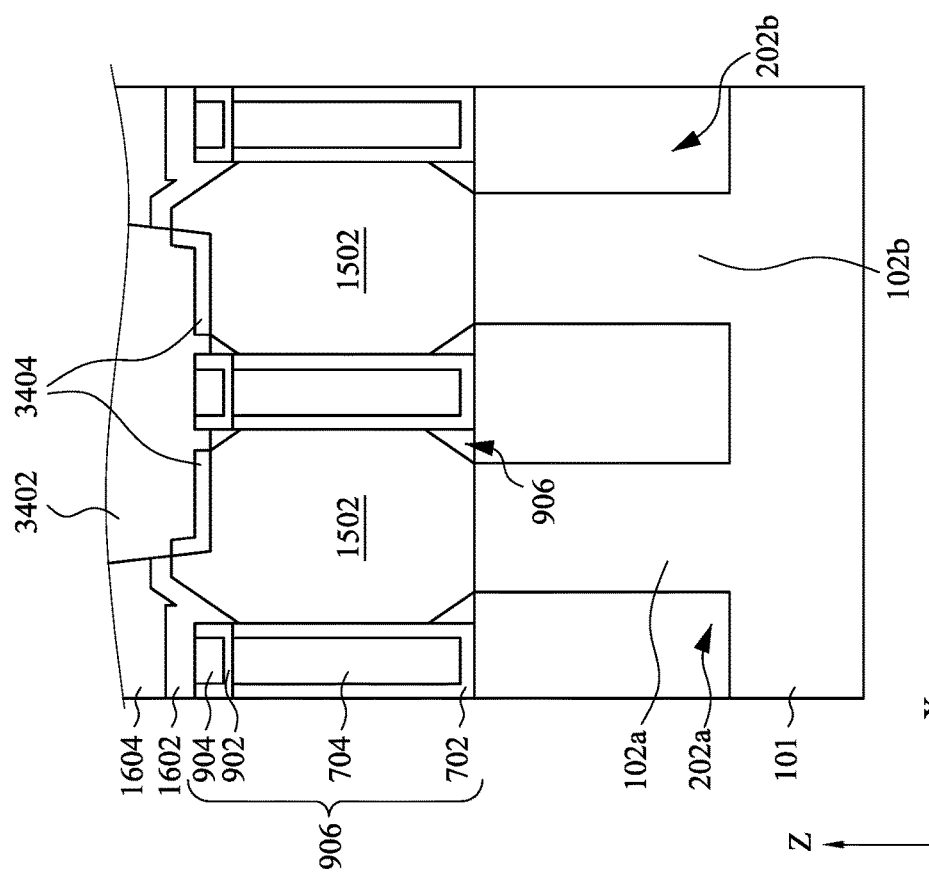

As shown in FIG. 15, S/D epitaxial features 1502 formed from the fins 202a, 202b are separated by the dielectric features 906. In some embodiments, each S/D epitaxial feature 1502 may be in contact with a conductive feature via a silicide layer. In some embodiments, as shown in FIG. 34A, adjacent S/D epitaxial features 1502 may share a conductive feature 3402 (FIG. 34A) that is disposed over the dielectric feature 906 located between the adjacent S/D epitaxial features 1502.

Figure 16:
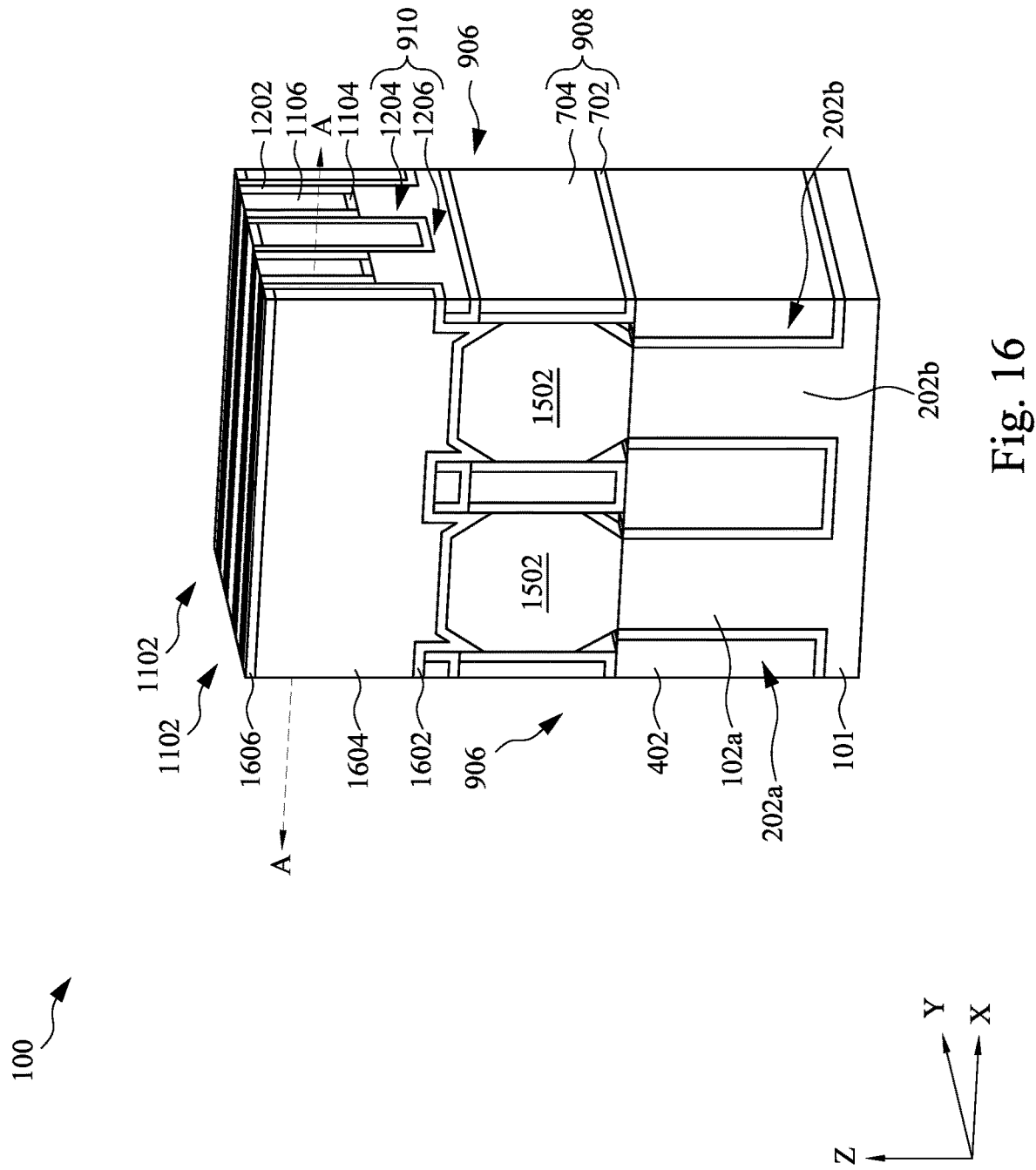

Next, as shown in FIG. 16, a contact etch stop layer (CESL) 1602 may be formed on the S/D epitaxial features 1502, the dielectric features 906, and adjacent the spacers 1202. The CESL 1602 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 1602 may be formed by CVD, PECVD, ALD, or any suitable deposition technique. In some embodiments, the CESL 1602 is a conformal layer formed by the ALD process. An interlayer dielectric (ILD) layer 1604 may be formed on the CESL 1602. The materials for the ILD layer 1604 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1604 may be deposited by a PECVD process or other suitable deposition technique. In some embodiments, after formation of the ILD layer 1604, the semiconductor device structure 100 may be subject to a thermal process to anneal the ILD layer 1604.

A planarization process is performed to expose the sacrificial gate electrode layer 1106, as shown in FIG. 16. The planarization process may be any suitable process, such as a CMP process. The planarization process removes portions of the ILD layer 1604 and the CESL 1602 disposed on the sacrificial gate stacks 1102. The planarization process may also remove the mask structure 1108 (FIG. 11). The ILD layer 1604 may be recessed to a level below the top of the sacrificial gate electrode layer 1106, and a nitrogen-containing layer 1606, such as a SiCN layer, may be formed on the recessed ILD layer 1604, as shown in FIG. 16. The nitrogen-containing layer 1606 may protect the ILD layer 1604 during subsequent etch processes.

Figure 17:
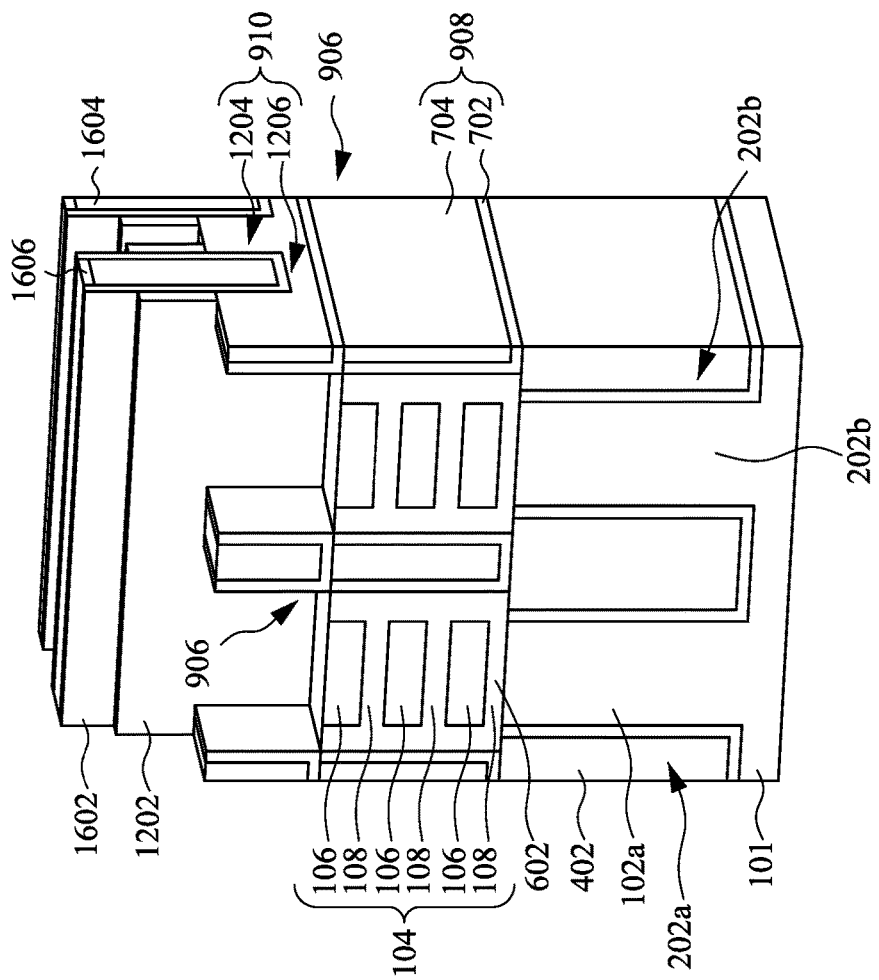

FIG. 17 is a perspective view of one of the manufacturing stages of the semiconductor device structure 100 taken along line A-A of FIG. 16, in accordance with some embodiments. As shown in FIG. 17, the sacrificial gate electrode layer 1106 (FIG. 16) and the sacrificial gate dielectric layer 1104 are removed, exposing the cladding layers 602 and the stacks of semiconductor layers 104. The sacrificial gate electrode layer 1106 may be first removed by any suitable process, such as dry etch, wet etch, or a combination thereof, followed by the removal of the sacrificial gate dielectric layer 1104, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 1106 but not the nitrogen-containing layer 1606, the top portion 910 of the dielectric features 906, and the CESL 1602. In some embodiments, a portion of the spacer 1202 may be removed by the etch process that removes the sacrificial gate electrode layer 1106, as shown in FIG. 17.

Figure 18:
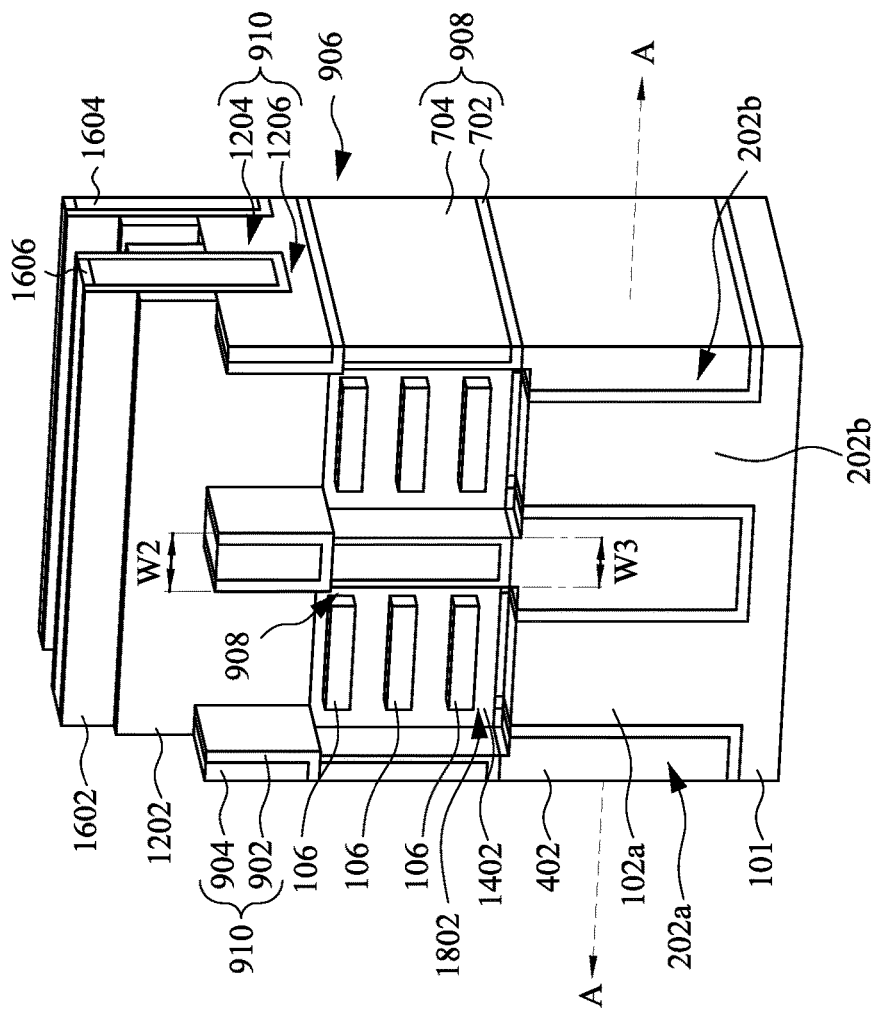

Next, as shown in FIG. 18, the cladding layers 602 and the second semiconductor layers 108 are removed. The removal processes expose the dielectric spacers 1402 and the first semiconductor layers 106. The removal process may be any suitable processes, such as dry etch, wet etch, or a combination thereof. The etch process may be a selective etch process that removes the cladding layers 602 and the second semiconductor layers 108 but not the high-K dielectric liner 902, the low-K dielectric material 904, and the firsts semiconductor layers 106. As a result, openings 1802 are formed, as shown in FIG. 18. In some embodiments, the dimension of the portion of the liner 702 in contact with sidewalls of the dielectric material 704 may be reduced, leading to the bottom portion 908 of the dielectric feature 906 having a width W3 less than the width W2 of the top portion 910 of the dielectric feature 906. In some embodiments, the dimension of the liner 702 is not reduced, and the width W2 and the width W3 may be substantially the same (FIG. 19). The portion of the first semiconductor layers 106 not covered by the dielectric spacers 1402 may be exposed in the openings 1802. Each first semiconductor layer 106 may be a nanosheet channel of the nanosheet transistor.

FIGS. 19 and 20 are cross-sectional side views of various manufacturing stages of the semiconductor device structure 100 along line A-A of FIG. 18, in accordance with some embodiments. As shown in FIG. 19, oxygen-containing layers 1902 may be formed around the exposed surfaces of the first semiconductor layers 106 and the substrate portions 102$a$, 102$b$ of the fins 202$a$, 202$b$ in the openings 1802, followed by forming gate dielectric layers 1904 on the oxygen-containing layers 1902 in the openings 1802. The oxygen-containing layer 1902 may be an oxide layer, and the gate dielectric layer 1904 may include the same material as the sacrificial gate dielectric layer 1104 (FIG. 11). In some embodiments, the gate dielectric layer 1904 includes a high-K dielectric material that is the same as the material of the high-K dielectric liner 902. The oxygen-containing layers 1902 and the gate dielectric layers 1904 may be formed by any suitable processes, such as ALD processes. In some embodiments, the oxygen-containing layers 1902 and the gate dielectric layers 1904 are formed by conformal processes.

Next, the gate electrode layers 1906 are formed in the openings 1802 and on the gate dielectric layers 1904. The gate electrode layer 1906 is formed on the gate dielectric layer 1904 to surround a portion of each first semiconductor layer 106. The gate electrode layer 1906 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers 1906 may be formed by PVD, CVD, ALD, electro-plating, or other suitable method.

Next, the gate electrode layers 1906 are recessed to a level below top surfaces 2004 of the low-K dielectric material 904 of the dielectric feature 906, and conductive layers 2002 are formed on corresponding gate electrode layers 1906, as shown in FIG. 20. Additional fins 202$c$, 202$d$, 202$e$ may be formed from the substrate 101. The fins 202$a$, 202$b$, 202$c$, 202$d$, 202$e$ may have different widths. For example, fins 202$a$, 202$b$ each has a width greater than a width of each of the fins 202$c$, 202$d$, 202$e$. A wider fin width leads to a wider channel, and different devices may have different channel widths. For example, devices with wider channels may be more suitable for high-speed applications, such as NAND devices. Devices with narrower channels may be more suitable for low-power and low-leakage applications, such as inverter devices. The distances between adjacent gate electrode layers 1906 may be different. In other words, the widths of the dielectric features 906 may be different. For example, the dielectric feature 906 disposed between the gate electrode layer 1906 over the substrate portion 102$c$ and the gate electrode layer 1906 over the substrate portion 102$d$ is wider than the dielectric feature 906 disposed between the gate electrode layer 1906 over the substrate portion 102$d$ and the gate electrode layer 1906 over the substrate portion 102$e$, as shown in FIG. 20.

The recess of the gate electrode layers 1906 may be any suitable process, such as a dry etch, a wet etch, or a combination thereof. In some embodiments, the recess process may be a selective dry etch process that does not substantially affect the nitrogen-containing layer 1606 (FIG.

18), the spacer 1202 (FIG. 18), and the CESL 1602 (FIG. 18). As a result of the recess process, adjacent gate electrode layers 1906 are separated, or cut-off, by the dielectric feature 906. The recess of the gate electrode layers 1906 may leave top surfaces of the gate electrode layers 1906 at different levels. The conductive layers 2002 formed on the top surfaces of the gate electrode layers 1906 may form substantially coplanar surfaces 2003. The substantially coplanar surfaces 2003 of the conductive layers 2002 may be also coplanar with the top surfaces 2004 of the low-K dielectric materials 904. As a result, each gate electrode layer 1906 along with the conductive layer 2002 formed thereon are electrically separated from adjacent gate electrode layers 1906 and the conductive layers 2002 by the dielectric features 906. The conductive layer 2002 is separated by the dielectric features 906 into multiple segments. For example, the conductive layer 2002 formed on adjacent gate electrode layers 1906 may be separated by the dielectric feature 906 formed between the adjacent gate electrode layers 1906 into two segments. The conductive layer 2002 may include a metal, such as tungsten, ruthenium, cobalt, or any suitable metal. In some embodiments, the conductive layer 2002 includes fluorine-free tungsten. The conductive layer 2002 may be formed on the conductive material of the gate electrode layers 1906 but not on the dielectric materials of other exposed surfaces of the semiconductor device structure 100. The conductive layer 2002 may be formed by any suitable process, such as CVD, PVD, ALD, or electrochemical plating (ECP).

Figure 21:
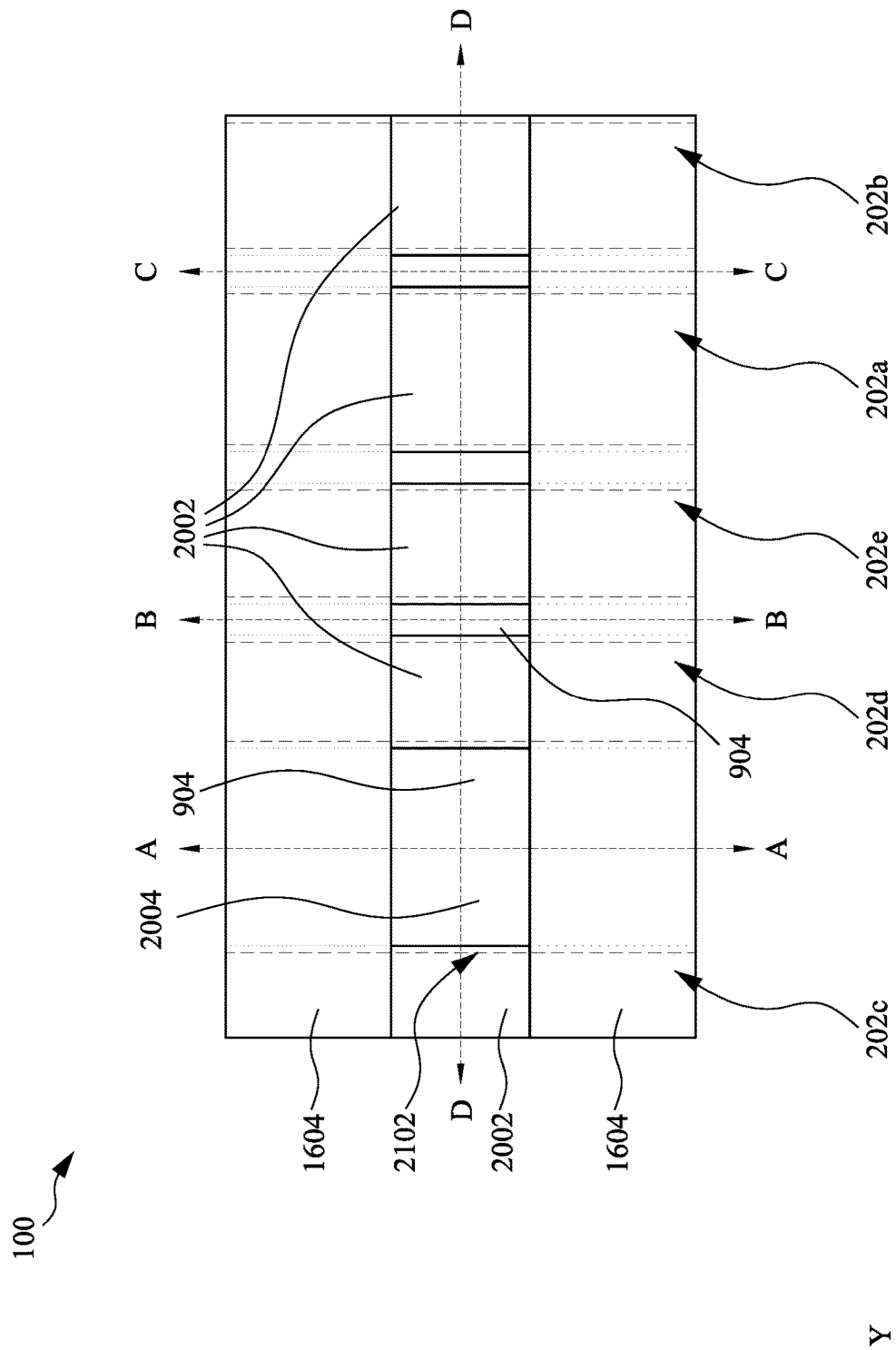
FIG. 21 is a top view of the semiconductor device structure shown in FIG. 20, in accordance with some embodiments.

FIG. 21 is a top view of the semiconductor device structure 100 shown in FIG. 20, in accordance with some embodiments. As shown in FIG. 21, the semiconductor device structure 100 includes the plurality of fins 202a, 202b, 202c, 202d, 202e shown in dotted lines. The ILD layers 1604 are formed over portions of the fins 202a, 202b, 202c, 202d, 202e. The CESL 1602 and the nitrogen-containing layer 1606 are omitted for clarity. A trench 2102 is formed over a portion of the fins 202a, 202b, 202c, 202d, 202e between the ILD layers 1604. The bottom of the trench 2102 includes the conductive layers 2002 separated by the low-K dielectric materials 904 of the dielectric features 906. The high-K dielectric liners 902 and the spacers 1202 are omitted for clarity.

Figure 22C:
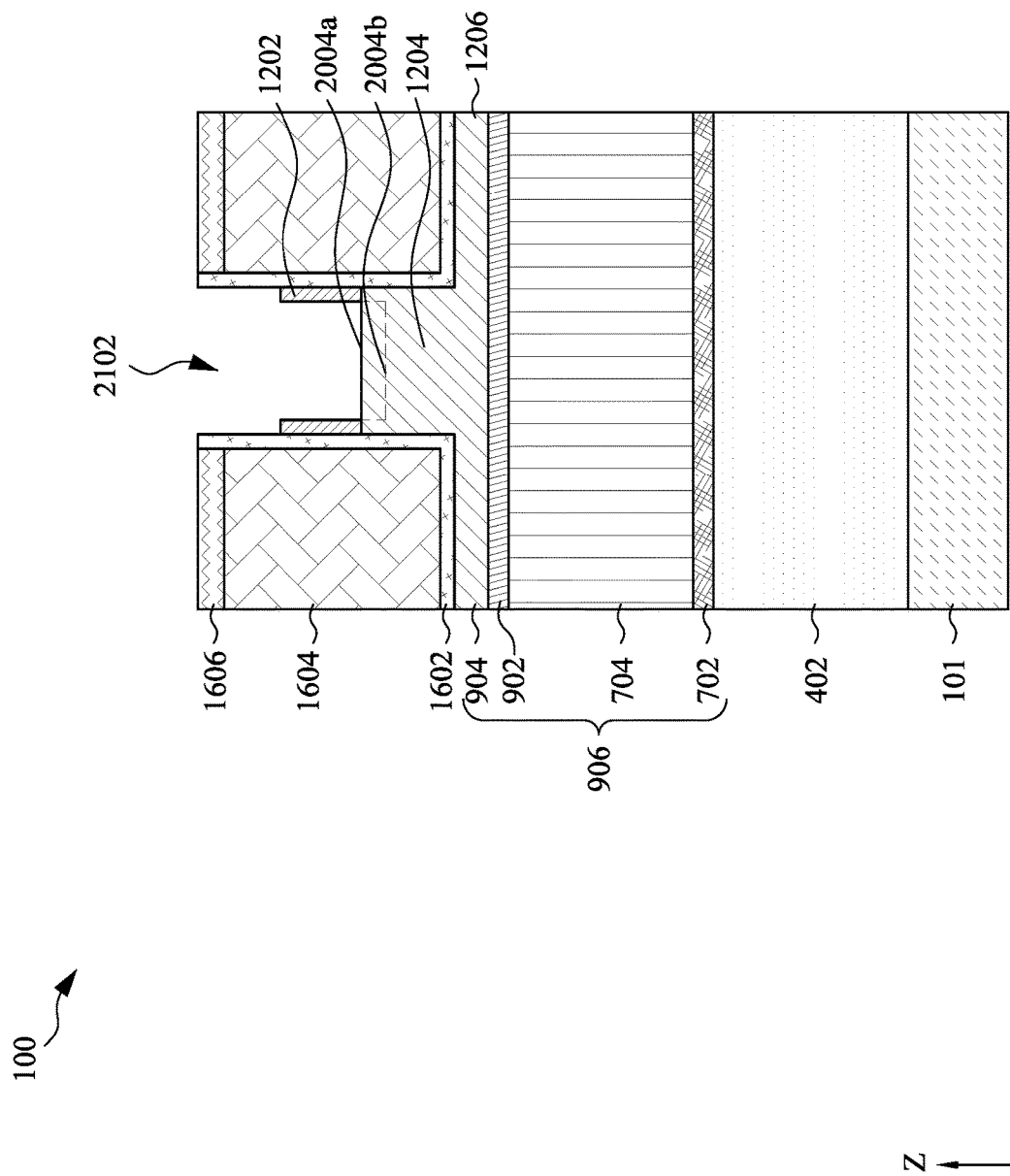

FIGS. 22A-22C are cross-sectional side views of one of various stages of manufacturing the semiconductor device structure 100 taken along lines A-A, B-B, C-C of FIG. 21, respectively, in accordance with some embodiments. FIGS. 22A and 22C are cross-sectional side views of sections of the trench 2102 above the dielectric features 906, and FIG. 22B is a cross-sectional side view of a section of the trench 2102 above the conductive layer 2002. As shown in FIGS. 22A, 22B, 22C, the trench 2102 may be formed between ILD layers 1604. The ILD layer 1604 may be disposed on the CESL 1602, and the nitrogen-containing layer 1606 may be disposed on the ILD layer 1604. The spacers 1202 may be in contact with the CESL 1602. As shown in FIGS. 22A and 22C, the top portion 910 of the dielectric feature 906 includes the first portion 1204 and the second portion 1206. The first portion 1204 of the top portion 910 of the dielectric feature 906 may be the bottom of the sections of the trench 2102 shown in FIGS. 22A and 22C. In some embodiments, the top surface 2004a of the first portion 1204 may be level with the bottom surfaces of the spacers 1202, as shown in FIGS. 22A and 22C. In some embodiments, the top surface 2004b of the first portion 1204 may be recessed from the bottom surfaces of the spacers 1202, shown in dotted lines in FIGS. 22A and 22C.

The trench 2102 includes various sections having different bottoms, such as the first portions 1204 of the dielectric features 906 as shown in FIGS. 22A, 22C, and the conductive layer 2002 as shown in FIG. 22B. In some embodiments, the surfaces 2003 of the conductive layers 2002 and the surfaces 2004 of the low-K dielectric materials 904 are coplanar.

Figure 23A:
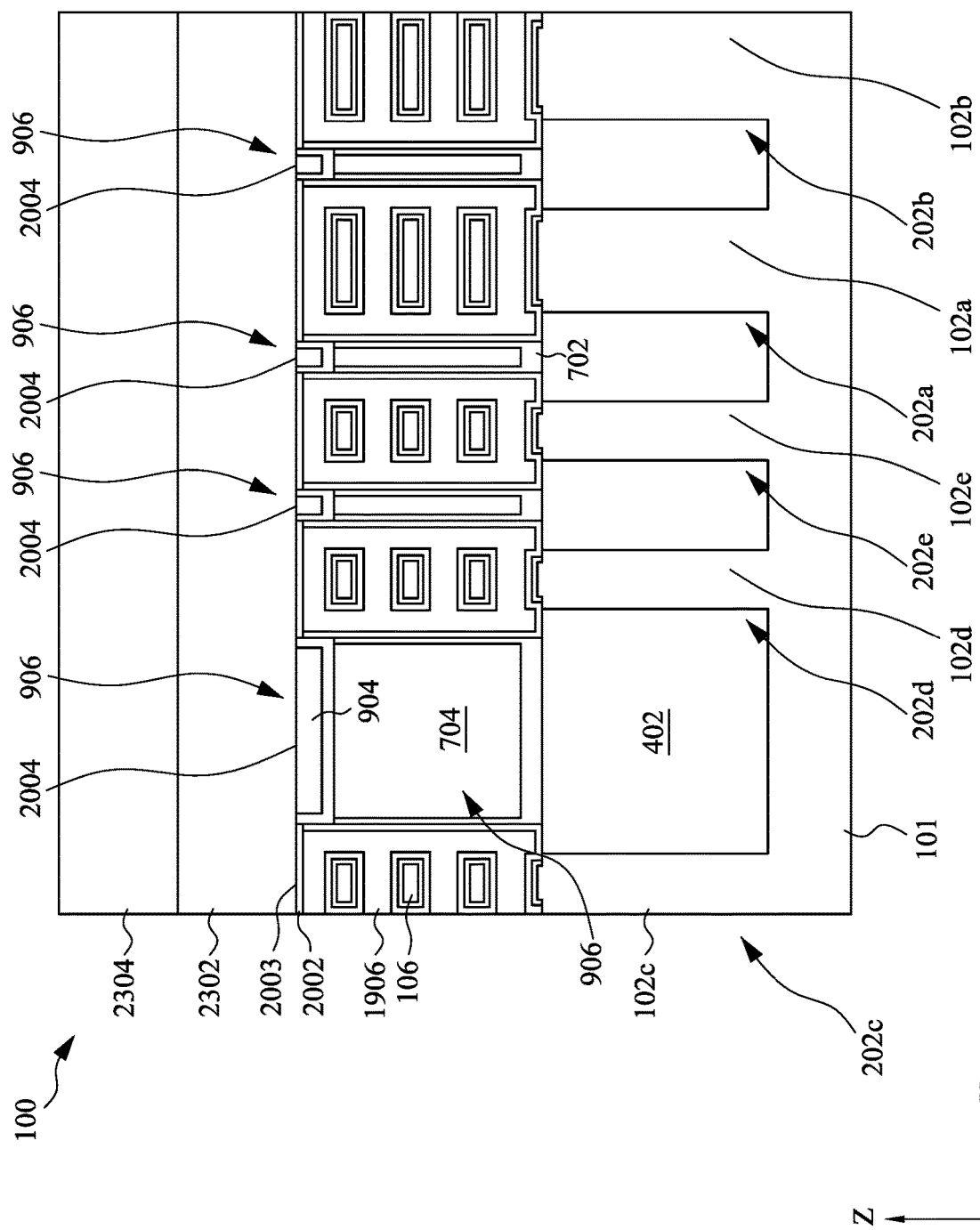
FIGS. 23A, 23B, 23C, and 23D are cross-sectional side views of one of various stages of manufacturing the semiconductor device structure taken along lines D-D, A-A, B-B, C-C of FIG. 21, respectively, in accordance with some embodiments.
Figure 23C:
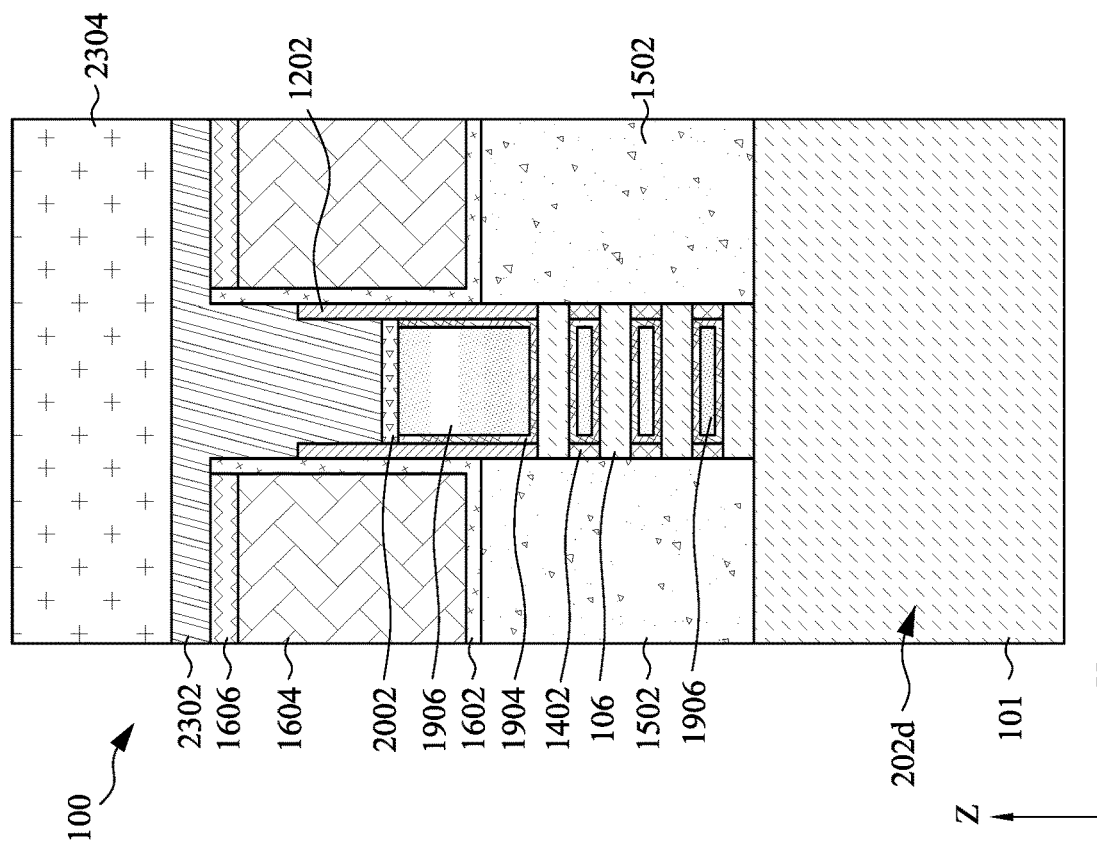
Figure 23B:
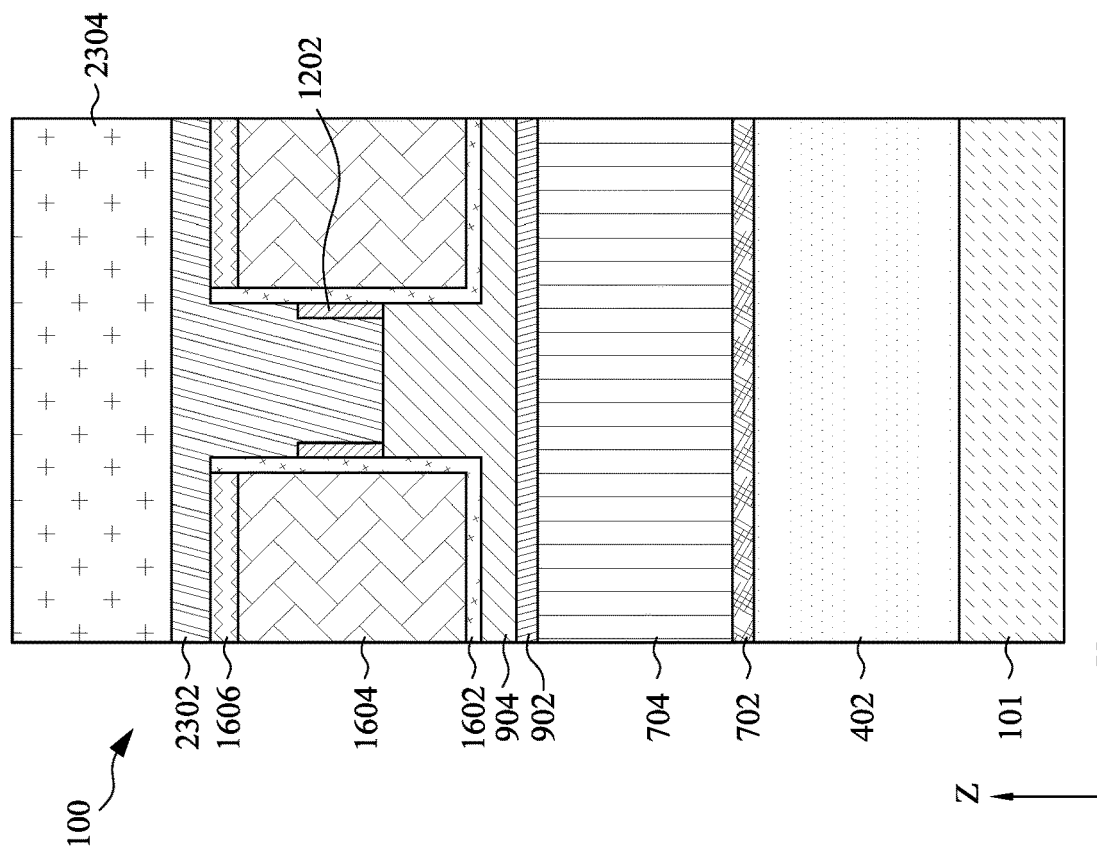
Figure 23D:
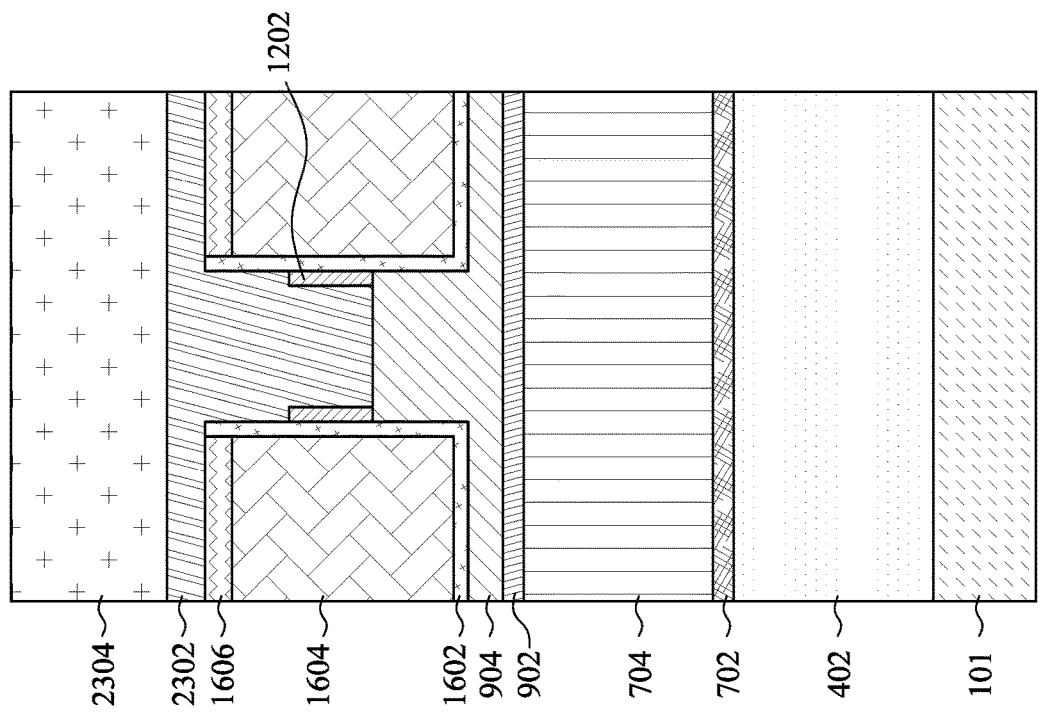
Figure 23D:

FIGS. 23A-23D are cross-sectional side views of one of various stages of manufacturing the semiconductor device structure taken along lines D-D, A-A, B-B, C-C of FIG. 21, respectively, in accordance with some embodiments. As shown in FIG. 23A, a semiconductor layer 2302 is formed on the surfaces 2003 of the conductive layers 2002 and surfaces 2004 of the low-K dielectric materials 904, and a dielectric layer 2304 is formed on the semiconductor layer 2302. As shown in FIGS. 23B-23D, the semiconductor layer 2302 fills the trench 2102 and is formed on the nitrogen-containing layer 1606. The semiconductor layer 2302 has a different etch selectivity with respect to the dielectric materials of the nitrogen-containing layers 1606, the spacers 1202, the low-K dielectric material 904, and the dielectric layer 2304. The semiconductor layer 2302 may be formed by any suitable process, such as CVD, PECVD, MOCVD, or MBE. In some embodiments, the semiconductor layer 2302 includes amorphous silicon. The dielectric layer 2304 may be a nitrogen-containing layer, such as a nitride. In some embodiments, the dielectric layer 2304 includes silicon nitride. The dielectric layer 2304 may be formed by any suitable process, such as CVD or PECVD.

Figure 24A:
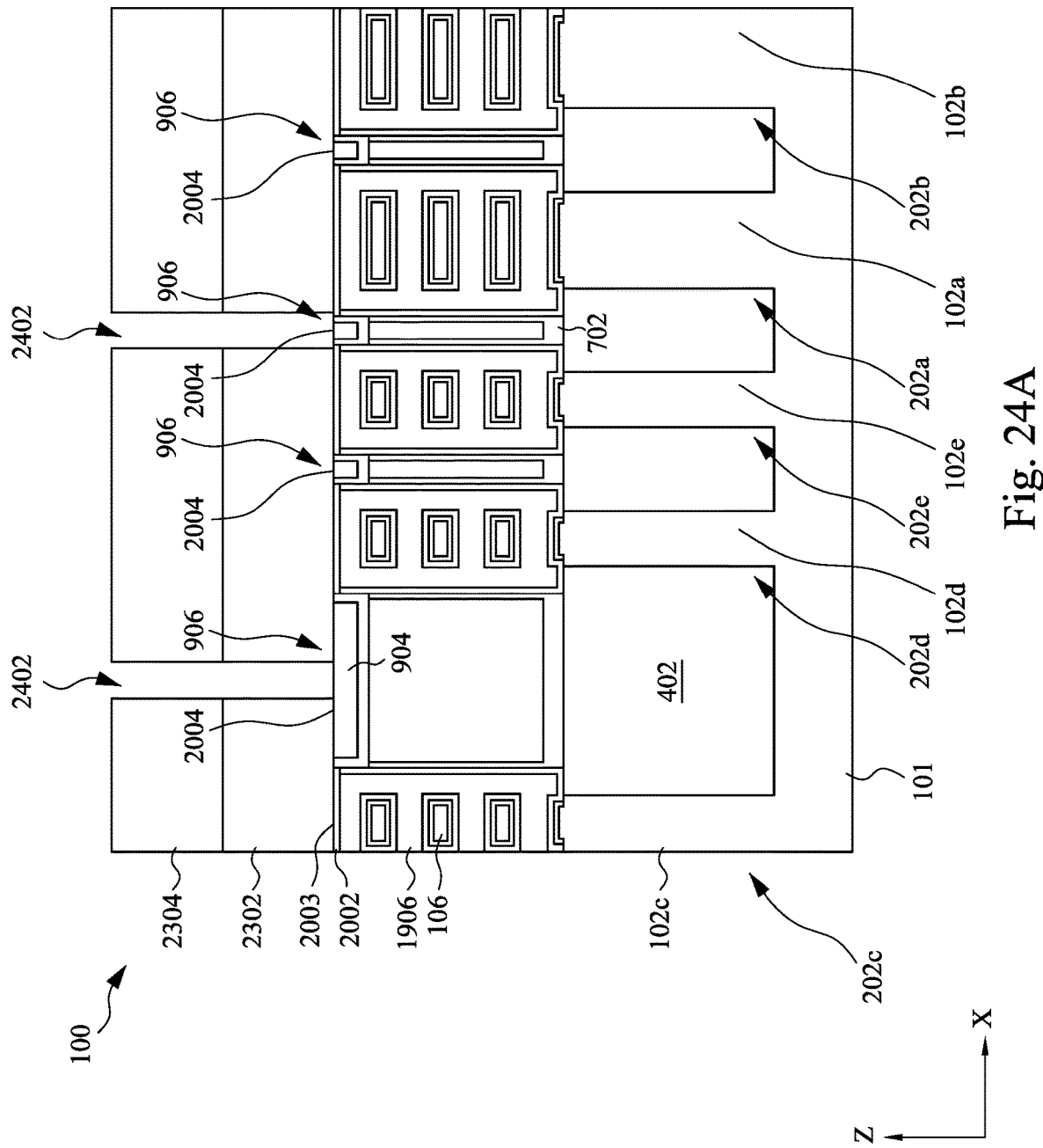
FIGS. 24A, 24B, 24C, and 24D are cross-sectional side views of one of various stages of manufacturing the semiconductor device structure taken along lines D-D, A-A, B-B, C-C of FIG. 21, respectively, in accordance with some embodiments.
Figure 24C:
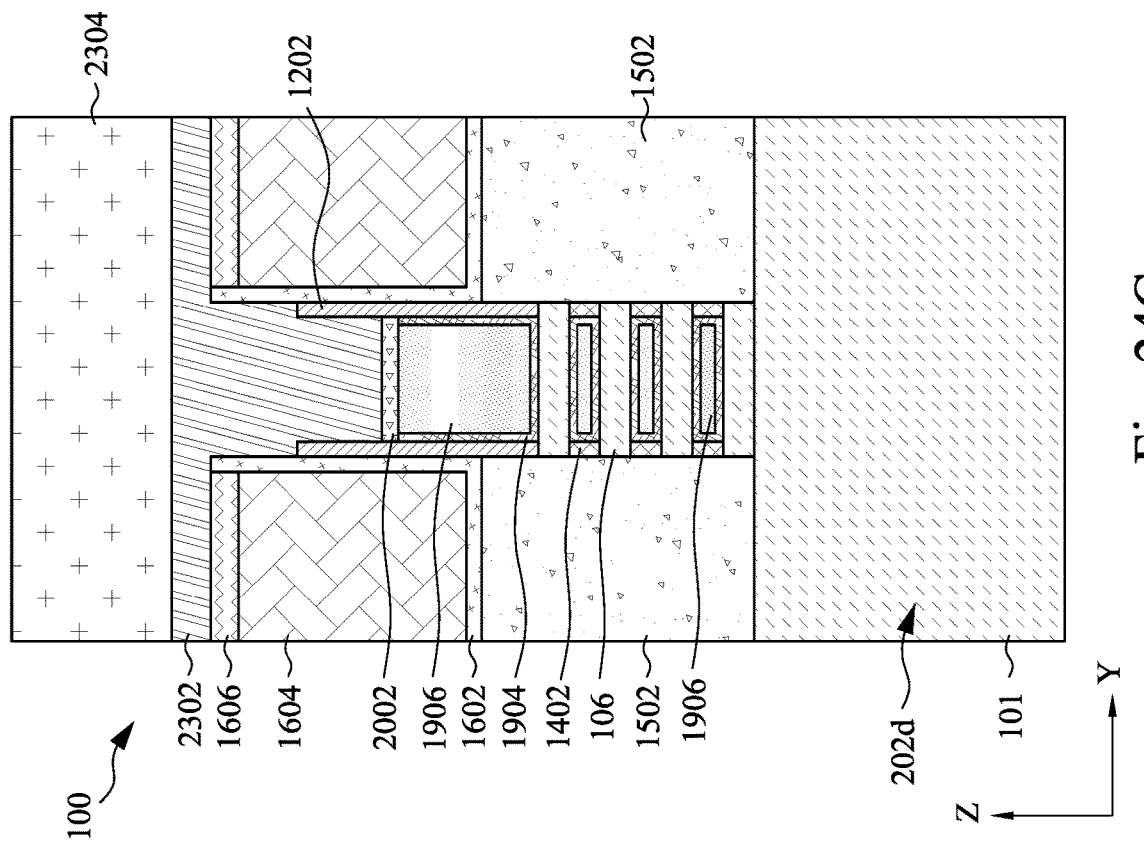
Figure 24B:
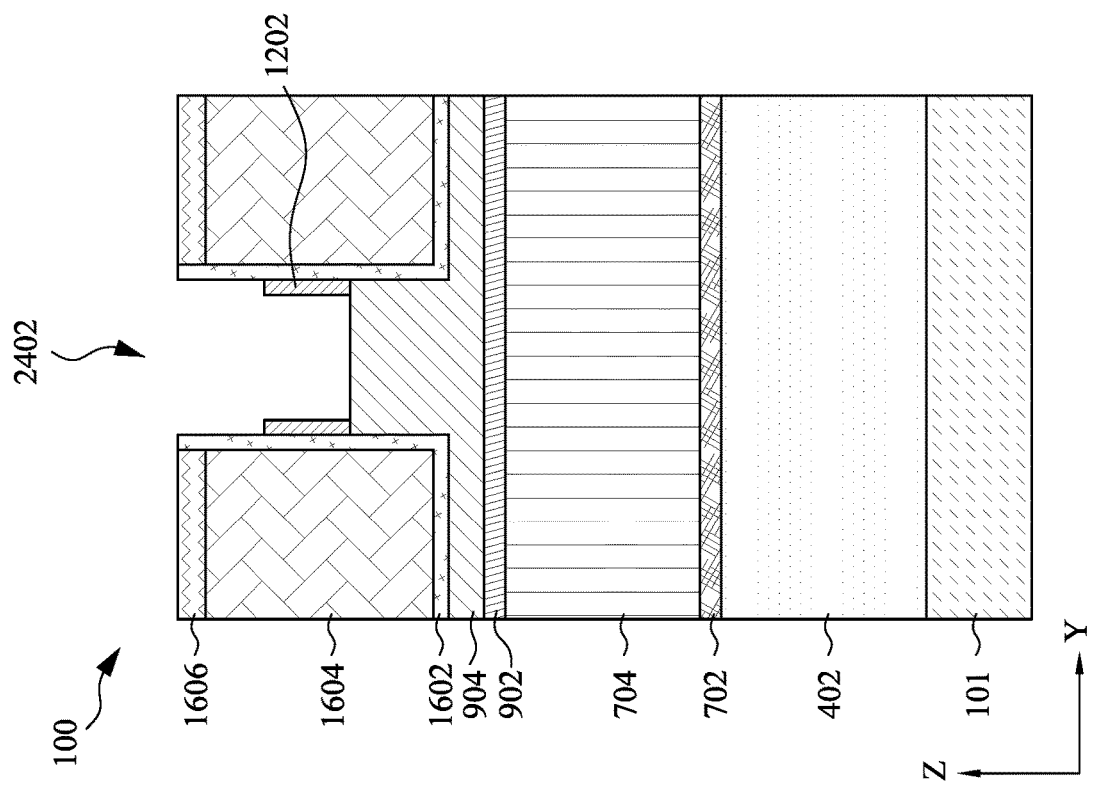
Figure 24D:
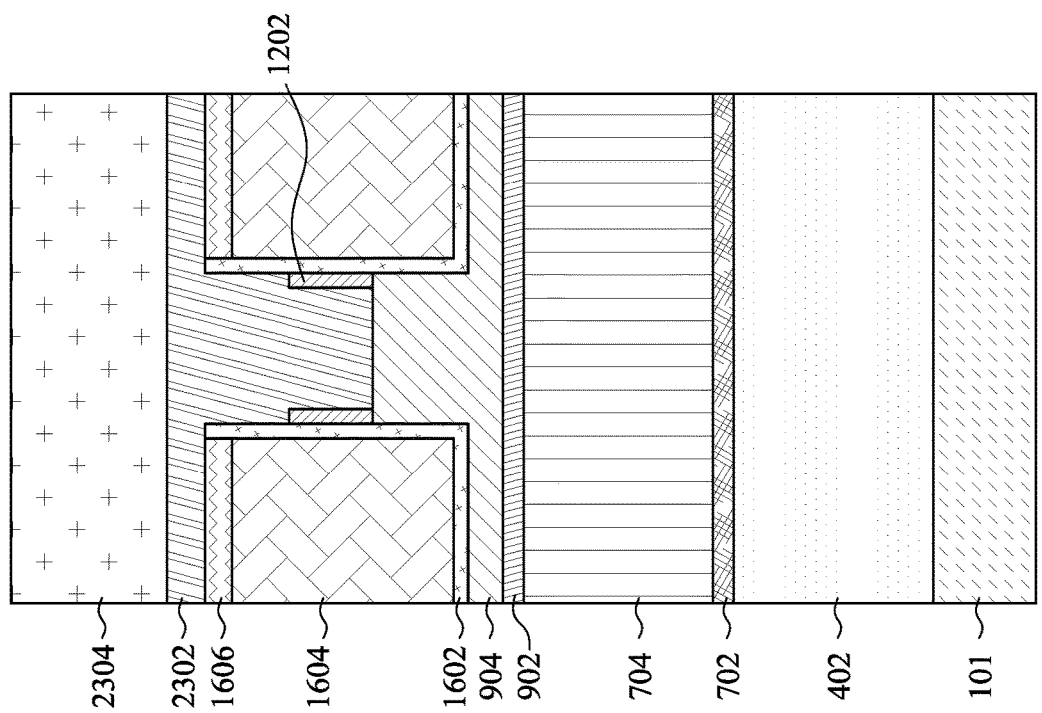

Next, as shown in FIGS. 24A and 24B, openings 2402 are formed in the dielectric layer 2304 and the semiconductor layer 2302 to expose the surfaces 2004 of the low-K dielectric materials 904 of some dielectric features 906. The surfaces 2003 of the conductive layers 2002 and surfaces 2004 of the low-K dielectric materials 904 of other dielectric features 906 are covered by the semiconductor layer 2302 and the dielectric layer 2304, as shown in FIGS. 24C and 24D. One opening 2402 is formed over the dielectric feature 906 between the gate electrode layers 1906 formed over the substrate portions 102c, 102d, and the other opening 2402 is formed over the dielectric feature 906 between the gate electrode layers 1906 formed over the substrate portions 102e, 102a, as shown in FIG. 24A. The openings 2402 are predetermined so the gate electrode layers 1906 between the openings 2402, such as the gate electrode layers 1906 over the substrate portions 102d, 102e, are to be connected in subsequent processes.

In some embodiments, the openings 2402 are formed by two etch processes. A first etch process is performed to remove portions of the dielectric layer 2304 to expose portions of the semiconductor layer 2302 disposed in the trench 2102 and on the nitrogen-containing layers 1606. The first etch process may be a dry etch, a wet etch, or a combination thereof. The first etch process may be a selective etch process that removes the portions of the dielectric layer 2304 but not the semiconductor layer 2302. A second etch process is performed to remove the exposed portions of the semiconductor layer 2302, including the semiconductor layer 2302 in the section of the trench 2102, to form openings 2402, as shown in FIG. 24B. The second etch process may be a dry etch, a wet etch, or a combination thereof. The second etch process may be a selective etch process that removes the portions of the semiconductor layer 2302 but not the dielectric layer 2304, the nitrogen-containing layers 1606, the spacers 1202, and the low-K dielectric materials 904.

Figure 25A:
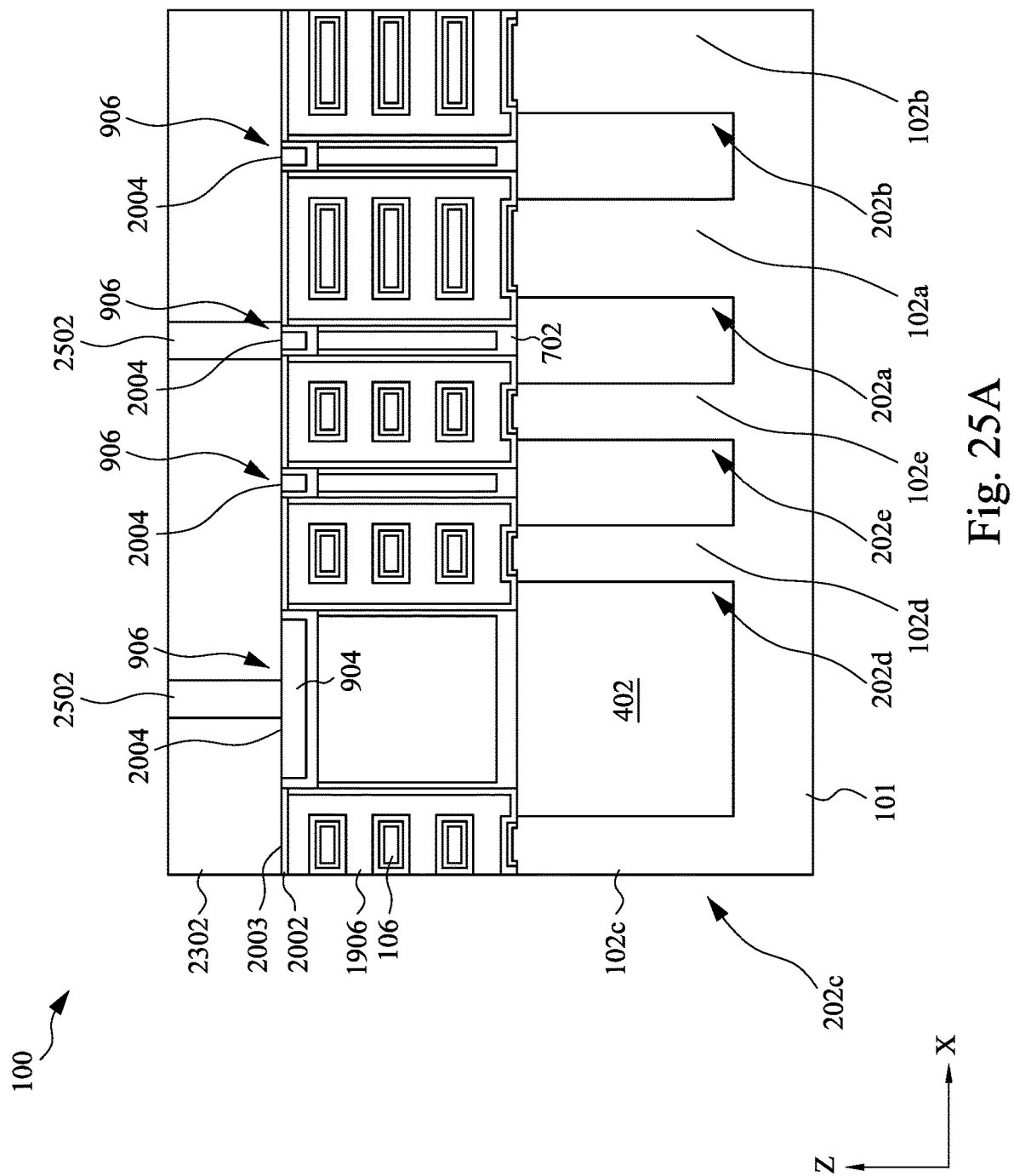
FIGS. 25A, 25B, 25C, and 25D are cross-sectional side views of one of various stages of manufacturing the semiconductor device structure taken along lines D-D, A-A, B-B, C-C of FIG. 21, respectively, in accordance with some embodiments.
Figure 25C:
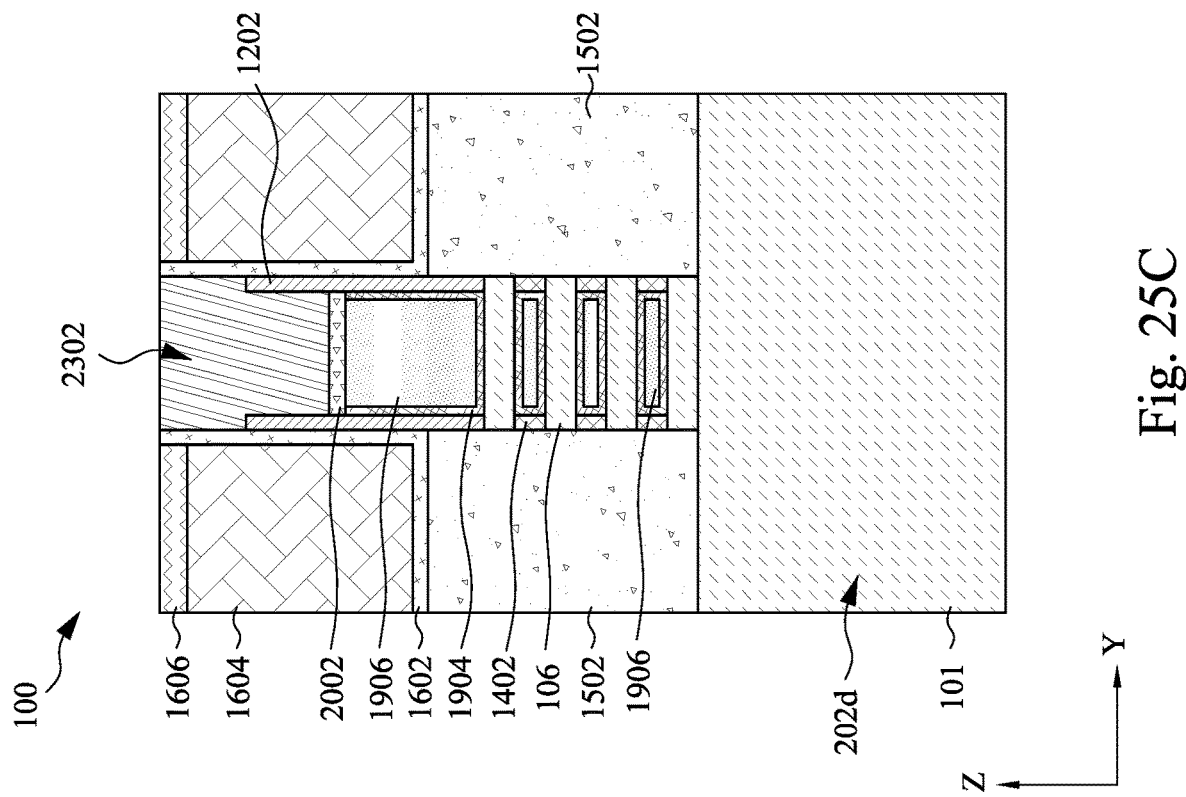
Figure 25B:
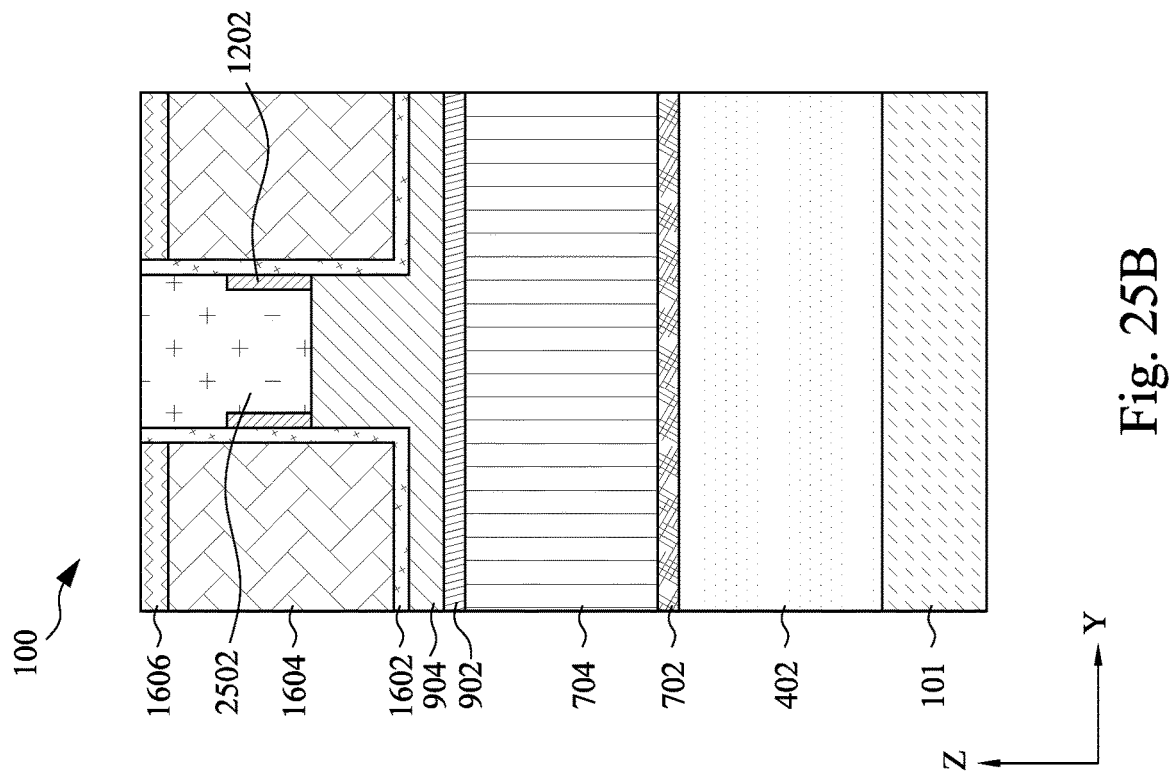
Figure 25D:
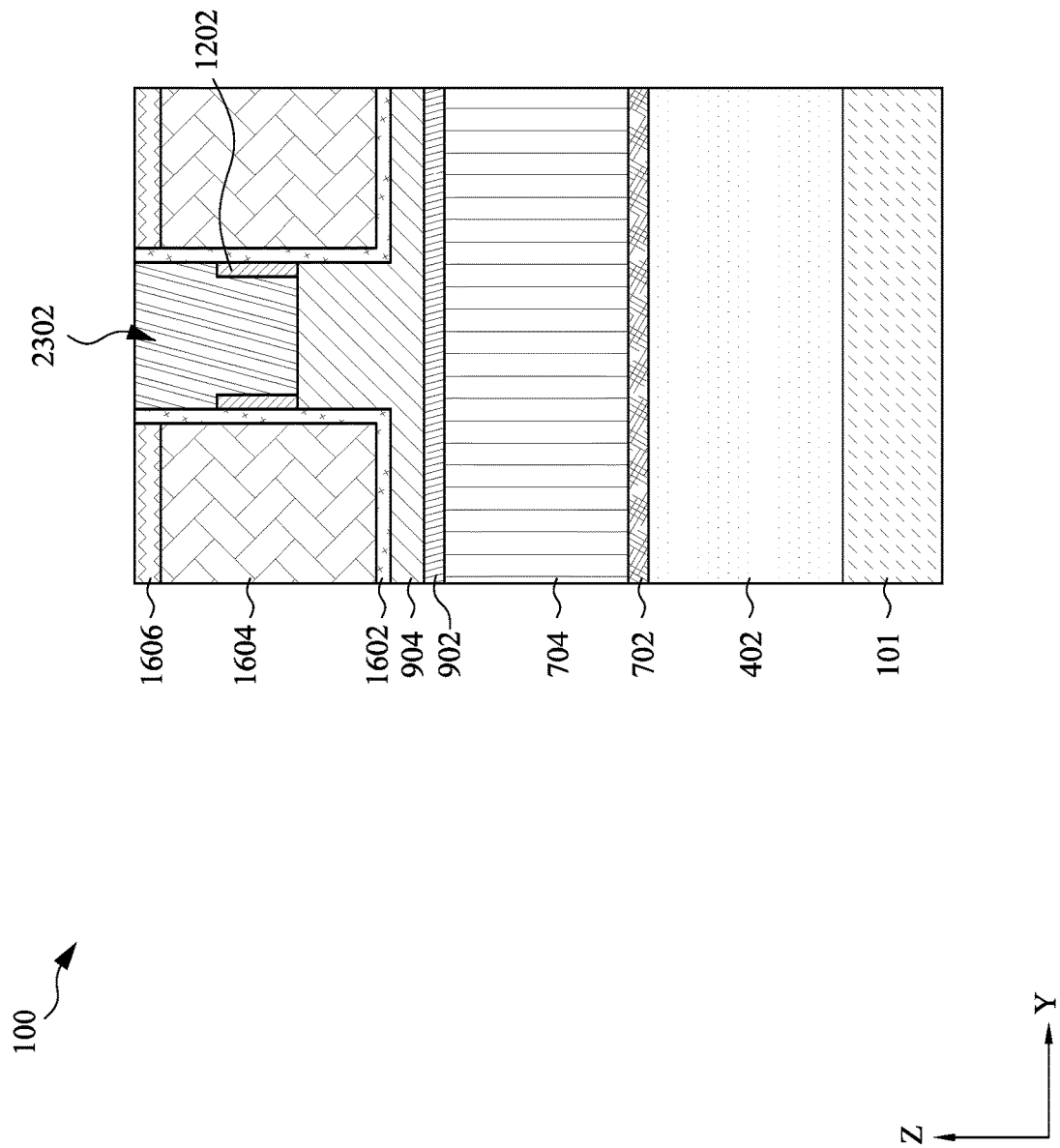

Next, as shown in FIGS. 25A and 25B, a dielectric layer 2502 is formed in each opening 2402. The dielectric layer 2502 may include the same material as the dielectric layer 2304 and may be formed by the same process as that of the dielectric layer 2304. The dielectric layer 2502 may be formed on the dielectric layer 2304. A planarization process may be formed to remove the dielectric layer 2502 formed on the dielectric layer 2304, the dielectric layer 2304, and a portion of the semiconductor layer 2302 to expose the nitrogen-containing layers 1606, as shown in FIGS. 25B, 25C, 25D. As shown in FIGS. 25A-25D, the dielectric layers 2502 are formed on some of the dielectric features 906, while the semiconductor layer 2302 is formed on the conductive layers 2002 and other dielectric features 906. The dielectric layers 2502 cut off layers formed subsequently to electrically connect the gate electrode layers 1906.

Figure 26A:
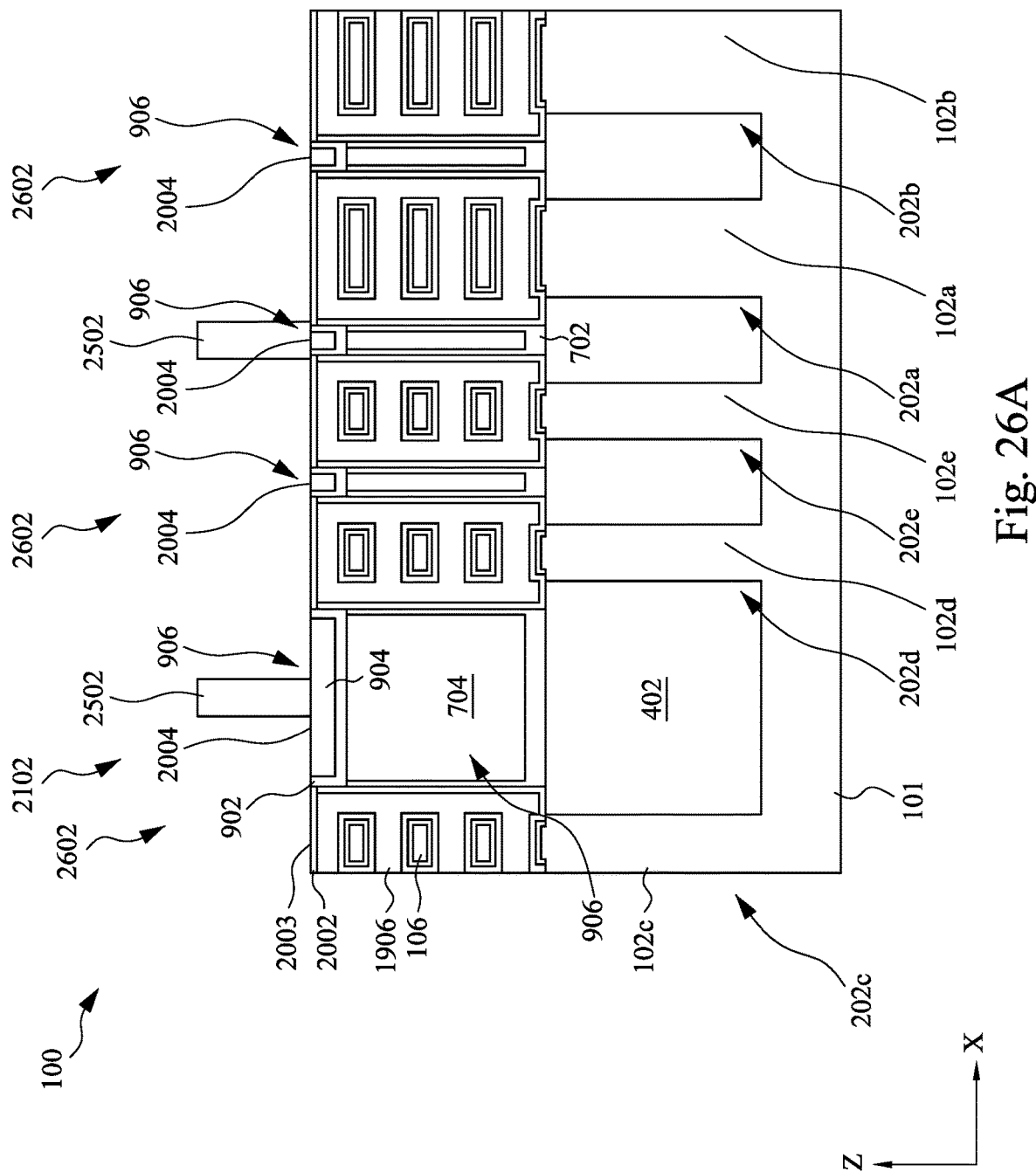
FIGS. 26A, 26B, 26C, and 26D are cross-sectional side views of one of various stages of manufacturing the semiconductor device structure taken along lines D-D, A-A, B-B, C-C of FIG. 21, respectively, in accordance with some embodiments.
Figure 26C:
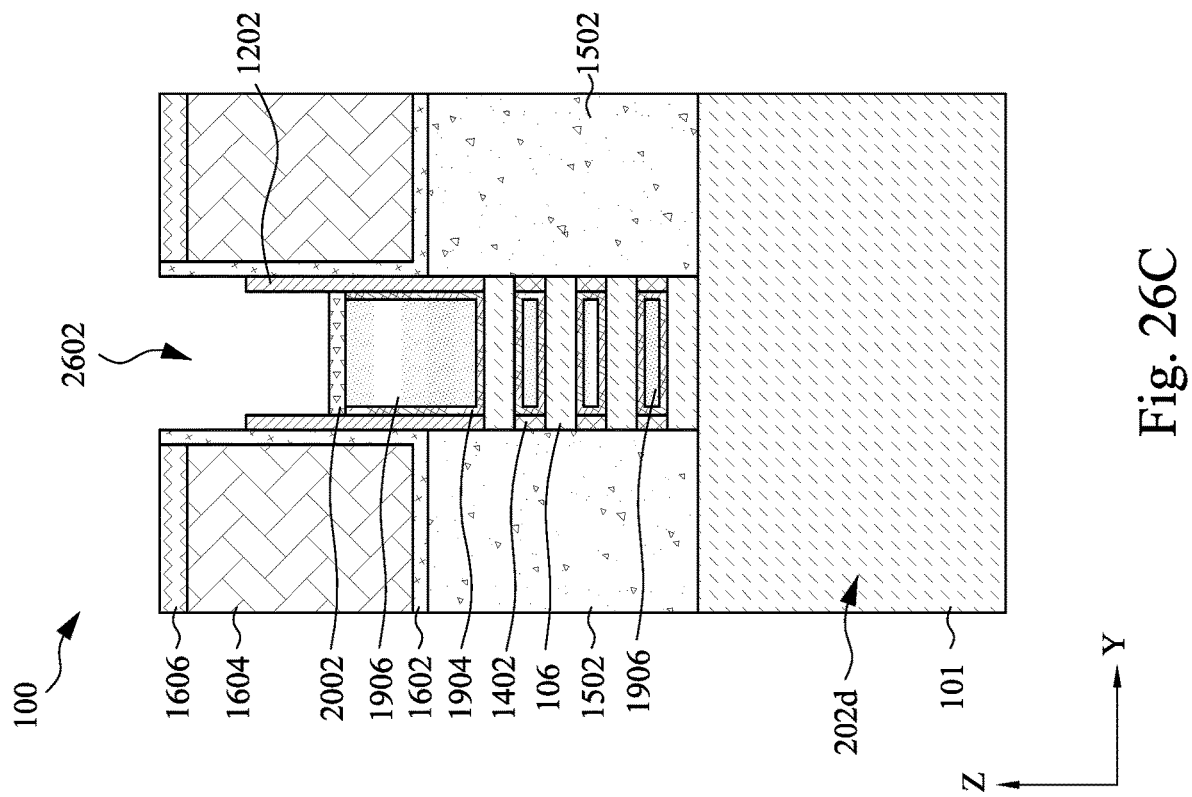
Figure 26B:
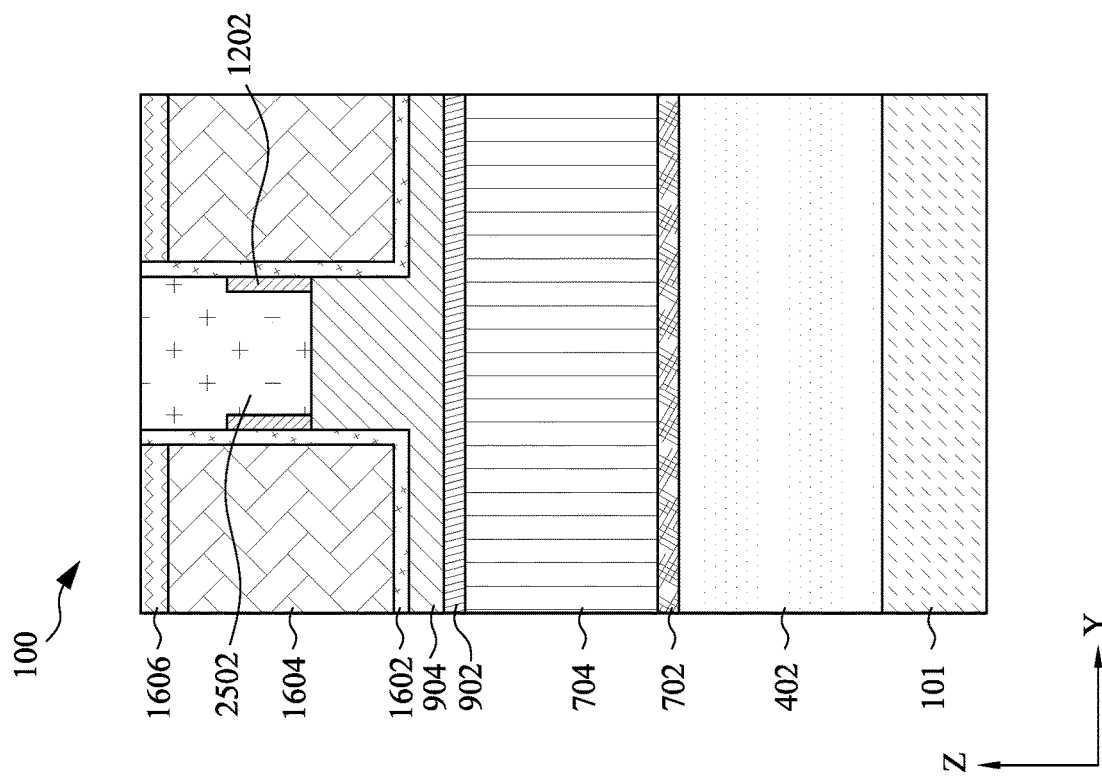
Figure 26D:
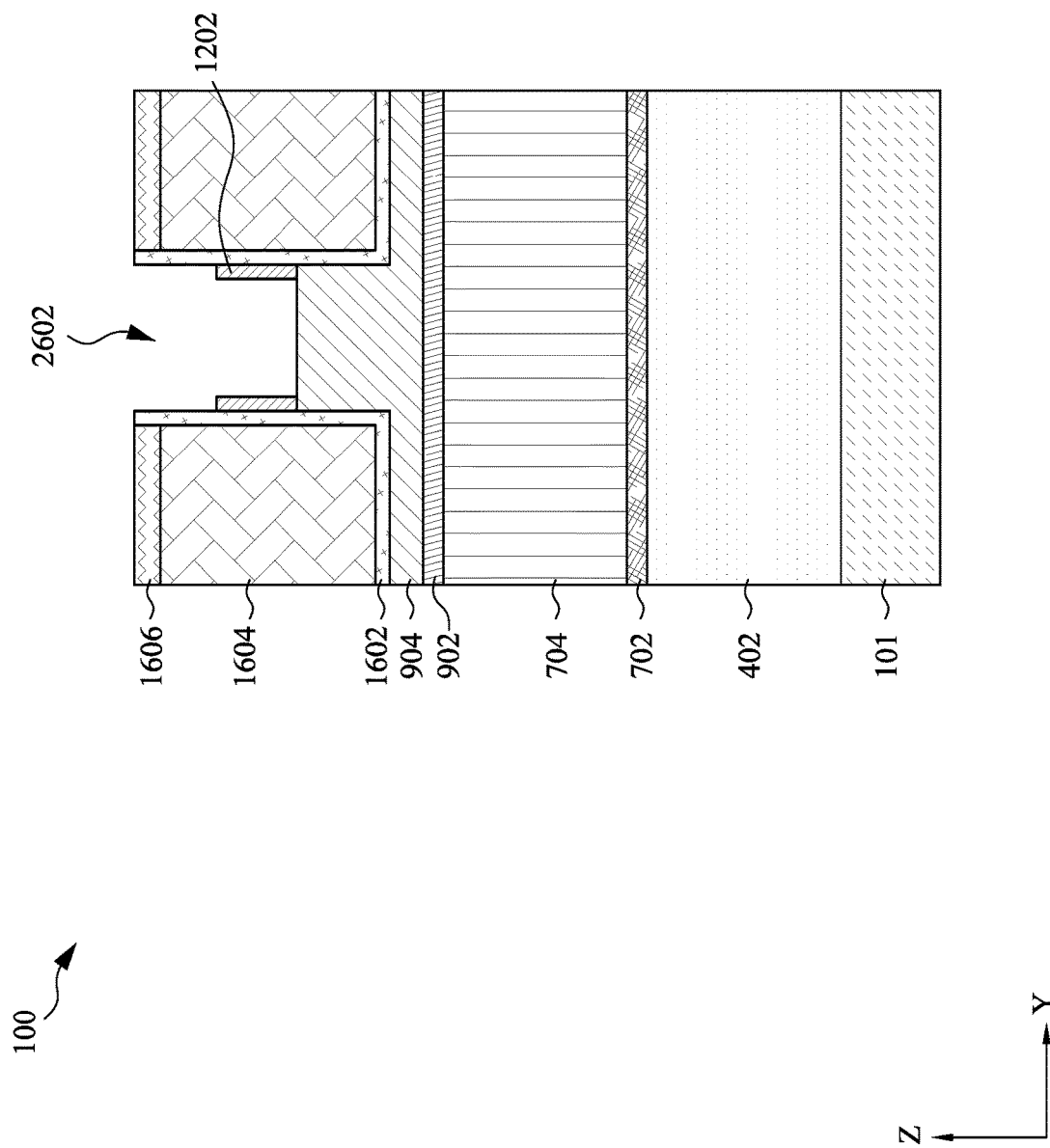

Next, as shown in FIGS. 26A-26D, the semiconductor layer 2302 is removed. The semiconductor layer 2302 may be removed by any suitable process, such as a dry etch, a wet etch, or a combination thereof. The removal of the semiconductor layer 2302 may be a selective etch that removes the semiconductor layer 2302 but not the nitrogen-containing layer 1606 and the dielectric layers 2502. As shown in FIG. 26A, after the removal of the semiconductor layer 2302, the trench 2102 is separated by the dielectric layers 2502 into segments 2602. The conductive layers 2002 and some of the dielectric features 906 are exposed in the segments 2602 of the trench 2102, as shown in FIGS. 26A, 26C, 26D.

Figure 27B:
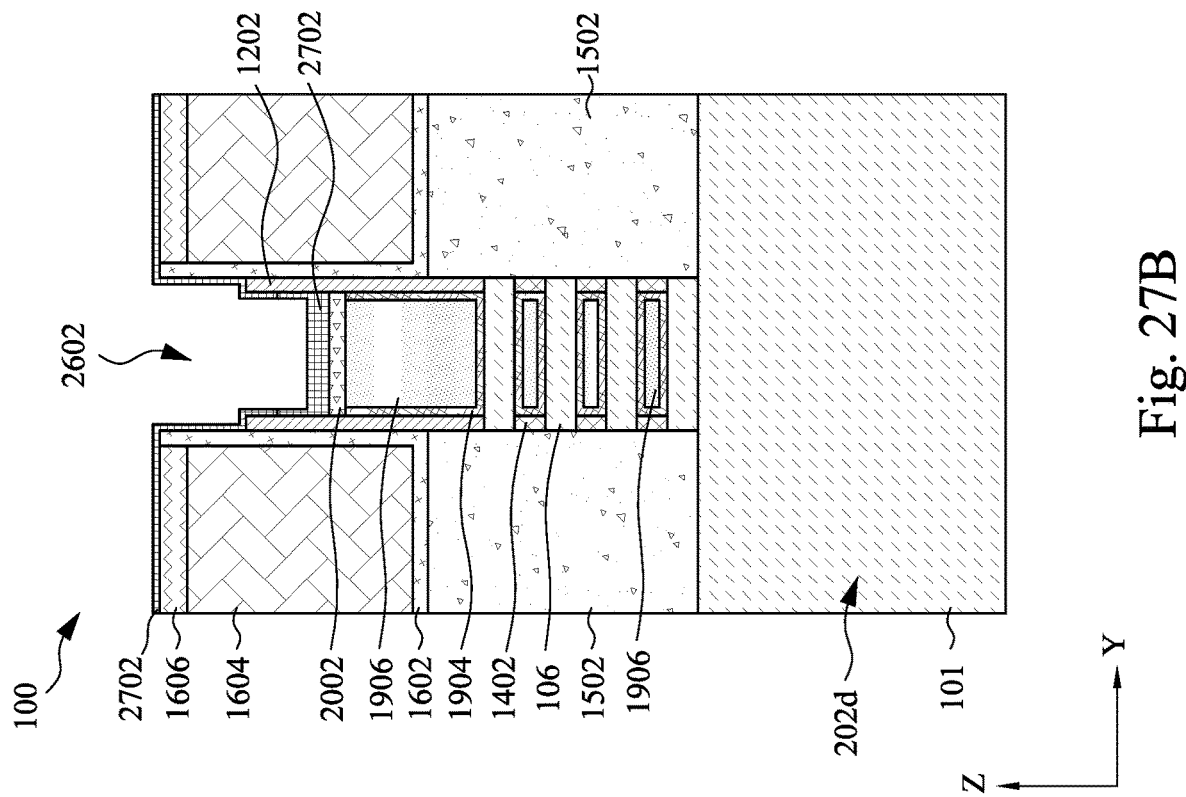
FIGS. 27B, 28B, 29B, 30B, and 31B are cross-sectional side views of various stages of manufacturing the semiconductor device structure taken along line B-B of FIG. 21, in accordance with some embodiments.
Figure 27A:
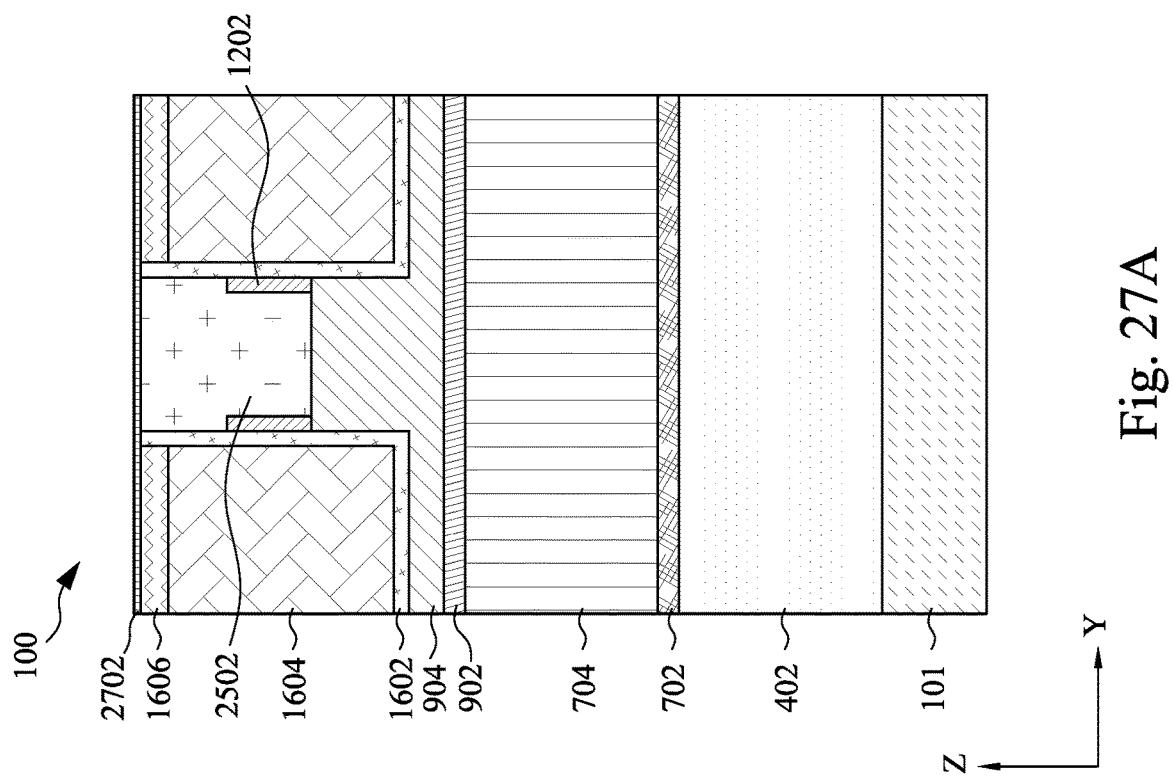
FIGS. 27A, 28A, 29A, 30A, and 31A are cross-sectional side views of various stages of manufacturing the semiconductor device structure taken along line A-A of FIG. 21, in accordance with some embodiments.
Figure 27C:
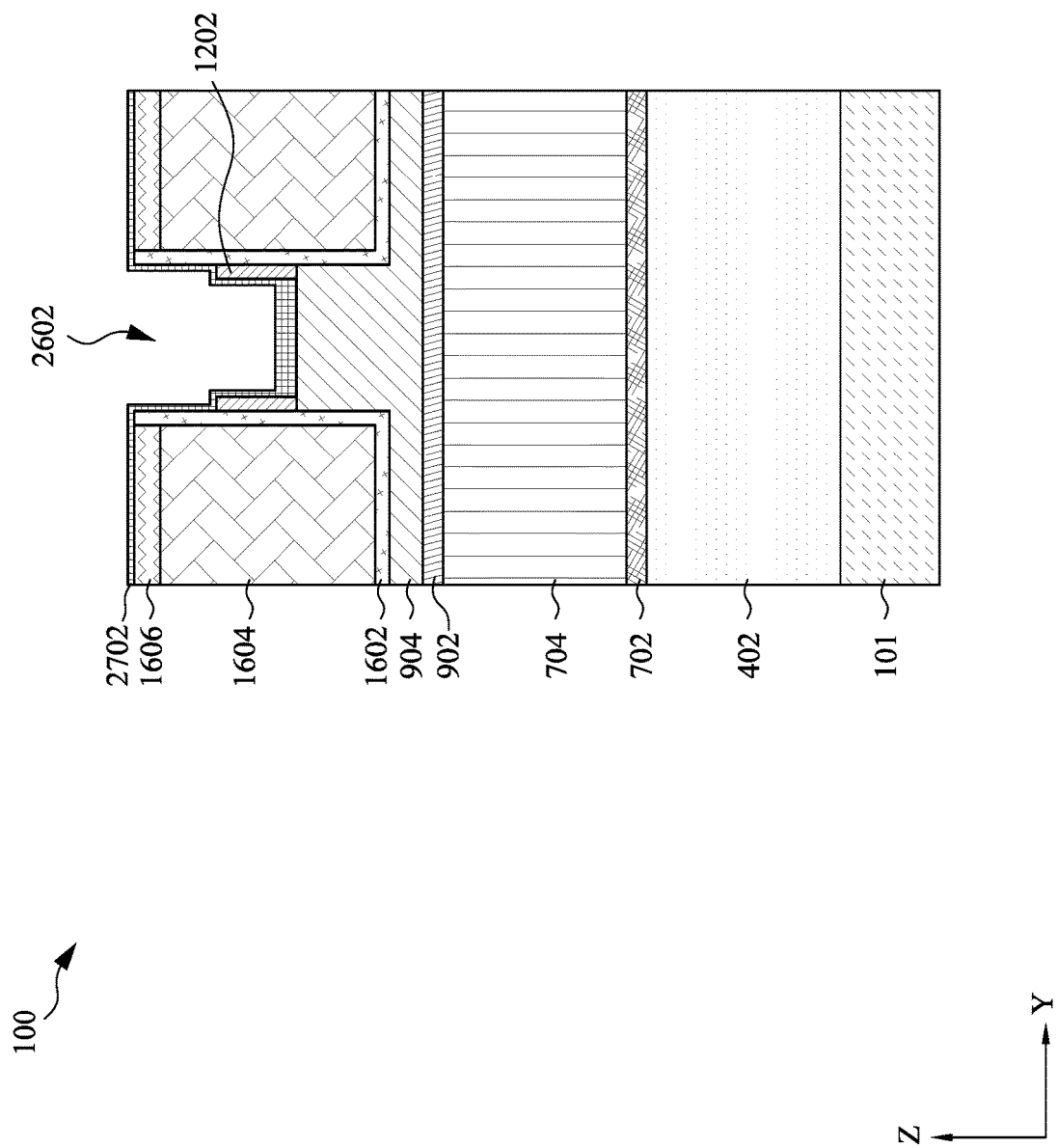
FIGS. 27C, 28C, 29C, 30C, and 31C are cross-sectional side views of various stages of manufacturing the semiconductor device structure taken along line C-C of FIG. 21, in accordance with some embodiments.

FIGS. 27A-27C are cross-sectional side views of one of various stages of manufacturing the semiconductor device structure taken along lines A-A, B-B, C-C of FIG. 21, respectively, in accordance with some embodiments. After separating the trench 2102 into segments 2602 by the dielectric layer 2502, a seed layer 2702 is formed on the exposed surfaces of the semiconductor device structure 100. The seed layer 2702 is formed on the nitrogen-containing layers 1606 and the dielectric layer 2502, as shown in FIG. 27A. The seed layer 2702 is also formed in the segments 2602, such as on the sidewalls of the CESL 1602, the sidewalls of the spacers 1202, the conductive layer 2002, as shown in FIG. 27B, and the low-K dielectric material 904, as shown in FIG. 27C. The seed layer 2702 may include a conductive material, such as TiN, and may have a thickness ranging from about 0.5 nm to about 2 nm. In some embodiments, the seed layer 2702 is not present. The seed layer 2702 may help a conductive layer 3102 (FIG. 31B) formed subsequently thereon with better adhesion. Thus, if the thickness of the seed layer 2702 is greater than about 2 nm, the manufacturing cost is increased without significant advantage. The seed layer 2702 may be formed by any suitable process, such as PVD, CVD, or ALD.

Figure 28B:
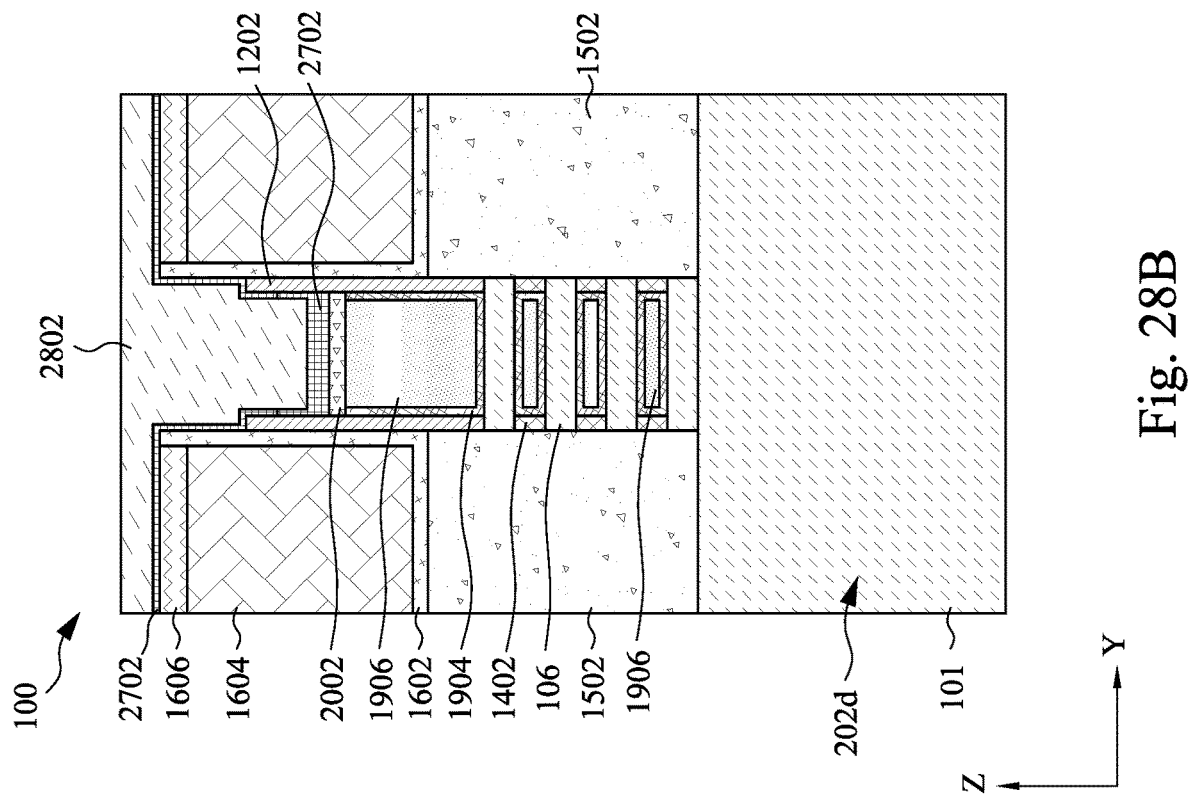
Figure 28A:
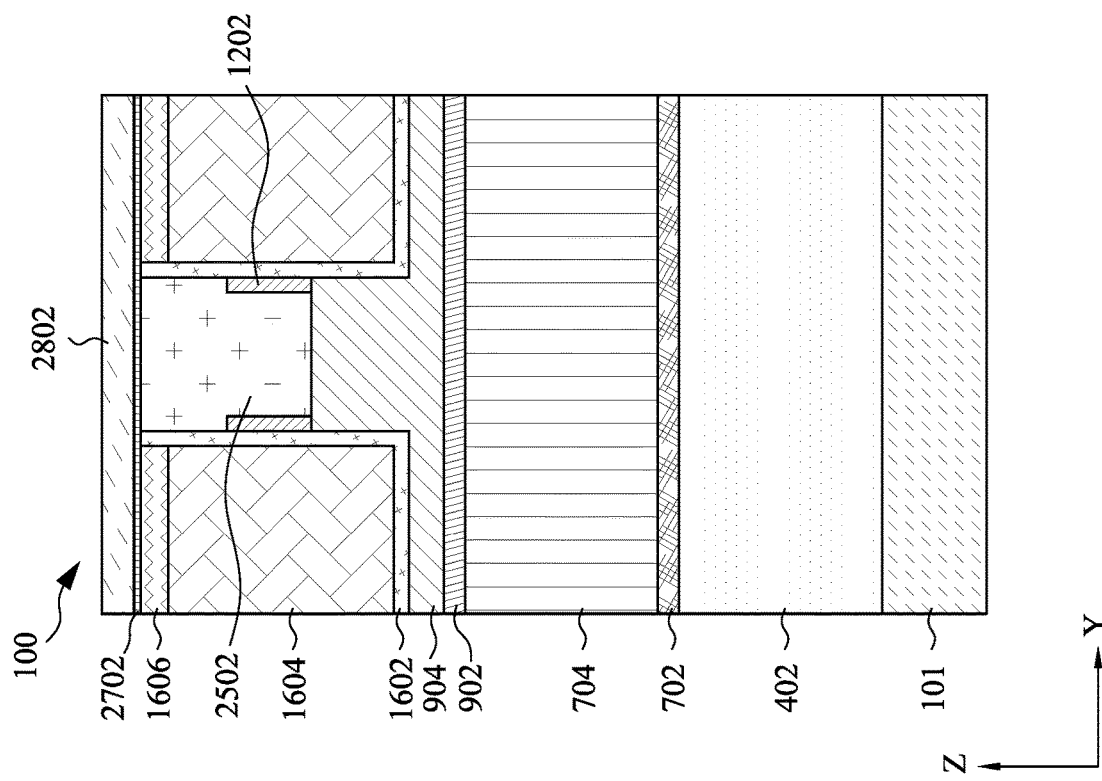
Figure 28C:
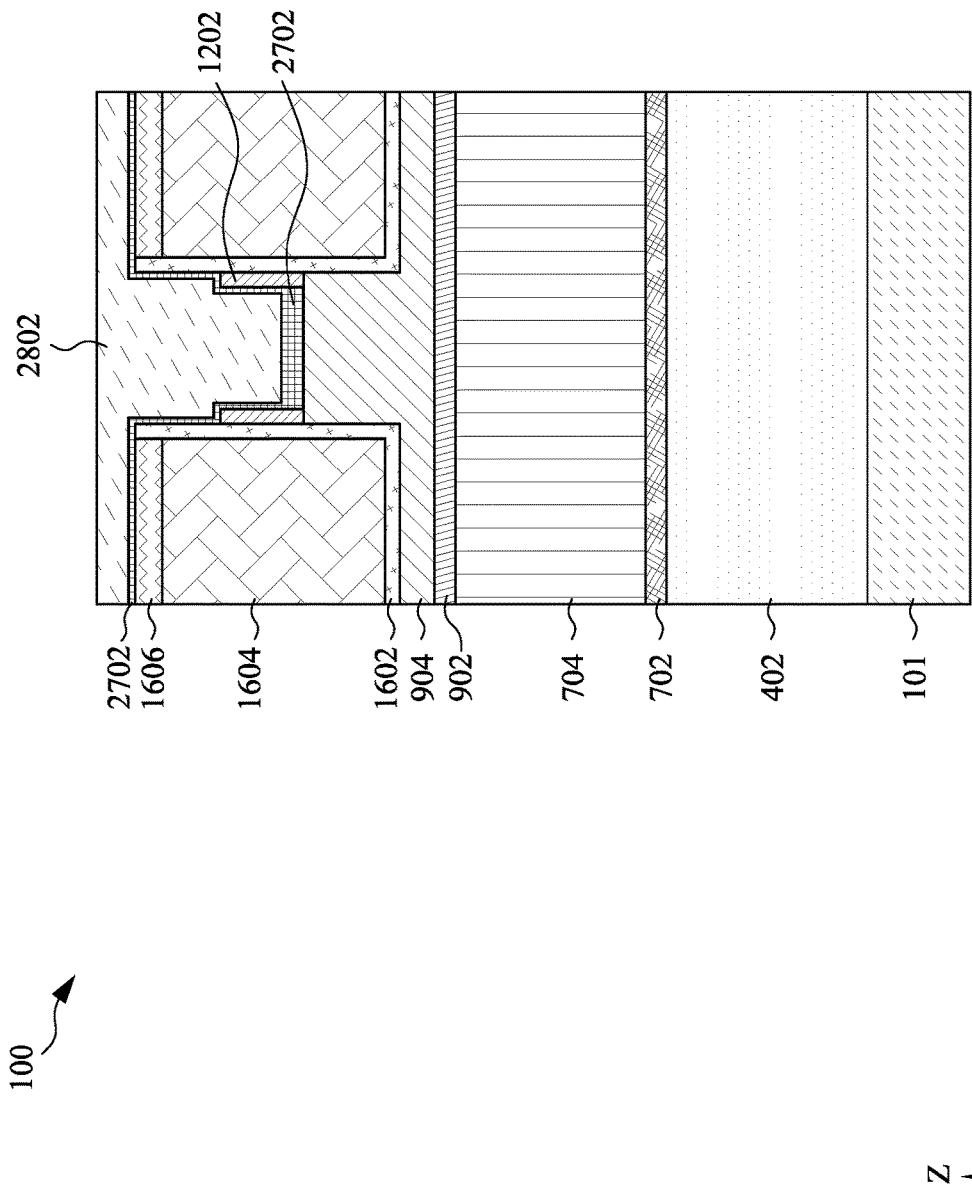
Figure 29B:
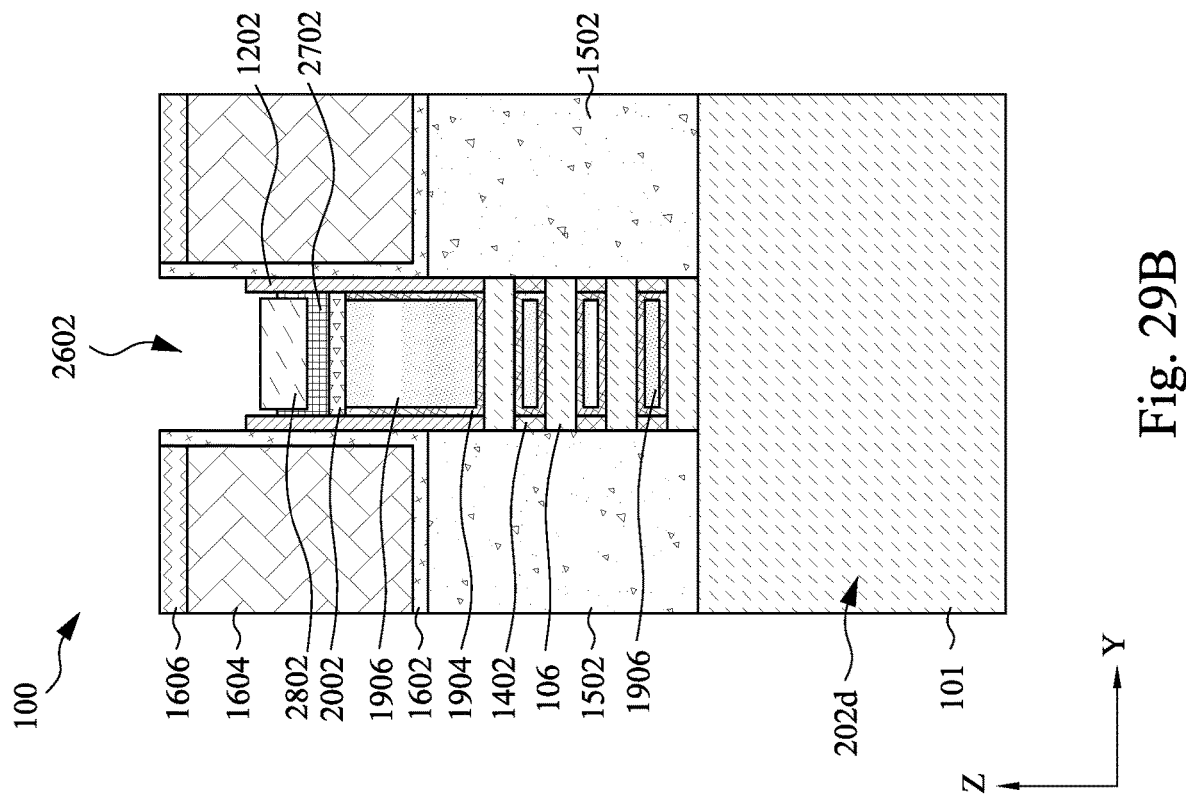
Figure 29A:
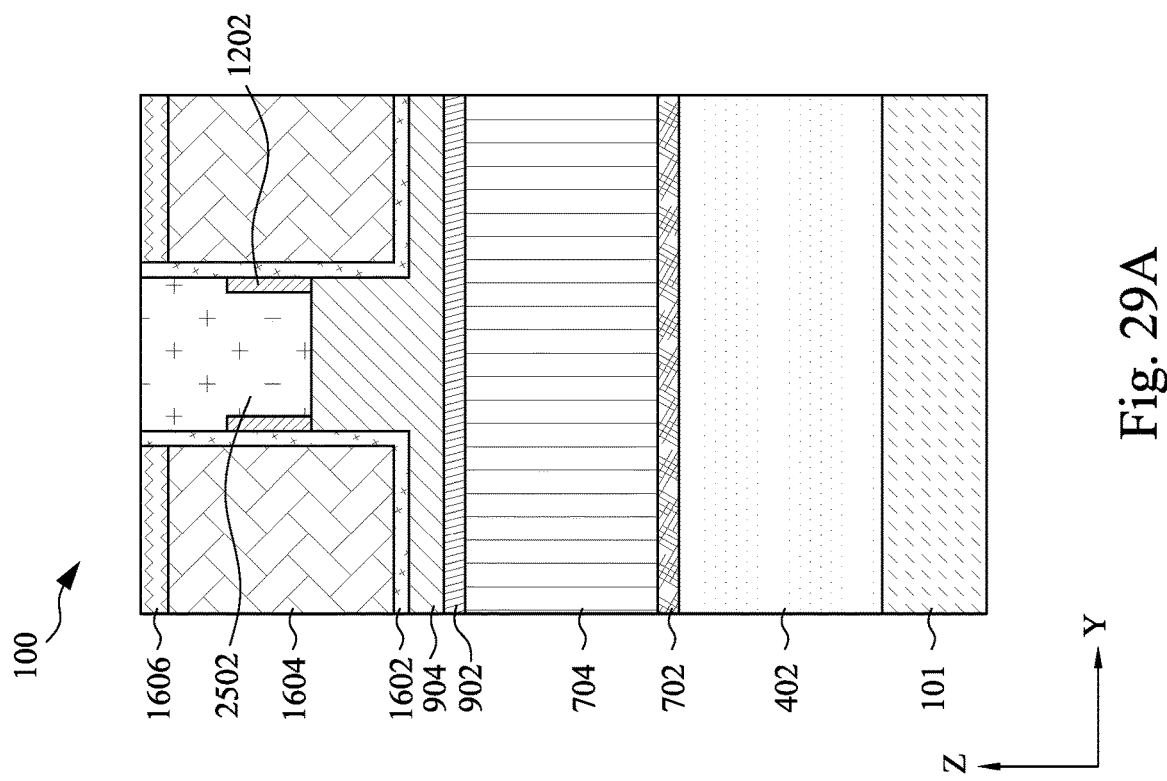
Figure 29C:
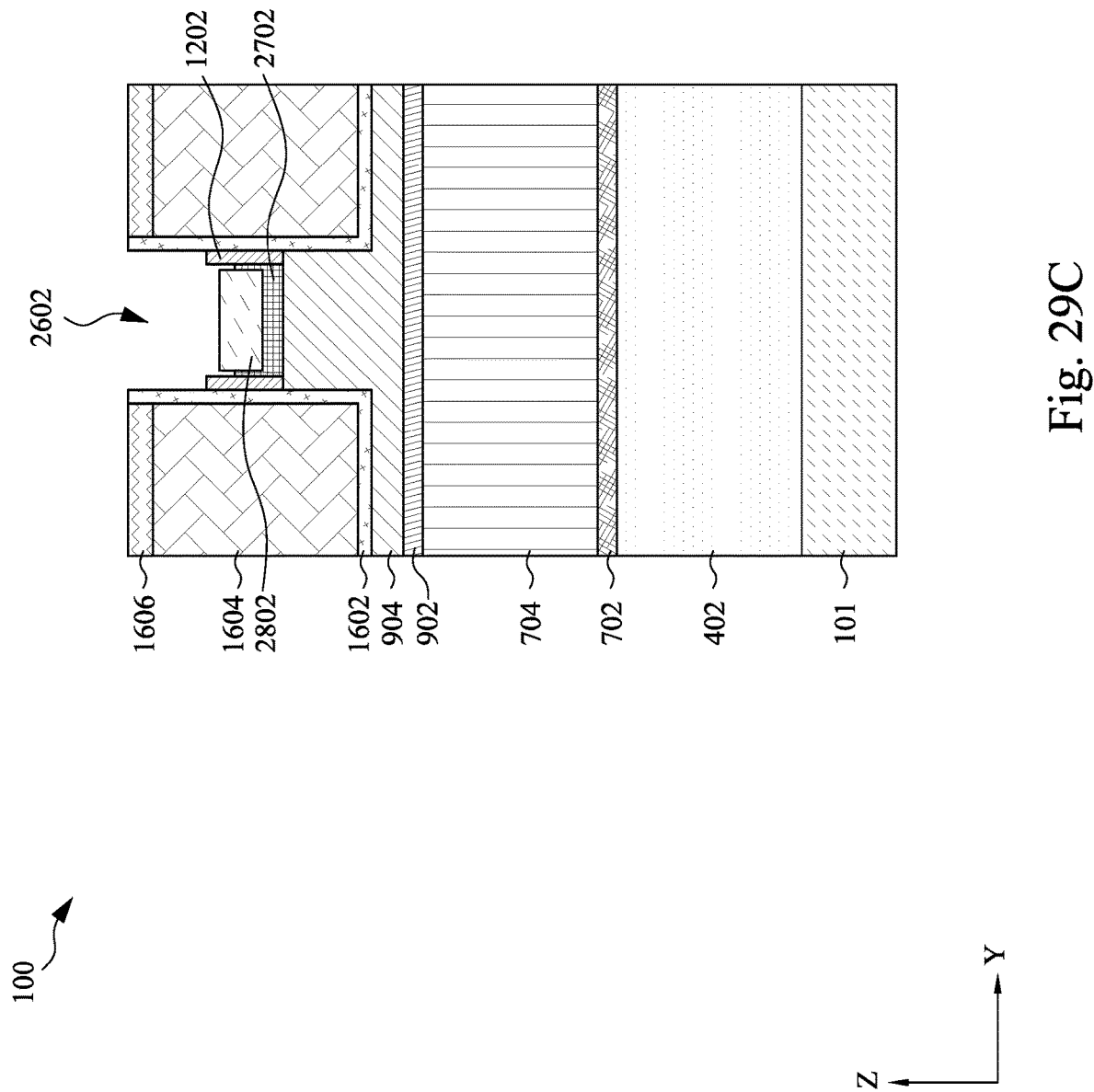

Next, as shown in FIGS. 28A-28C, a mask 2802 is formed on the seed layer 2702. The mask 2802 may fill the segments 2602 of the trench 2102 and over the nitrogen-containing layers 1606, as shown in FIGS. 28B, 28C. The mask 2802 may be a bottom antireflective coating (BARC) layer, which may be a spin-on organic layer. The mask 2802 may be recessed, as shown in FIGS. 29A-29C. The portions of the mask 2802 formed over the nitrogen-containing layers 1606 are removed, and the portions of the mask 2802 formed in the segments 2602 are recessed, exposing portions of the seed layer 2702 formed on the nitrogen-containing layers 1606, on the CESL 1602, and on the spacers 1202. The recess of the mask 2802 may be any suitable process, such as a dry etch, a wet etch, or a combination thereof. The recess process may be a selective etch that removes portions of the mask 2802 but not the seed layer 2702. Next, the exposed portions of the seed layer 2702 are removed, as shown in FIGS. 29A-29C. In some embodiments, a portion of the seed layer 2702 disposed between the mask 2802 and the spacer 1202 may be removed, as shown in FIGS. 29B, 29C. The remaining mask 2802 protects the portions of the seed layers 2702 formed on the low-K dielectric material 904, the conductive layer 2002, and the spacers 1202. The portions of the seed layer 2702 may be removed by any suitable process, such as a dry etch, a wet etch, or a combination thereof. The removal process may be a selective etch that removes the portions of the seed layer 2702 but not the nitrogen-containing layers 1606, the CESL 1602, and the spacers 1202.

Figure 30B:
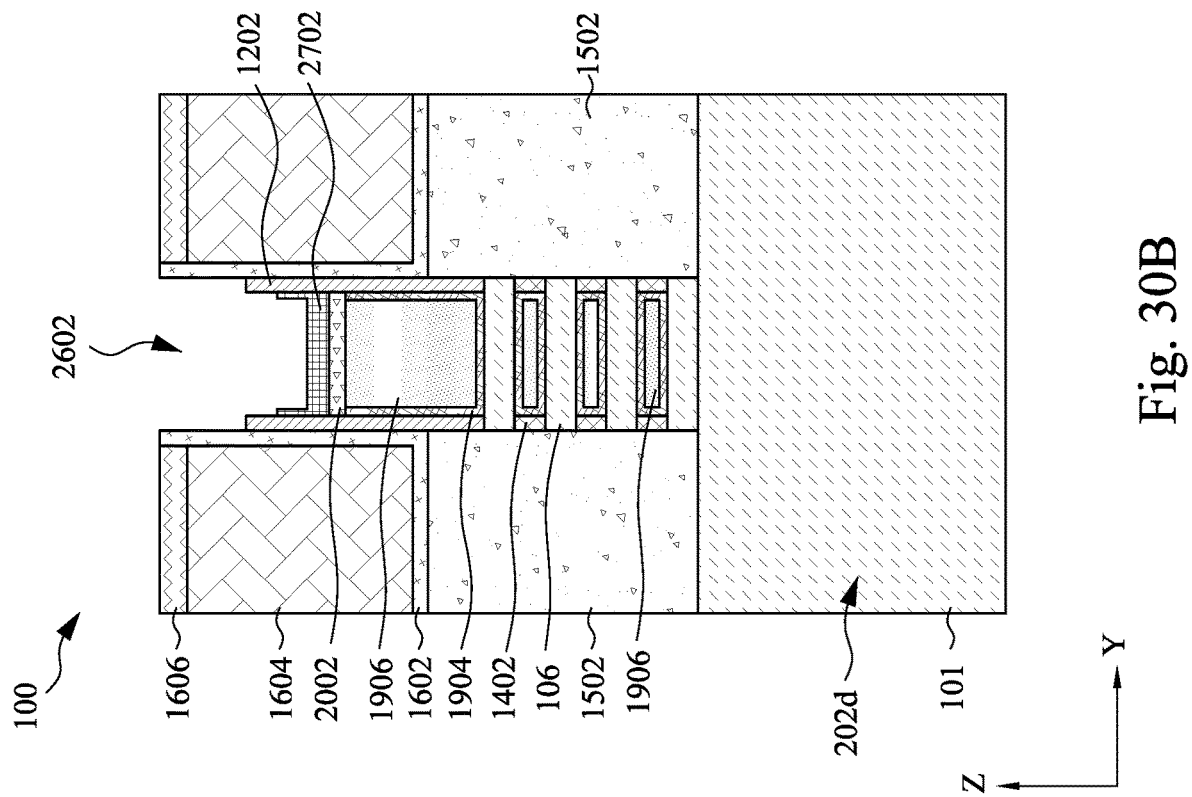
Figure 30A:
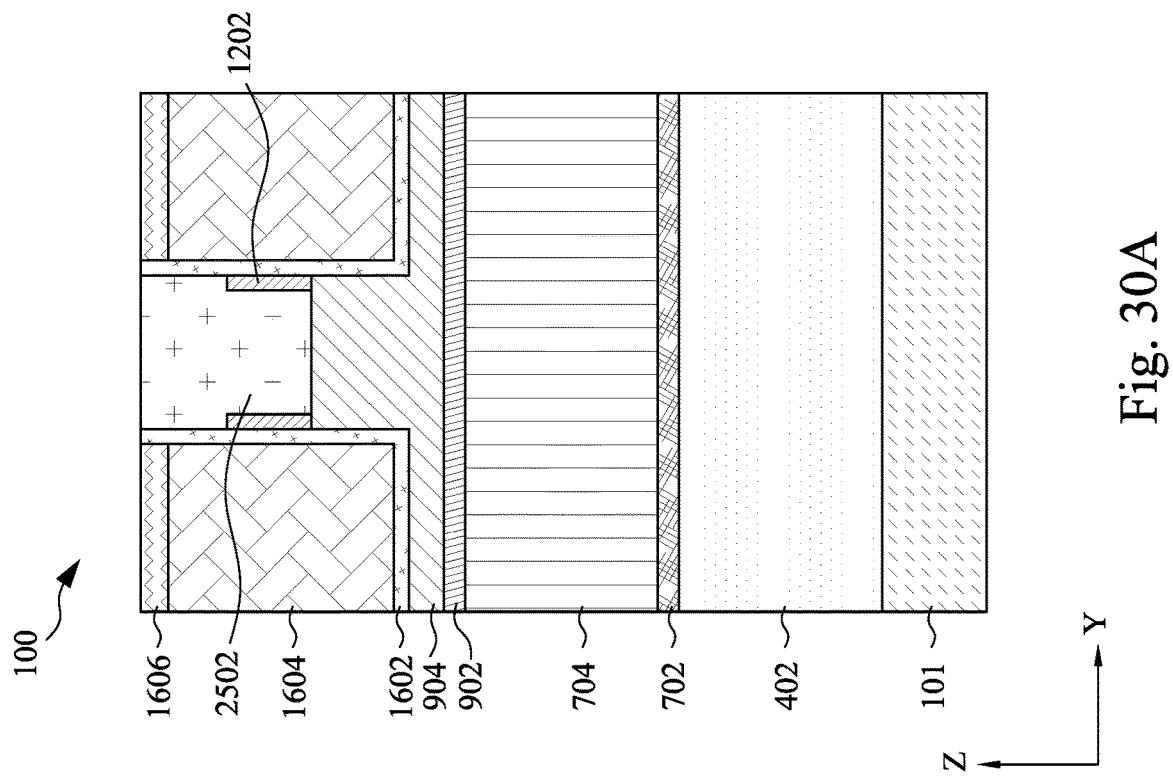
Figure 30C:
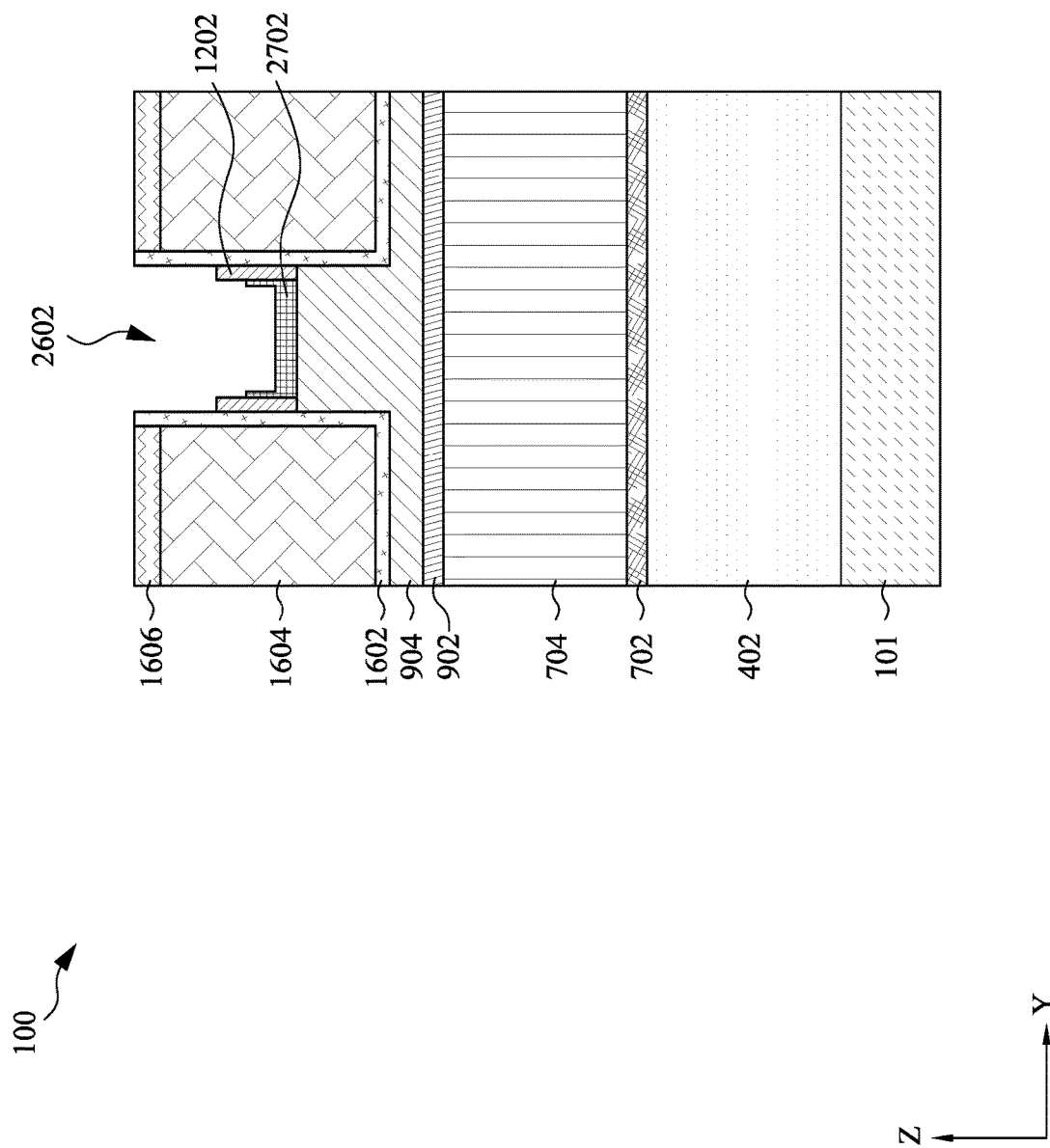
Figure 31B:
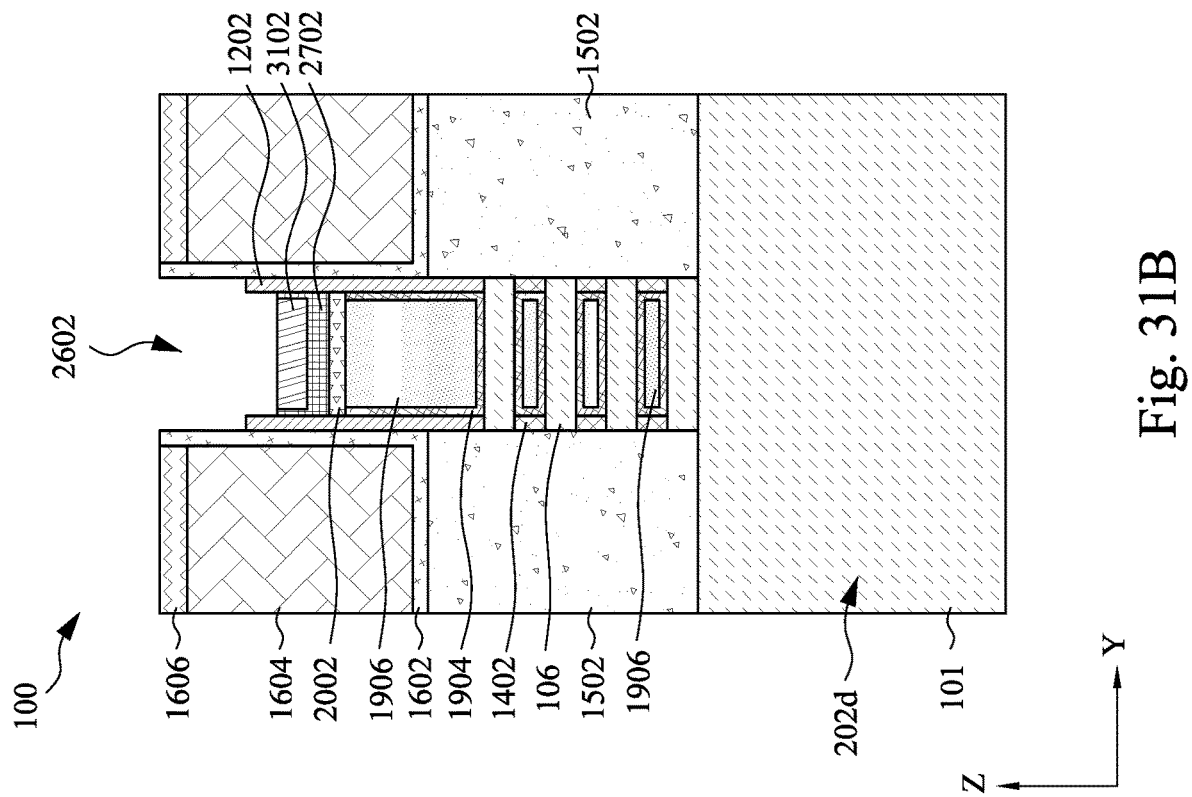
Figure 31A:
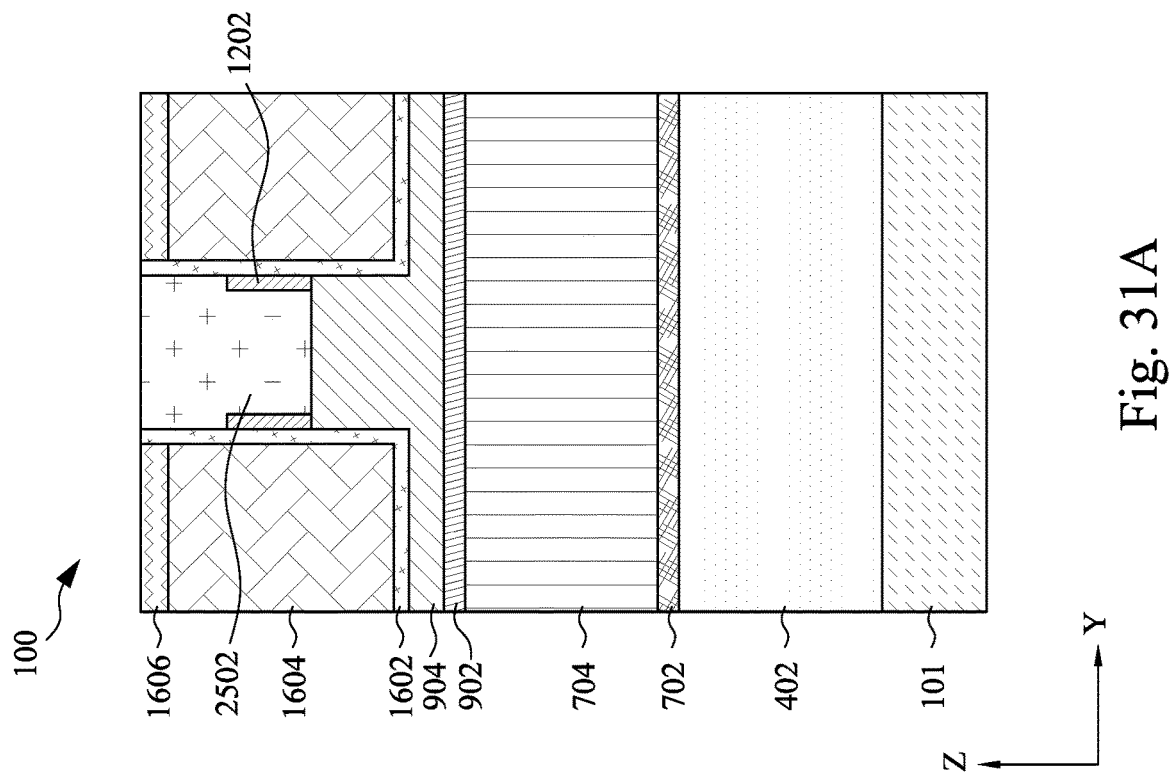
Figure 31C:
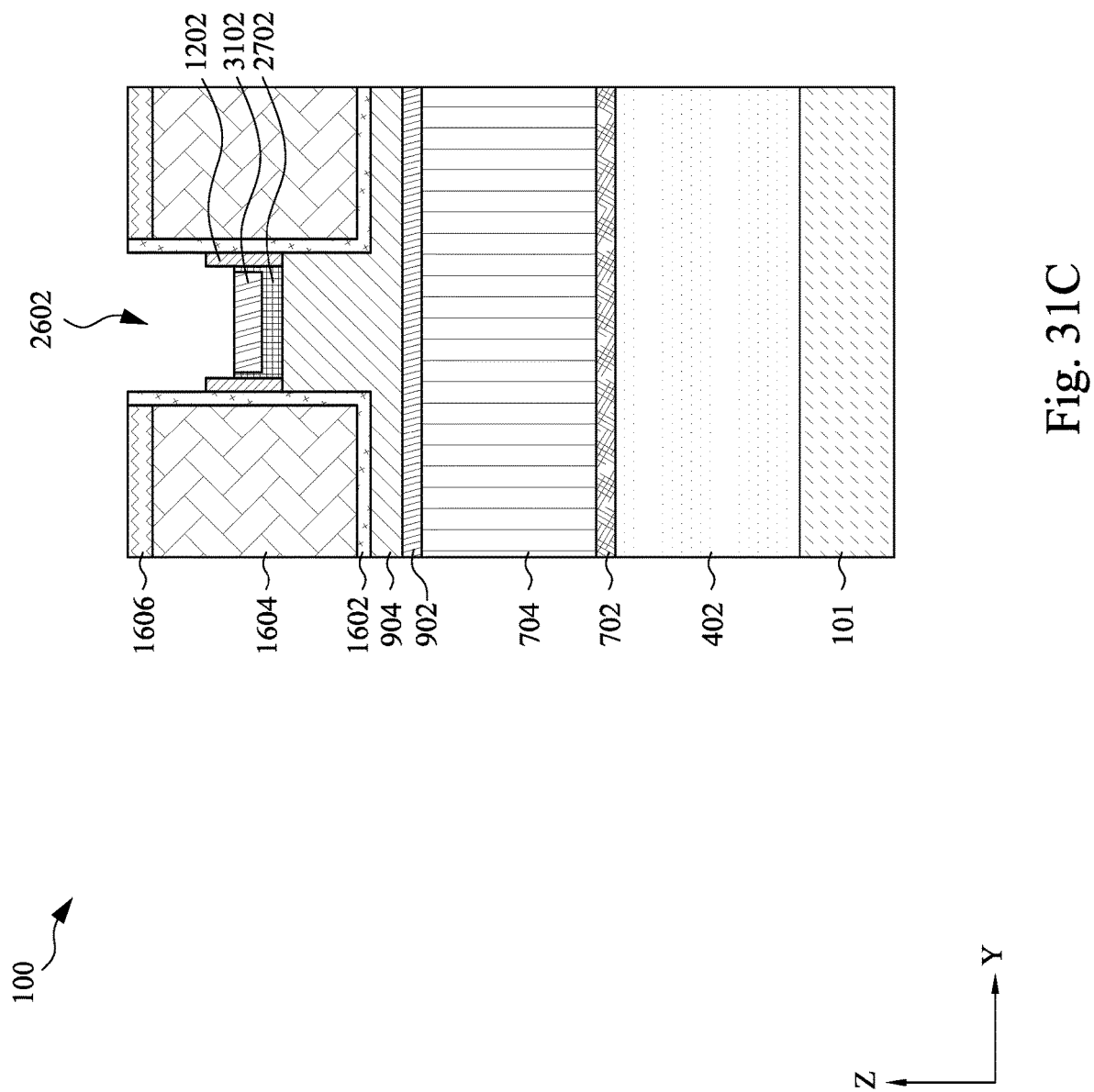

Next, as shown in FIGS. 30A-30C, the remaining mask 2802 is removed. The removal of the mask 2802 may be the same as the recess of the mask 2802 shown in FIGS. 29A-29C. The seed layer 2702 formed in the segments 2602 may have a U cross-sectional shape, as shown in FIGS. 30B, 30C. Conductive layers 3102 are formed on the seed layers 2702 in the segments 2602 of the trench 2102, as shown in FIG. 31B, 31C. The conductive layers 3102 do not form on the dielectric materials of the nitrogen-containing layers 1606 and the dielectric layer 2502, as shown in FIG. 31A. The conductive layer 3102 may include the same material as the conductive layer 2002 and may be formed by the same process as that of the conductive layer 2002. The conductive layer 3102 may have a thickness along the Z direction ranging from about 2 nm to about 6 nm. The conductive layer 3102 may be utilized to function as an electrical path for the gate electrode layers 1906. Thus, if the thickness of the conductive layer 3102 is less than about 2 nm, the electrical resistance may be high. On the other hand, if the thickness of the conductive layer 3102 is greater than about 6 nm, the manufacturing cost is increased without significant advantage.

Figure 32A:
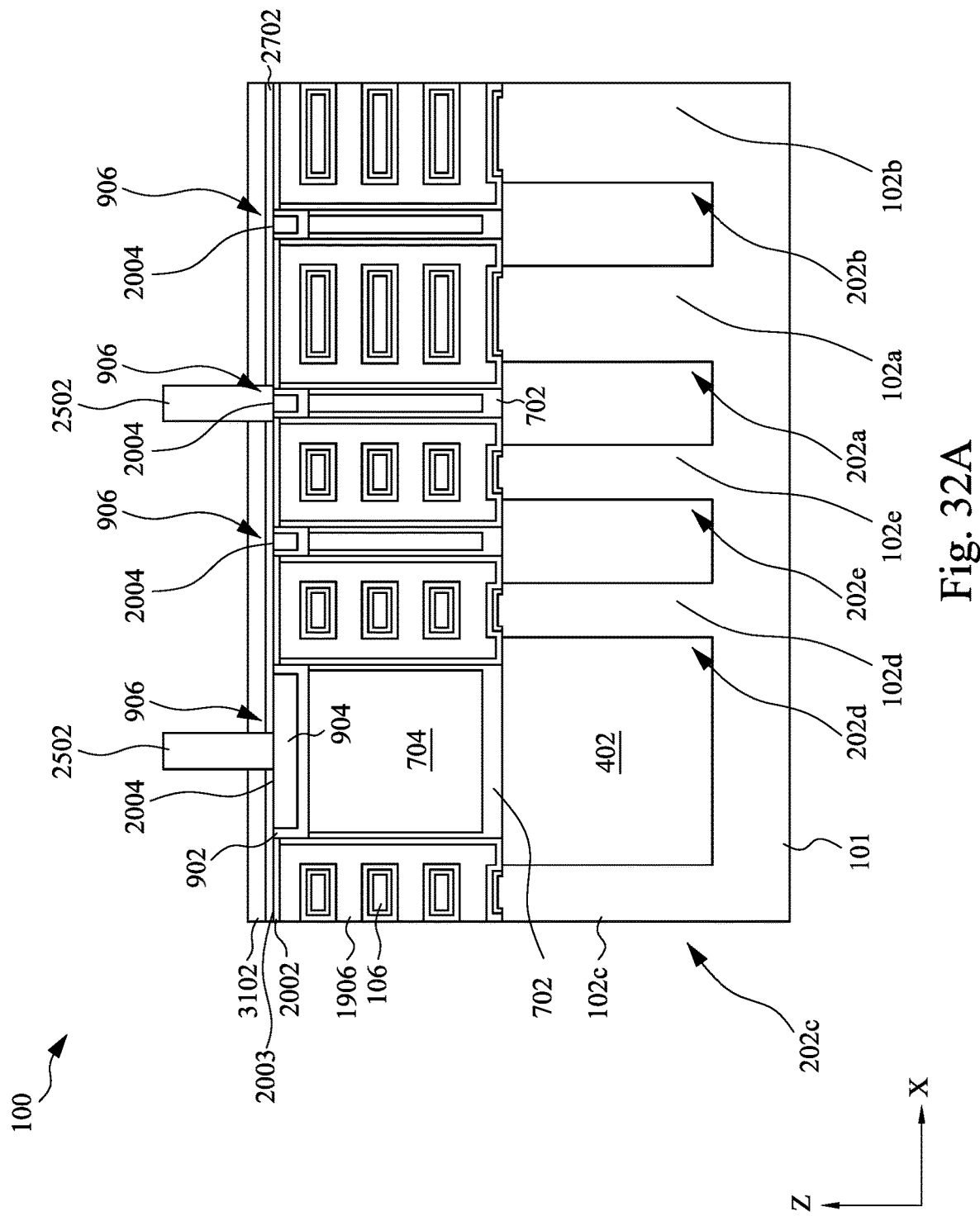
FIGS. 32A and 32B are cross-sectional side views of one of various stages of manufacturing the semiconductor device structure taken along line D-D of FIG. 21, in accordance with some embodiments.
Figure 32B:
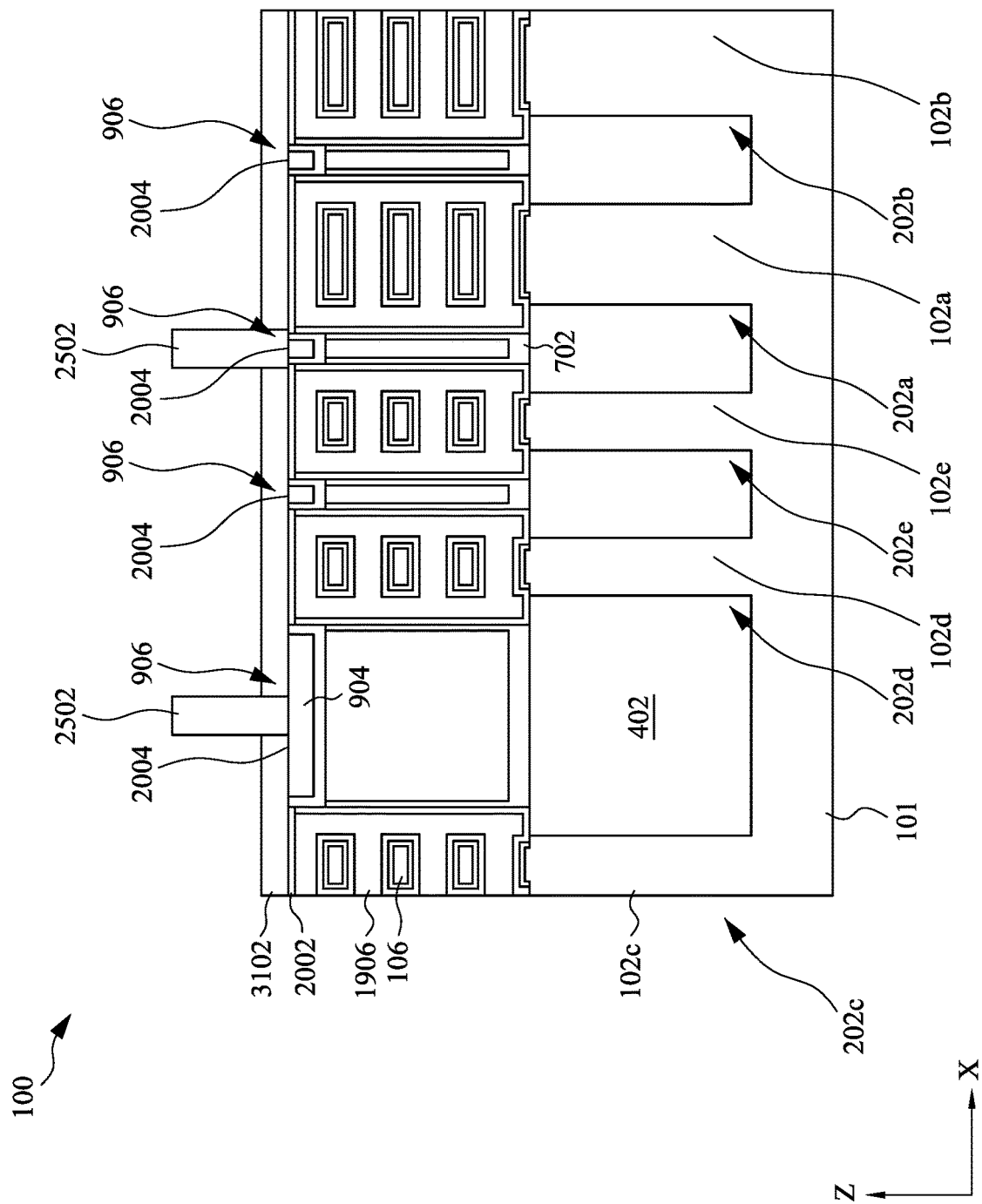

FIGS. 32A-32B are cross-sectional side views of one of various stages of manufacturing the semiconductor device structure 100 taken along line D-D of FIG. 21, in accordance with some embodiments. In some embodiments, as shown in FIG. 32A, the conductive layer 3102 is formed on the seed layer 2702, and the dielectric layers 2502 separate the conductive layer 3102 and seed layer 2702 into different segments. In some embodiments, as shown in FIG. 32B, the conductive layer 3102 is formed on the conductive layers 2002 and the dielectric features 906 without the seed layer 2702. The conductive layer 3102, along with (or without) the seed layer 2702, electrically connects two or more gate electrode layers 1906 formed therebelow.

Figure 33A:
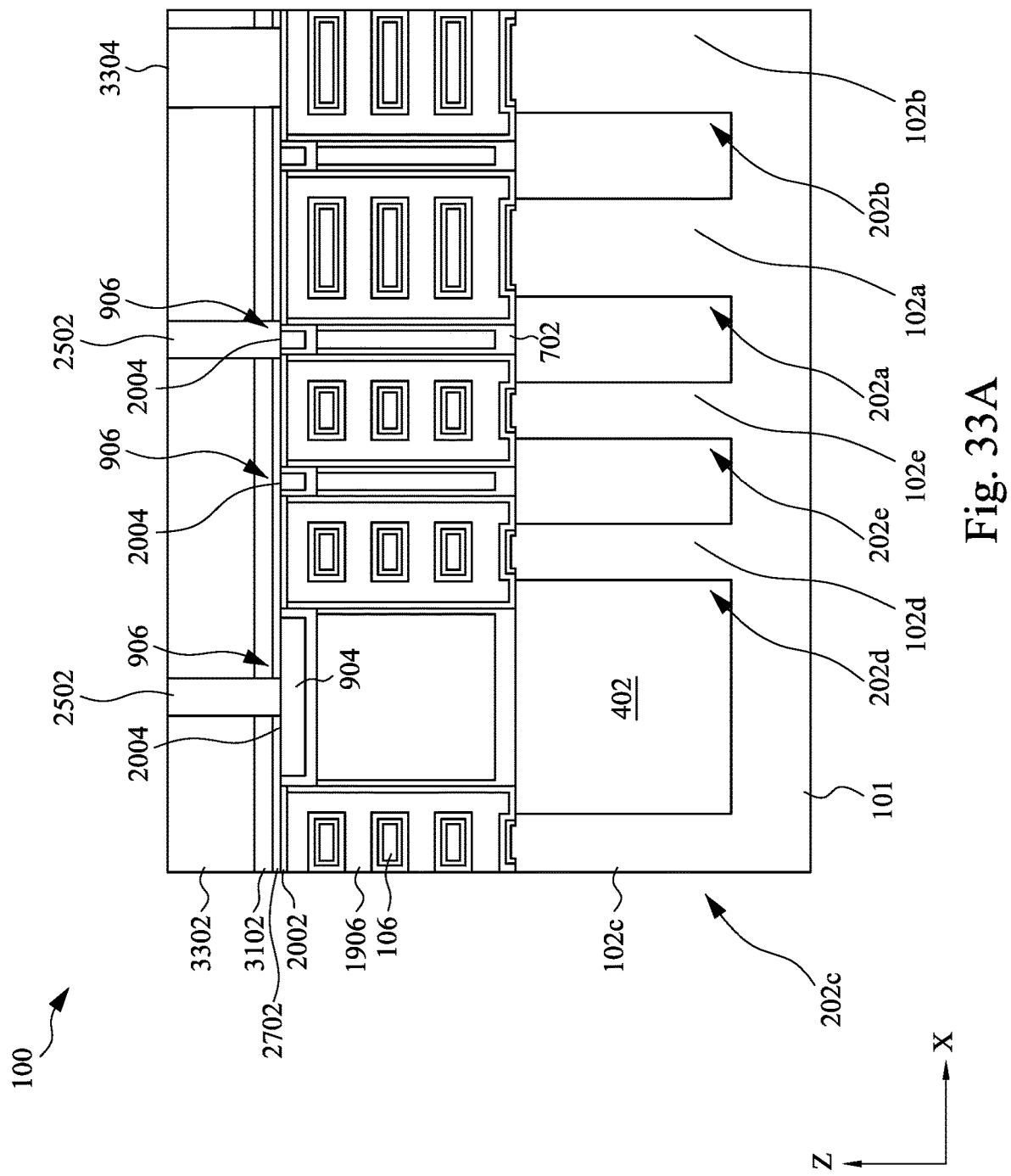
FIGS. 33A, 33B, 33C and 33D are cross-sectional side views of one of various stages of manufacturing the semiconductor device structure taken along lines D-D, A-A, B-B, C-C of FIG. 21, respectively, in accordance with some embodiments.

FIGS. 33A-33D are cross-sectional side views of one of various stages of manufacturing the semiconductor device structure 100 taken along lines D-D, A-A, B-B, C-C of FIG. 21, respectively, in accordance with some embodiments. As shown in FIGS. 33A-33D, a dielectric layer 3302 is formed in the segments 2602 of the trench 2102, and a planarization process may be performed to expose the nitrogen-containing layers 1606. The dielectric layer 3302 may include the same material as the dielectric layer 2502 and may be formed by the same process as that of the dielectric layer 2502. The dielectric layer 3302 may be formed on the conductive layers 3102, while the dielectric layers 2502 are formed on the dielectric features 906. A conductive feature 3304 may be formed through the dielectric layer 3302, the conductive layer 3102, and the seed layer 2702 and in contact with the conductive layer 2002, as shown in FIG. 33A. The conductive feature 3304 may include a material having one or more of Ru, Mo, Co, Ni. W, Ti, Ta, Cu, Al, TiN and TaN, and may be formed by any suitable process, such as PVD, ECP, or CVD. The conductive feature 3304 may provide a signal, such as an electrical current, to the gate electrode layer 1906 located therebelow. Furthermore, the signal may be provided to adjacent gate electrode layer 1906 via the conductive layer 3102 (and the seed layer 2702 in some embodiments). Thus, adjacent gate electrode layers 1906 may receive the signal from one conductive feature 3304 via the conductive layer 3102. The dielectric layer 2502 cuts off the conductive layers 3102, so the signal is not provided to the conductive layer 3102 on the other side of the dielectric layer 2502.

Figure 33C:
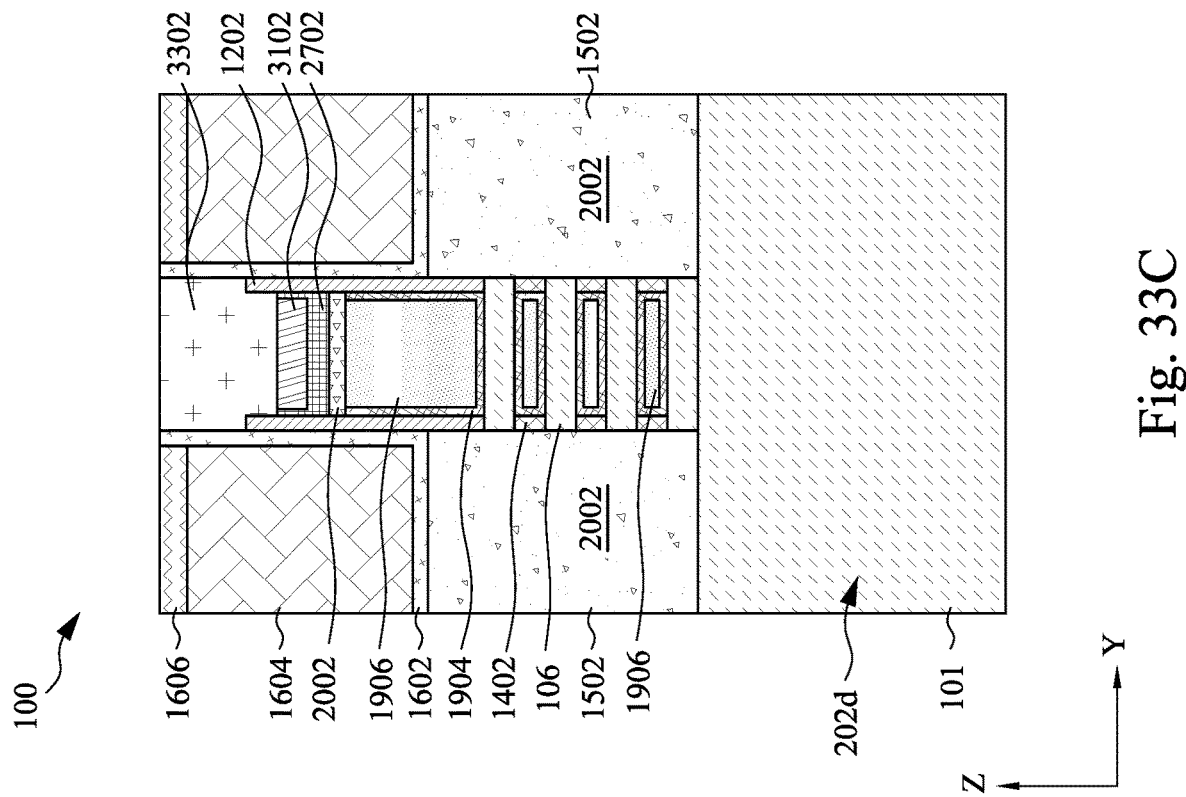
Figure 33B:
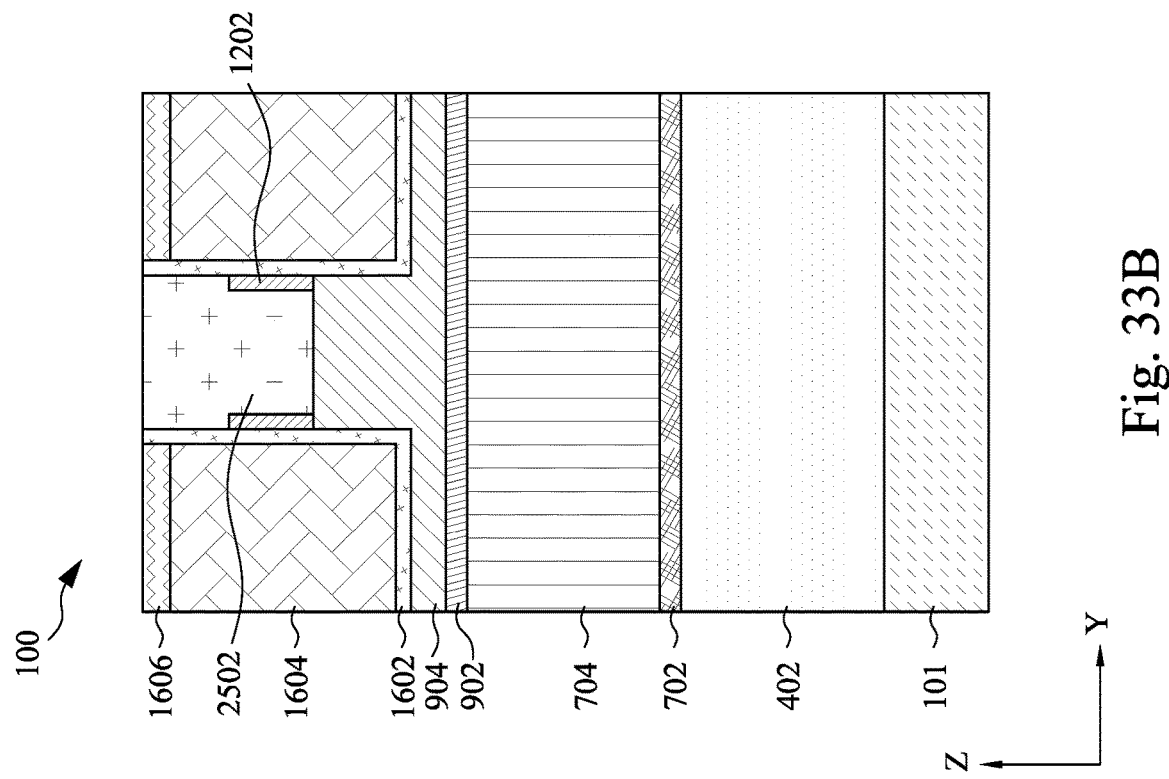
Figure 33D:

Next, as shown in FIG. 34A, in some embodiments, a conductive feature 3402 may be formed through the ILD layer 1604 and the CESL 1602 to be in contact with the S/D epitaxial features 1502 via silicide layers 3404. The conductive feature 3402 may include the same material as the conductive feature 3304 and may be formed by the same method as that of the conductive feature 3304. The conductive feature 3402 may be formed over adjacent S/D epitaxial features 1502 and the dielectric feature 906 formed therebetween. FIG. 34B is a cross-sectional view of the dielectric feature 906 formed between the adjacent S/D epitaxial features 1502 in the ZY plane. As shown in FIG. 34B, the conductive features 3402 may be formed over the dielectric feature 906 and S/D epitaxial features 1502 (FIG. 34A), and the conductive features 3402 may be separated by a structure includes the CESL 1602, the spacers 1202, the optional seed layer 2702, the conductive layer 3102, and the dielectric layer 3302. The structure may be formed over the gate electrode layers 1906 (FIG. 33C).

The present disclosure provides a semiconductor device structure 100 including first and second gate electrode layers 1906 separated by a dielectric feature 906. Conductive layers 2002 are formed on the first and second gate electrode layers 1906, and the conductive layers 2002 have coplanar top surfaces 2003, which is also coplanar with a top surface 2004 of the low-K dielectric material 904 of the dielectric feature 906. A conductive layer 3102 is formed over each conductive layer 2002, and a dielectric layer 2502 is formed on the top surface 2004 and is between the conductive layers 3102. Some embodiments may achieve advantages. For example, the dielectric feature 906 and electrically connected adjacent gate electrode layers 1906 may lead to increased device density, reduced Co, and improved device speed and power efficiency.

An embodiment is a semiconductor device structure. The structure includes a first gate electrode layer, a second gate electrode layer adjacent the first gate electrode layer, and a dielectric feature disposed between the first gate electrode layer and the second gate electrode layer. The dielectric feature has a first surface. The structure further includes a first conductive layer disposed on the first gate electrode layer. The first conductive layer has a second surface. The structure further includes a second conductive layer disposed on the second gate electrode layer. The second conductive layer has a third surface, and the first surface, the second surface, and the third surface are coplanar. The structure further includes a third conductive layer disposed over the first conductive layer, a fourth conductive layer disposed over the second conductive layer, and a dielectric layer disposed on the first surface of the dielectric feature. The dielectric layer is disposed between the third conductive layer and the fourth conductive layer.

Another embodiment is a semiconductor device structure. The structure includes a first gate electrode layer, a second gate electrode layer adjacent the first gate electrode layer, and a dielectric feature disposed between the first gate electrode layer and the second gate electrode layer. The dielectric feature includes a liner, a dielectric material disposed on the liner, a high-K dielectric liner disposed on the liner and the dielectric material, and a low-K dielectric material disposed on the high-K dielectric liner. The structure further includes a dielectric layer disposed on the low-K dielectric material, a first conductive layer disposed over the first gate electrode layer, and a second conductive layer disposed over the second gate electrode layer. The dielectric layer is disposed between the first conductive layer and the second conductive layer.

A further embodiment is a method. The method includes forming a first and second fins from a substrate. The first fin includes a first plurality of semiconductor layers and the second fin includes a second plurality of semiconductor layers. The method further includes forming a dielectric feature between the first and second fins, forming a gate electrode layer surrounding the first and second pluralities of semiconductor layers, forming a first dielectric layer on the dielectric feature, and forming a first conductive layer over the gate electrode layer. The first dielectric layer separates the first conductive layer into two segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a first substrate portion;
a second substrate portion adjacent the first substrate portion;
an insulating material disposed between the first and second substrate portions;
a first gate electrode layer disposed over the first substrate portion;
a second gate electrode layer adjacent the first gate electrode layer, wherein the second gate electrode layer is disposed over the second substrate portion;
a first dielectric feature disposed between the first gate electrode layer and the second gate electrode layer, wherein the first dielectric feature is disposed on the insulating material;
a first dielectric layer disposed on the first dielectric feature;
a first conductive layer disposed over the first gate electrode layer; and
a second conductive layer disposed over the second gate electrode layer, wherein the first dielectric layer is disposed between the first conductive layer and the second conductive layer.

2. The semiconductor device structure of claim 1, further comprising a first seed layer disposed between the first conductive layer and the first gate electrode layer and a second seed layer disposed between the second conductive layer and the second gate electrode layer, wherein the first dielectric layer is disposed between the first seed layer and the second seed layer.

3. The semiconductor device structure of claim 2, wherein the first seed layer and the second seed layer each has a U shape with respect to a cross-sectional view of the semiconductor device structure.

4. The semiconductor device structure of claim 1, further comprising:
a first plurality of semiconductor layers, wherein the first gate electrode layer surrounds the first plurality of semiconductor layers; and
a second plurality of semiconductor layers, wherein the second gate electrode layer surrounds the second plurality of semiconductor layers.

5. The semiconductor device structure of claim 4, further comprising:
a first source/drain epitaxial feature in contact with the first plurality of semiconductor layers; and
a second source/drain epitaxial feature in contact with the second plurality of semiconductor layers.

6. The semiconductor device structure of claim 5, wherein the first dielectric feature is disposed between the first source/drain epitaxial feature and the second source/drain epitaxial feature.

7. The semiconductor device structure of claim 1, further comprising a third gate electrode layer adjacent the second gate electrode layer and a second dielectric feature disposed between the second gate electrode layer and the third gate electrode layer.

8. The semiconductor device structure of claim 7, wherein the second conductive layer is disposed over the second dielectric feature and the third gate electrode layer, and the second conductive layer electrically connects the second and third gate electrode layers.

9. A semiconductor device structure, comprising:
a first gate electrode layer;
a first source/drain epitaxial feature disposed adjacent the first gate electrode layer;
a second gate electrode layer adjacent the first gate electrode layer;
a second source/drain epitaxial feature disposed adjacent the second gate electrode layer;
a first dielectric feature, comprising:
  a first portion having a first thickness located between the first gate electrode layer and the second gate electrode layer; and
  a second portion having a second thickness located between the first source/drain epitaxial feature and the second source/drain epitaxial feature, wherein the first thickness is substantially greater than the second thickness;
a first spacer disposed on the first portion of the first dielectric feature;
a second spacer disposed on the first portion of the first dielectric feature; and
a first conductive layer disposed over the first portion of the first dielectric feature, the first gate electrode layer, and the second gate electrode layer, wherein the first conductive layer is disposed between the first and second spacers.

10. The semiconductor device structure of claim 9, further comprising a first seed layer disposed between the first gate electrode layer and the first conductive layer, between the second gate electrode layer and the first conductive layer, and between the first dielectric feature and the first conductive layer.

11. The semiconductor device structure of claim 10, wherein the first seed layer has a U shape with respect to a cross-sectional view of the semiconductor device structure.

12. The semiconductor device structure of claim 10, wherein the dielectric feature comprises:
a liner;
a dielectric material disposed on the liner;
a high-K dielectric liner disposed on the liner and the dielectric material; and
a low-K dielectric material disposed on the high-K dielectric liner.

13. The semiconductor device structure of claim 12, wherein the first seed layer is in contact with the high-K dielectric liner and the low-K dielectric material.

14. The semiconductor device structure of claim 10, further comprising a third gate electrode layer disposed adjacent the second gate electrode layer and a second dielectric feature disposed between the second and third gate electrode layers.

15. The semiconductor device structure of claim 14, further comprising a dielectric layer disposed on the second dielectric feature.

16. The semiconductor device structure of claim 15, further comprising a second seed layer disposed over the third gate electrode layer and a second conductive layer disposed over the second seed layer, wherein the dielectric layer is disposed between the first seed layer and the second seed layer and between the first conductive layer and the second conductive layer.

17. A method for forming a semiconductor device structure, comprising:
forming first and second fins from a substrate;
forming a dielectric feature between the first and second fins;
forming a gate electrode layer over the first and second fins and the dielectric feature;
recessing the gate electrode layer to a level below a top surface of the dielectric feature;
depositing a semiconductor layer over the gate electrode layer and the dielectric feature;
depositing a first dielectric layer on the semiconductor layer;
forming an opening in the first dielectric layer and the semiconductor layer to expose the dielectric feature; and
depositing a second dielectric layer in the opening in contact with the dielectric feature.

18. The method of claim 17, further comprising removing the first dielectric layer and the semiconductor layer.

19. The method of claim 18, further comprising depositing a conductive layer over the first gate electrode layer and the second gate electrode layer, wherein the second dielectric layer separates the conductive layer into two segments.

20. The method of claim 17, wherein forming the dielectric feature comprises:
forming a liner between the first and second fins;
forming a dielectric material on the liner;
forming a high-K dielectric liner on the liner and the dielectric material; and
forming a low-K dielectric material on the high-K dielectric liner.

* * * * *